United States Patent
Yue et al.

(10) Patent No.: US 12,387,671 B2
(45) Date of Patent: Aug. 12, 2025

(54) DISPLAY PANEL, PREPARATION METHOD AND DISPLAY DEVICE

(71) Applicant: Wuhan Tianma Micro-Electronics Co., Ltd., Wuhan (CN)

(72) Inventors: Qin Yue, Wuhan (CN); Wei Huang, Wuhan (CN); Lu Xiao, Wuhan (CN); Yangzhao Ma, Wuhan (CN); Zhongjie Zhang, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 947 days.

(21) Appl. No.: 17/522,004

(22) Filed: Nov. 9, 2021

(65) Prior Publication Data

US 2022/0069031 A1     Mar. 3, 2022

(30) Foreign Application Priority Data

Jul. 1, 2021    (CN) .......................... 202110746235.5

(51) Int. Cl.
```
G09G 3/3225     (2016.01)
H10K 50/86      (2023.01)
H10K 59/12      (2023.01)
H10K 59/122     (2023.01)
H10K 59/131     (2023.01)
H10K 59/35      (2023.01)
H10K 59/65      (2023.01)
H10K 71/00      (2023.01)
```
(52) U.S. Cl.
CPC ......... *G09G 3/3225* (2013.01); *H10K 50/865* (2023.02); *H10K 59/122* (2023.02); *H10K 59/352* (2023.02); *H10K 59/353* (2023.02); *H10K 71/00* (2023.02); *H10K 59/1201* (2023.02); *H10K 59/131* (2023.02); *H10K 59/65* (2023.02)

(58) Field of Classification Search
None
See application file for complete search history.

(56) References Cited

U.S. PATENT DOCUMENTS

| | | | |
|---|---|---|---|
| 2016/0343284 | A1 | 11/2016 | Sun |
| 2019/0280049 | A1 | 9/2019 | Wang |

(Continued)

FOREIGN PATENT DOCUMENTS

| | | |
|---|---|---|
| CN | 107887404 A | 4/2018 |
| CN | 109860237 A | 6/2019 |

(Continued)

*Primary Examiner* — Nishath Yasmeen
(74) *Attorney, Agent, or Firm* — KDW Firm PLLC

(57) ABSTRACT

Provided are a display panel, a preparation method, and a display device. The display panel includes a plurality of first sub-pixels, a plurality of second sub-pixels, and a plurality of third sub-pixels. The plurality of third sub-pixels forms a first virtual trapezoid, and one of the plurality of first sub-pixels is located inside the first virtual trapezoid. The plurality of first sub-pixels and the plurality of second sub-pixels form a second virtual trapezoid, and one of the plurality of third sub-pixels is located inside the second virtual trapezoid. The first virtual trapezoid includes a first long side, a first oblique side, a first short side, and a second oblique side. The second virtual trapezoid includes a second long side, a third oblique side, a second short side, and a fourth oblique side.

49 Claims, 37 Drawing Sheets

(56) References Cited

U.S. PATENT DOCUMENTS

| | | | |
|---|---|---|---|
| 2020/0013833 A1* | 1/2020 | Wang | H10K 59/351 |
| 2020/0343312 A1 | 10/2020 | Ryu | |
| 2020/0402442 A1* | 12/2020 | Liu | H10K 59/353 |
| 2021/0091145 A1* | 3/2021 | Huangfu | G02F 1/133514 |
| 2022/0102438 A1* | 3/2022 | Xiao | H10K 59/352 |
| 2022/0310711 A1* | 9/2022 | Liu | H10K 59/122 |
| 2023/0006003 A1* | 1/2023 | Huang | H10K 71/166 |
| 2023/0276676 A1* | 8/2023 | Kim | H10K 59/353 |
| | | | 257/88 |
| 2023/0337478 A1* | 10/2023 | Zhang | H10K 59/122 |
| 2024/0276824 A1* | 8/2024 | Yue | H10K 59/352 |
| 2024/0284745 A1* | 8/2024 | Le | H10K 59/353 |
| 2024/0349534 A1* | 10/2024 | Chen | H10K 59/1213 |

FOREIGN PATENT DOCUMENTS

| | | |
|---|---|---|
| CN | 111047998 A | 4/2020 |
| CN | 111725288 A | 9/2020 |
| CN | 112368840 A | 2/2021 |
| CN | 112436031 A | 3/2021 |

* cited by examiner

DISPLAY PANEL, PREPARATION METHOD AND DISPLAY DEVICE

CROSS-REFERENCE TO RELATED APPLICATION

This application claims priority to Chinese Patent Application No. 202110746235.5 filed Jul. 1, 2021, the disclosure of which is incorporated herein by reference in its entirety.

TECHNICAL FIELD

Embodiments of the present application relate to the field of display technologies and, in particular, to a display panel, a preparation method, and a display device.

BACKGROUND

An organic light-emitting diode (OLED) has characteristics of self-luminescence, low power consumption, high brightness, and fast response and thus has attracted wide attention. Organic self-luminous display technology has become the research focus in the current display field. To achieve the full-color display of an OLED display panel, multiple sub-pixels with different light-emitting colors, such as a red sub-pixel R, a green sub-pixel G, and a blue sub-pixel B, are disposed in the display panel. The arrangement of the pixels in the display panel directly affects the organic light-emitting display performance. However, how to arrange the sub-pixels in the display panel to make the display effect of the display panel better has become the research focus of related technicians.

SUMMARY

Embodiments of the present application provide a display panel, a preparation method, and a display device, to improve the display effect of the display panel.

In a first aspect, the embodiments of the present application provide a display panel. The display panel includes a plurality of first sub-pixels, a plurality of second sub-pixels, and a plurality of third sub-pixels. The plurality of third sub-pixels forms a first virtual trapezoid, centers of the plurality of third sub-pixels are respectively located at vertices of the first virtual trapezoid, and one of the plurality of first sub-pixels is located inside the first virtual trapezoid. The plurality of first sub-pixels and the plurality of second sub-pixels form a second virtual trapezoid, centers of the plurality of second sub-pixels are located at first vertices of the second virtual trapezoid, centers of the plurality of first sub-pixels are located at second vertices of the second virtual trapezoid, the first vertices and the second vertices alternate and are spaced apart, and one of the plurality of third sub-pixels is located inside the second virtual trapezoid. The first virtual trapezoid includes a first long side, a first oblique side, a first short side, and a second oblique side that are sequentially connected; and the second virtual trapezoid includes a second long side, a third oblique side, a second short side, and a fourth oblique side that are sequentially connected. The first long side and the first oblique side form a first included angle, and the first long side and the second oblique side form a second included angle; the second long side and the third oblique side form a third included angle, and the second long side and the fourth oblique side form a fourth included angle. A sum of the first included angle and the second included angle is a first angle, a sum of the third included angle and the fourth included angle is a second angle, a difference between the first angle and the second angle is within a first preset range, and an absolute value of the first preset range is greater than or equal to 0° and less than or equal to 10°.

In a second aspect, the embodiments of the present application provide a display panel. The display panel includes a substrate and a display layer. The display layer is disposed on a side of the substrate and includes a pixel defining layer and a plurality of light-emitting elements, where the pixel defining layer includes a plurality of pixel openings, and each of the plurality of light-emitting elements includes a light-emitting layer. A ratio of a length of the light-emitting layer in a first direction to a length of the light-emitting layer in a second direction is greater than a ratio of a length of a pixel opening corresponding to the light-emitting layer in the first direction to a length of the pixel opening corresponding to the light-emitting layer in the second direction. The display panel further includes a plurality of first sub-pixels and a plurality of second sub-pixels, where the plurality of first sub-pixels and the plurality of second sub-pixels form a second virtual trapezoid, centers of the plurality of second sub-pixels are located at first vertices of the second virtual trapezoid, and centers of the plurality of first sub-pixels are located at second vertices of the second virtual trapezoid, where the first vertices and the second vertices alternate and are spaced apart; and the second virtual trapezoid includes a second long side, a third oblique side, a second short side, and a fourth oblique side, and the second long side of the second virtual trapezoid extends in a second direction.

In a third aspect, the embodiments of the present application further provide a preparation method of a display panel including a step described below. A substrate and an evaporation source are provided. The substrate and the evaporation source move relative to each other in a third direction, and a plurality of first sub-pixels are evaporated on the substrate; the substrate and the evaporation source move relative to each other in the third direction, and a plurality of second sub-pixels are evaporated on the substrate. The plurality of first sub-pixels and the plurality of second sub-pixels form a second virtual trapezoid, centers of the plurality of second sub-pixels are located at first vertices of the second virtual trapezoid, centers of the plurality of first sub-pixels are located at second vertices of the second virtual trapezoid, and the first vertices and the second vertices alternate and are spaced apart. The second virtual trapezoid includes a second long side, a third oblique side, a second short side, and a fourth oblique side, where the second long side of the second virtual trapezoid extends in a second direction, and an included angle between the third direction and the second direction is within a second preset range.

In a fourth aspect, the embodiments of the present application further provide a display device. The display device includes the display panel described in the first aspect and the second aspect.

DETAILED DESCRIPTION

To make the objects, technical solutions, and advantages of the present application clearer, the technical solutions of the present application will be completely described below through embodiments and in conjunction with drawings in embodiments of the present application. Apparently, the embodiments described below are part, not all, of the embodiments of the present application. It is apparent for those skilled in the art that various modifications and variations may be made in the present application without departing from the spirit or scope of the present application. Accordingly, the present application is intended to cover modifications and variations of the present application that fall within the scope of the appended claims (the claimed technical solutions) and their equivalents.

It is to be noted that the embodiments of the present application, if not in collision, may be combined with one another.

The pixel arrangement of a current OLED display panel includes "RGBG" arrangement, "delta" arrangement, and "diamond" arrangement. Through the "RGBG" arrangement, the text is fuzzy, the strokes are relatively thick, and the picture display is relatively fuzzy; through the "delta" arrangement, the displayed text fonts have relatively apparent jaggedness; through the "diamond" arrangement, the displayed text is clear, the strokes are relatively thin, and the jaggedness is relatively slight. However, there are still some technical problems in the "diamond" arrangement that need to be solved.

Figure 1:
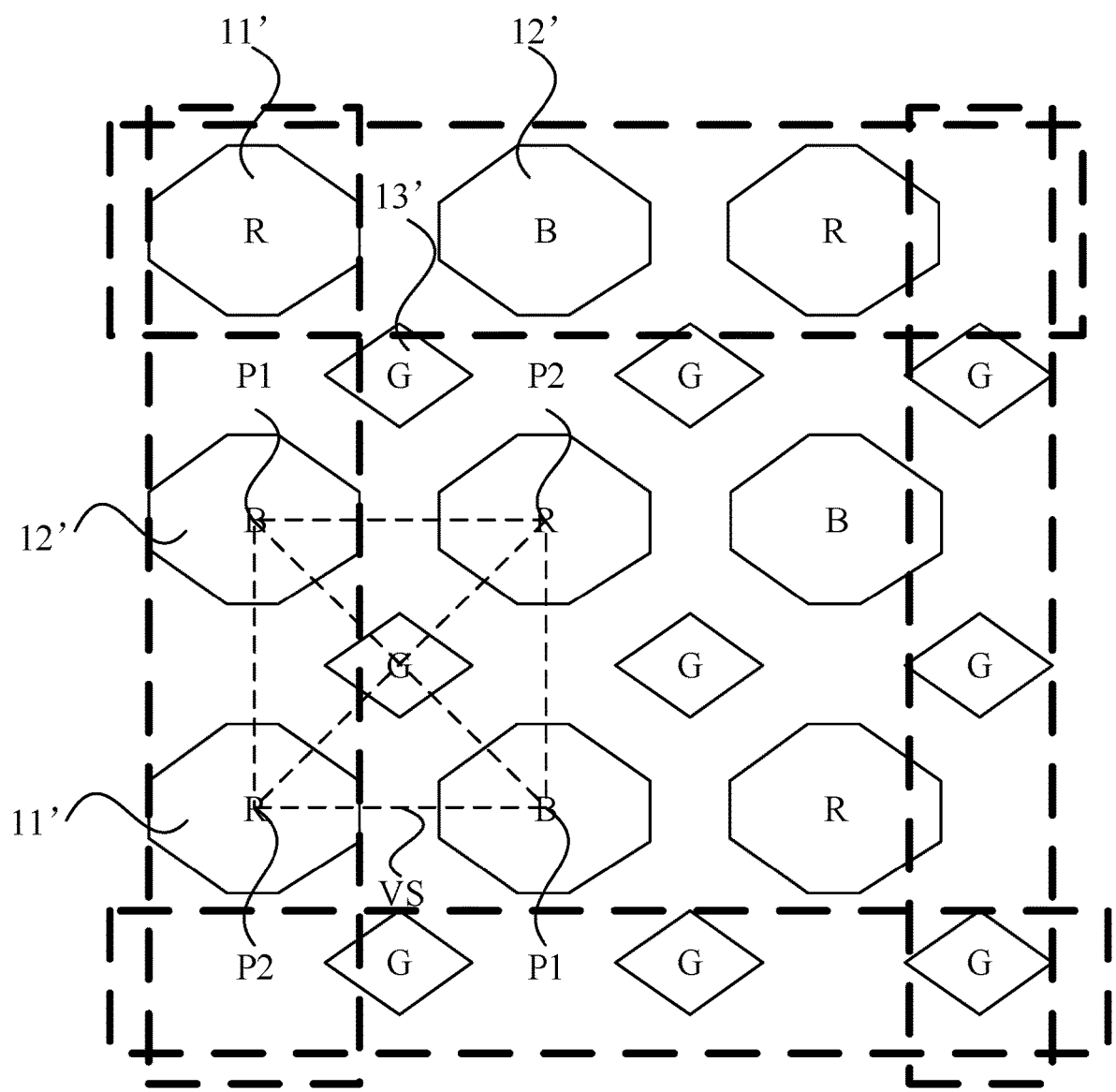
FIG. 1 is a structure diagram of a pixel arrangement structure in the related art.

In an embodiment, FIG. 1 is a structure diagram of a pixel arrangement structure in the related art. As shown in FIG. 1, the pixel arrangement structure in the related art includes first sub-pixels 11', second sub-pixels 12', and third sub-pixels 13'. A center of the third sub-pixel 13' coincides with a center of a virtual square VS. The second sub-pixels 12' are spaced apart from the third sub-pixels 13', and a center of the second sub-pixel 12' is located at a first vertex P1 of the virtual square VS. The first sub-pixels 11' are spaced apart from the second sub-pixels 12' and the third sub-pixels 13', and a center of the first sub-pixel 11' is located at a second vertex P2 adjacent to the first vertex P1 of the virtual square VS. Since in this design solution, an angle between two adjacent sides formed by the second sub-pixels 12' and the third sub-pixel 13' is 90° and the virtual square VS similar to a rhombus/diamond structure in shape is formed, those skilled in the art customarily refer to the arrangement as the "diamond" pixel arrangement.

The color fringing effect of the "diamond" pixel arrangement structure is relatively serious. The so-called color fringing effect means that when the display panel displays an image, the edge of the image has apparent color stripes that deviate from the original image. The color fringing effect includes a magenta color fringe and a green color fringe. The edge of the image includes red sub-pixels and blue sub-pixels, and the red sub-pixels and the blue sub-pixels are mixed to form magenta, that is, the edge of the image forms a magenta edge, which is the magenta color fringe; the edge of the image includes green sub-pixels, and the edge of the image displays green, that is, the edge of the image forms a green edge, which is the green color fringe.

In an embodiment, as shown in FIG. 1, the first sub-pixels 11' are the red sub-pixels, the second sub-pixels 12' are the blue sub-pixels, and the third sub-pixels 13' are the green sub-pixels. The first sub-pixels 11' and the second sub-pixels 12' in a region enclosed by a dashed frame on the left of FIG. 1 form the magenta color fringe; a row of third sub-pixels 13' are in a region enclosed by a dashed frame on the right of FIG. 1, and the green color fringing is serious; the first sub-pixels 11' and the second sub-pixel 12' in a region enclosed by a dashed frame on the upper side of FIG. 1 form the magenta color fringe; a row of third sub-pixels 13' are in a region enclosed by a dashed frame on the lower side of FIG. 1, and the green color fringing is serious. From this, it can be seen that the color fringing effect of the display panel in the related art is serious, thereby affecting the display effect of the display panel. The dashed frame is configured to mark the row or column of sub-pixels closest to the edge of the display region, which is conducive to observing the display effect of the edge.

It is to be noted that, to clearly show the regions where the color fringe appears, the regions are enclosed by dashed frames in FIG. 1. However, it is to be understood that the dashed frames do not really exist.

In view of the preceding technical problems, the embodiments of the present application provide a display panel, a preparation method, and a display device. Specifically, the display panel provided in the embodiments of the present application includes multiple first sub-pixels, multiple second sub-pixels, and multiple third sub-pixels. The multiple third sub-pixels form a first virtual trapezoid, centers of the multiple third sub-pixels are respectively located at vertices of the first virtual trapezoid, and one of the multiple first sub-pixels is located inside the first virtual trapezoid. The multiple first sub-pixels and the multiple second sub-pixels form a second virtual trapezoid, centers of the multiple second sub-pixels are located at first vertices of the second virtual trapezoid, centers of the multiple first sub-pixels are located at second vertices of the second virtual trapezoid, the first vertices and the second vertices alternate and are spaced apart, and one of the multiple third sub-pixels is located inside the second virtual trapezoid. The first virtual trapezoid includes a first long side, a first oblique side, a first short side, and a second oblique side that are sequentially connected. The second virtual trapezoid includes a second long side, a third oblique side, a second short side, and a fourth oblique side that are sequentially connected. The first long side and the first oblique side form a first included angle, and the first long side and the second oblique side form a second included angle; the second long side and the third oblique side form a third included angle, and the second long side and the fourth oblique side form a fourth included angle. A sum of the first included angle and the second included angle is a first angle, a sum of the third included angle and the fourth included angle is a second angle, and a difference between the first angle and the second angle is within a first preset range, where an absolute value of the first preset range is greater than or equal to 0° and less than or equal to 10°.

In the preceding technical solution, four third sub-pixels form the first virtual trapezoid, that is, at least one of the four third sub-pixels is offset so that the number of third sub-pixels exposed separately is reduced and thus the color fringing phenomenon can be weakened; centers of two first sub-pixels and two second sub-pixels form the second virtual trapezoid, that is, the first sub-pixels or the second sub-pixels are offset so that the color fringing phenomenon can be weakened due to the offset of one of the sub-pixels. At the same time, the difference between the first angle and the second angle of the two trapezoids is within the first preset range. On the one hand, the color fringing phenomenon of all edges of the display panel can be improved at the same time; on the other hand, the offsets of three sub-pixels may be adjusted so that the first virtual trapezoid and the second virtual trapezoid form regular patterns with a relatively small difference and thus a better effect in text display and the uniformity of the display are ensured. In addition, the offset third sub-pixel may also be closer to the other two sub-pixels so that the color fringing effect becomes slight. That is, compared with the "diamond" arrangement, through the display panel provided in this embodiment, the color fringing effect can be weakened and thus the display effect of the display panel is improved.

The above is the core idea of the present application. Technical solutions in the embodiments of the present application will be described clearly and completely in conjunction with the drawings in the embodiments of the present application.

Figure 2:
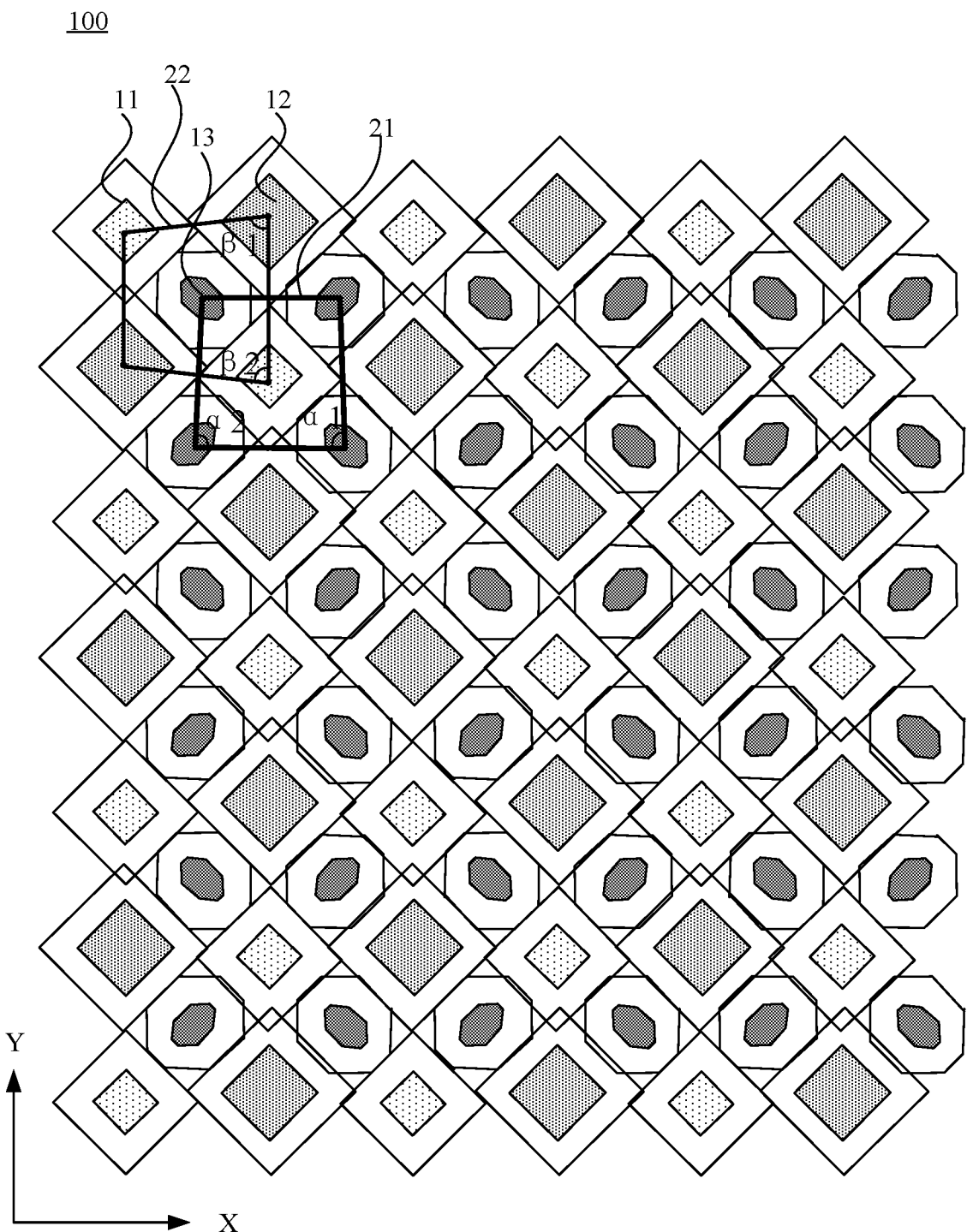
FIG. 2 is a structure diagram of a display panel according to an embodiment of the present application.
Figure 3:
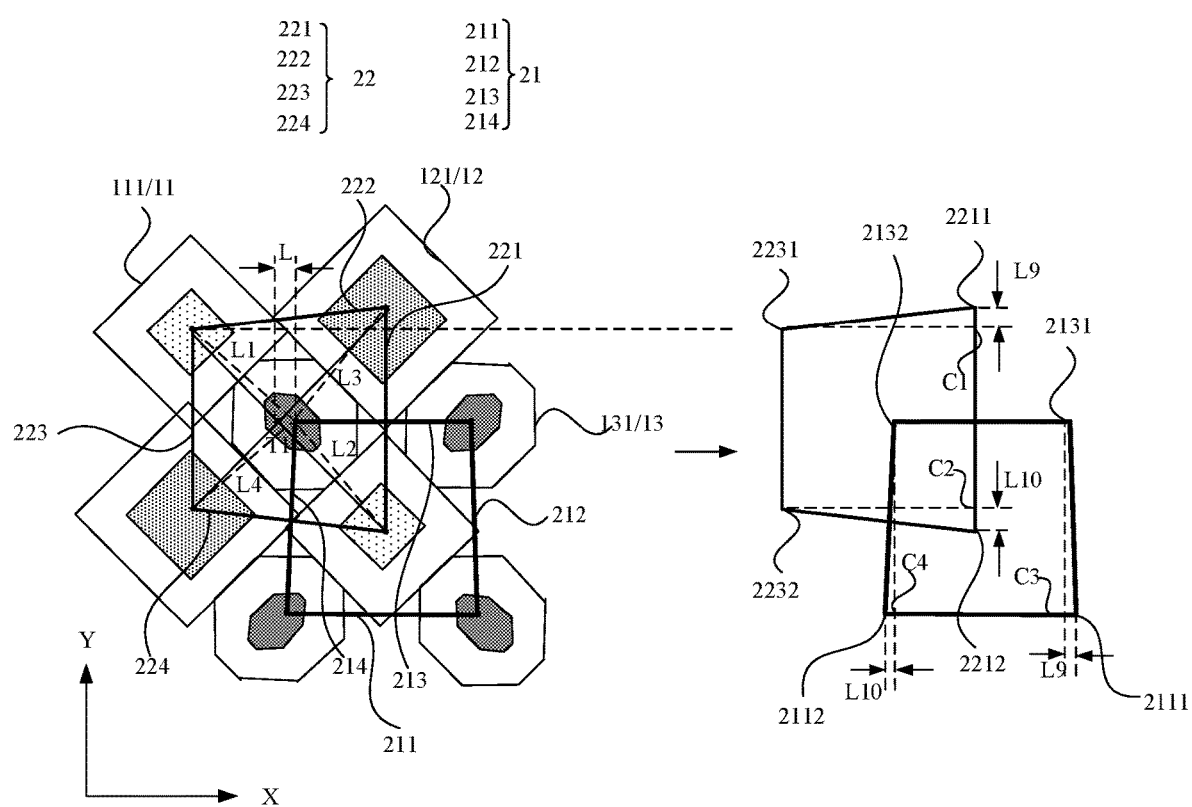
FIG. 3 is a partial enlarged diagram of the display panel shown in FIG. 2.

FIG. 2 is a structure diagram of a display panel according to an embodiment of the present application, and FIG. 3 is a partial enlarged diagram of the display panel shown in FIG. 2. As shown in FIGS. 2 and 3, a display panel 100 provided in the embodiments of the present application includes multiple first sub-pixels 11, multiple second sub-pixels 12, and multiple third sub-pixels 13. The multiple third sub-pixels 13 form a first virtual trapezoid 21, centers of the multiple third sub-pixels 13 are respectively located at vertices of the first virtual trapezoid 21, and one of the multiple first sub-pixels 11 is located inside the first virtual trapezoid 21. The multiple first sub-pixels 11 and the multiple second sub-pixels 12 form a second virtual trapezoid 22, centers of the multiple second sub-pixels 12 are located at first vertices of the second virtual trapezoid 22, centers of the multiple first sub-pixels 11 are located at second vertices of the second virtual trapezoid 22, the first vertices and the second vertices alternate and are spaced apart, and one of the multiple third sub-pixels 13 is located inside the second virtual trapezoid 12.

In an embodiment, the multiple first sub-pixels 11 are red sub-pixels, the multiple second sub-pixels 12 are blue sub-pixels, and the multiple third sub-pixels 13 are green sub-pixels. With continued reference to FIG. 2, the centers of the multiple third sub-pixels 13 form the first virtual trapezoid 21. For example, centers of four third sub-pixels 13 form the first virtual trapezoid 21, that is, compared with the "diamond" pixel arrangement, at least one of the four third sub-pixels 13 is offset. The offset of at least one third sub-pixel 13 means that the third sub-pixel 13 moves to a different edge of the display region. On the one hand, in the case where at least one of the four third sub-pixels 13 is offset in a direction toward the first sub-pixels and the second sub-pixels located at the edge of the display region, the display of the third sub-pixel may be mixed with the display of the first sub-pixels and the second sub-pixels at the edge of the display region so that the magenta color fringing effect at the edge of the display region can be improved. On the other hand, compared with the "diamond" pixel arrangement, in the case where centers of at least two adjacent ones of the four third sub-pixels 13 are not on a straight line, one of the third sub-pixels is offset relative to the other third sub-pixel toward the edge of the display region so that the number of the third sub-pixels located at the edge of the display region is reduced, the sensitivity of the human eye to the row (or column) formed by the third sub-pixels at the edge of the display region is reduced, and thus the green color fringing effect is weakened.

The centers of the multiple first sub-pixels 11 and the multiple second sub-pixels 12 form the second virtual trapezoid 22. For example, the centers of two first sub-pixels 11 and two second sub-pixels 12 form the second virtual trapezoid 22, that is, compared with the "diamond" pixel arrangement, at least one sub-pixel among the first sub-pixels 11 and the second sub-pixels 12 is offset. The offset of at least one sub-pixel among the first sub-pixels 11 and the second sub-pixels 12 means that the first sub-pixels 11 or the second sub-pixels 12 move to different edges of the display region. On the one hand, the multiple first sub-pixels or second sub-pixels are offset toward the edge of the display region, and the row (or column) formed by the centers of the multiple first sub-pixels and the row (or column) formed by the centers of the multiple second sub-pixels are not on the same straight line, and the two cannot form the magenta color fringing effect. On the other hand, since one of the sub-pixels corresponding to a long side of the second virtual trapezoid 22 is offset, for example, the first sub-pixels or the second sub-pixels may be closer to the third sub-pixels 13 at the edge of the display region, the first sub-pixels 11, the second sub-pixels 12, and the third sub-pixels 13 are more evenly distributed and thus the green color fringing effect is weakened. That is, compared with the "diamond" arrangement, through the display panel provided in this embodiment, the color fringing effect can be weakened and thus the display effect of the display panel is improved.

It is to be noted that the color fringing effect is that in the case where a white pure color image is lit, apparent color stripes appear at the edge of the display region. The improvement standard for color stripes is mainly to determine whether the image color at the edge of the display region is the same as the color of the white pure color image in the display region or whether the sensitivity of the human eye is reduced. The color stripes generally include a magenta color fringe and a green color fringe. The magenta color fringe is a color fringe formed by multiple red sub-pixels and blue sub-pixels, and the green color fringe is a color fringe formed by multiple green sub-pixels. An improvement method for the magenta color fringe is to use the green sub-pixels and the magenta color fringe for mixed display. In this manner, the red sub-pixels, the blue sub-pixels, and the green sub-pixels at the edge of the display region are close to each other, and the formed image color is the same as the white image color formed by the mixture of three types of sub-pixels in the display region so that color stripes that deviate from the image color in the display region can be prevented from appearing at the edge of the display region and thus the magenta color fringing effect is weakened. Another improvement method is to dispose the red sub-pixels and the blue sub-pixels at the edge of the display region on different rows (or columns). In this manner, the rows (or columns) formed by the centers of multiple red sub-pixels and the rows (or columns) formed by the centers of multiple blue sub-pixels are not on the same straight line, and the two cannot form the magenta color fringing effect; at the same time, the rows (or columns) formed by the centers of the blue sub-pixels are located at the extreme edge so that the sensitivity of the human eye to the sub-pixels is relatively low and thus the magenta color fringing effect is weakened. Through the preceding two methods, the magenta color fringing effect at the edge of the display region can be improved.

At the same time, an improvement method for the green color fringe is to reduce the number of the green sub-pixels in the green color fringe and reduce the sensitivity of the human eye to the green color fringe, thereby weakening the green color fringing effect. In another method, the row (or column) formed by the green sub-pixels closest to the edge of the display region is close to the row (or column) formed by the blue sub-pixels or the red sub-pixels at the edge of the display region, and the display of the green color fringe is mixed with the display of the red sub-pixels or the blue sub-pixels so that the green color fringing is weakened.

Figure 4:
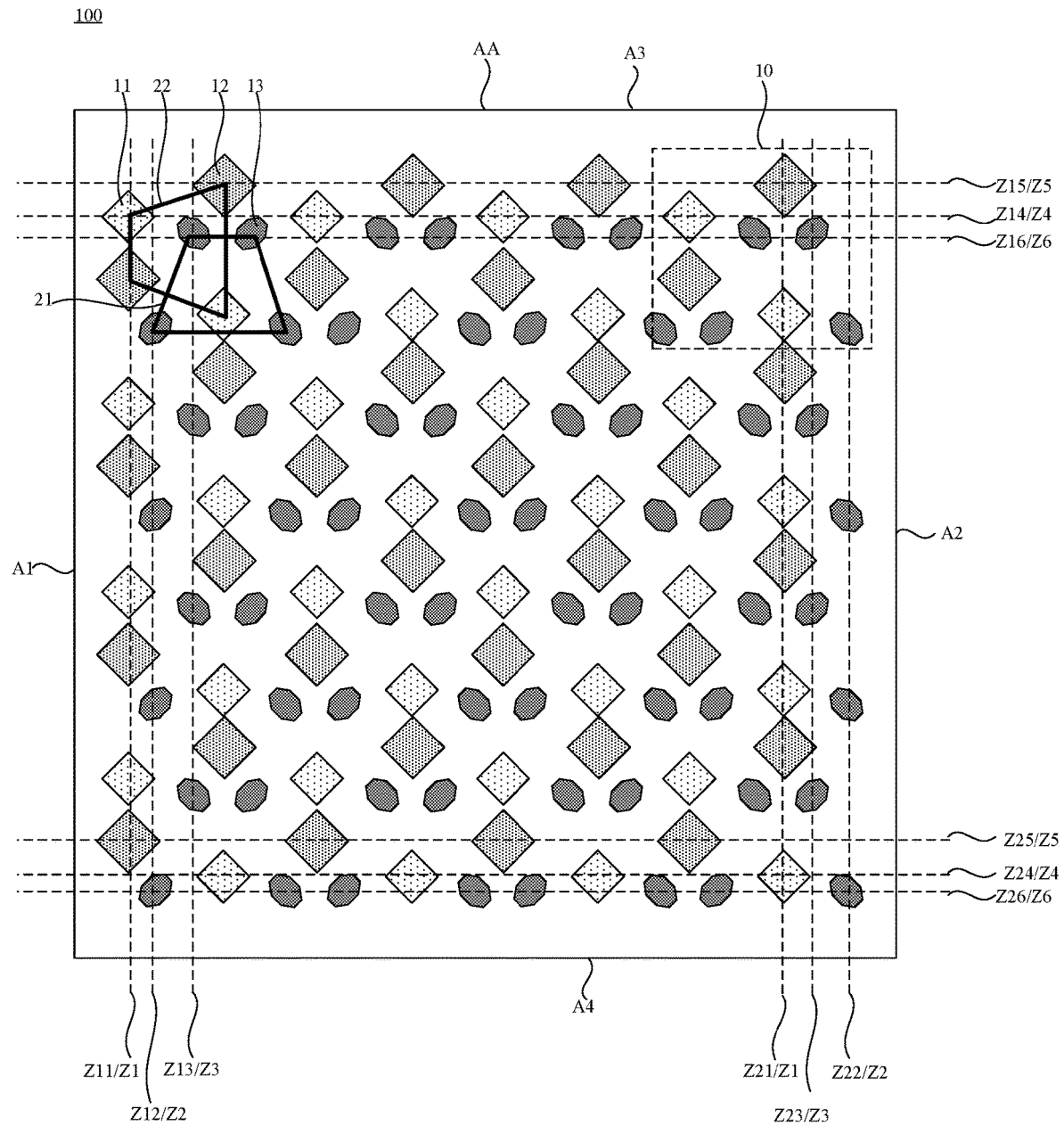
FIG. 4 is a structure diagram of another display panel according to an embodiment of the present application.

In an embodiment, FIG. 4 is a structure diagram of another display panel according to an embodiment of the present application. As shown in FIG. 4, the display panel 100 provided in the embodiments of the present application further includes a display region AA. The display region includes at least one edge. The centers of the first sub-pixels 11 and the centers of the second sub-pixels 12 are located on a first virtual line Z1, the centers of the third sub-pixels 13 closest to the edge are located on a second virtual line Z2, and the centers of the third sub-pixels 13 second closest to the edge are located on a third virtual line Z3. Extension directions of the first virtual line Z1, the second virtual line Z2, and the third virtual line Z3 are substantially the same, and spatial positions of the first virtual line Z1, the second virtual line Z2, and the third virtual line Z3 are not the same. In an embodiment, as shown in FIG. 4, each of the extension directions of the first virtual line Z1, the second virtual line Z2, and the third virtual line Z3 is, for example, a first direction, where the first direction includes a column direction; alternatively, FIG. 5 is a structure diagram of another display panel according to an embodiment of the present application, as shown in FIG. 5, the first direction includes a row direction.

In this embodiment, the centers of the multiple third sub-pixels 13 are respectively located on the second virtual line Z2 and the third virtual line Z3. In the case where the third sub-pixels 13 are close to the edge, the number of the third sub-pixels 13 is relatively small so that the effect of weakening the green color fringing effect is achieved. In the case where the first sub-pixels 11 and the second sub-pixels 12 are close to the edge, the third sub-pixels 13 may be mixed with the first sub-pixels 11 and the second sub-pixels 12 close to the edge so that the effect of weakening the magenta color fringing effect is achieved.

Figure 5:
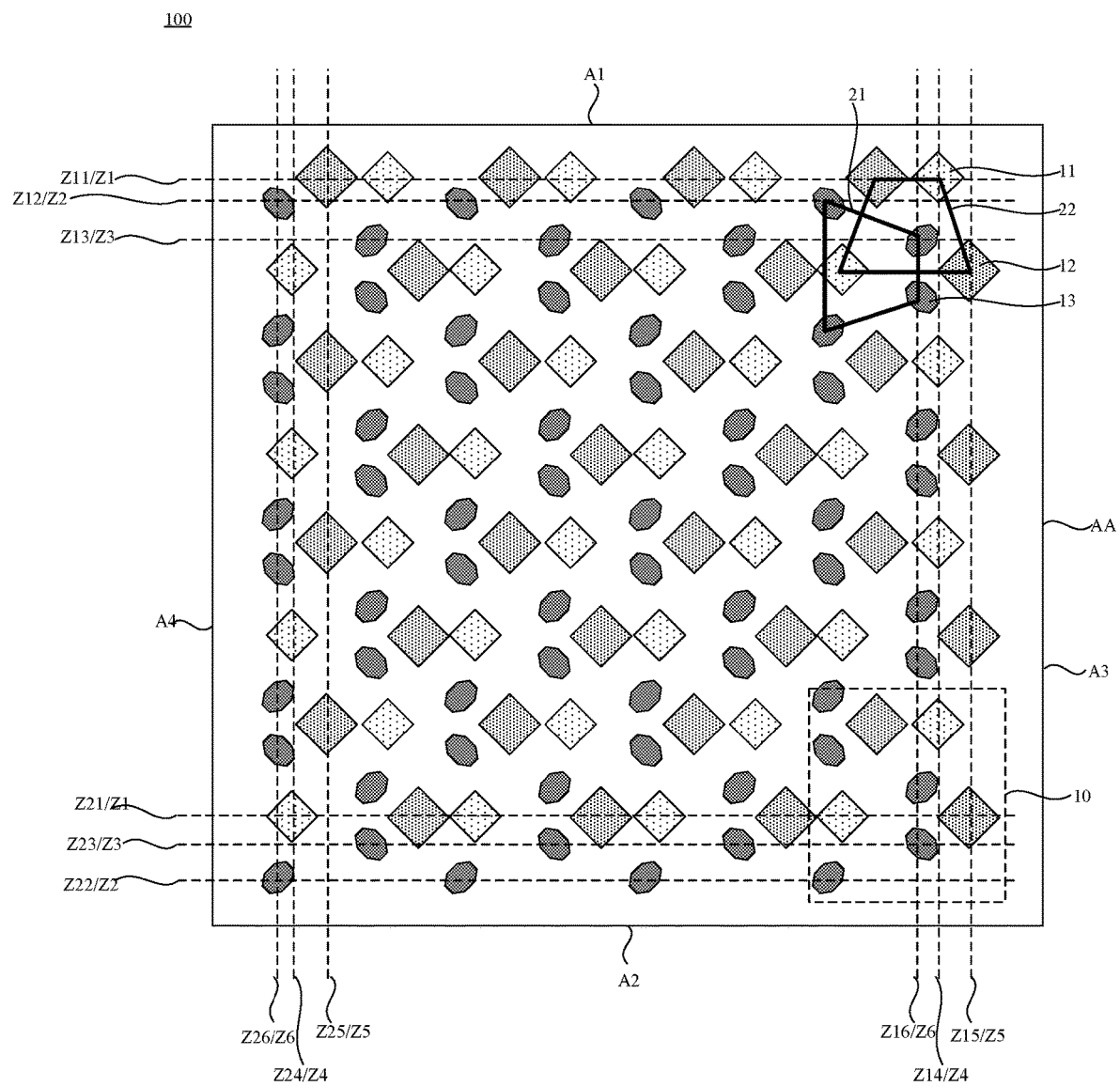
FIG. 5 is a structure diagram of another display panel according to an embodiment of the present application.

In an embodiment, with continued reference to FIGS. 4 and 5, the display region includes a first edge A1, and a third virtual line Z13 is located on a side of a second virtual line Z12 farther away from a first virtual line Z11.

In an embodiment, the multiple first sub-pixels 11 are red sub-pixels, the multiple second sub-pixels 12 are blue sub-pixels, and the multiple third sub-pixels 13 are green sub-pixels. With continued reference to FIGS. 4 and 5, the third virtual line Z13 is located on a side of the second virtual line Z12 farther away from the first virtual line Z11, that is, the third sub-pixels 13 whose centers are located on the second virtual line Z12 are more offset toward the first sub-pixels 11 and the second sub-pixels 12 whose centers are located on the first virtual line Z1, and the green sub-pixels are mixed with the red sub-pixels and the blue sub-pixels. In this manner, the magenta color fringing effect caused by the first sub-pixels 11 and the second sub-pixels 12 whose centers are located on the first virtual line Z1 can be improved.

Based on the preceding solution, in an embodiment, the third sub-pixels 13 corresponding to the first long side of the first virtual trapezoid 21 and closer to the first edge A1 and the first sub-pixels 11 and/or the second sub-pixels 12 overlap in the first direction, thereby further weakening the magenta color fringing effect.

In an embodiment, with continued reference to FIGS. 4 and 5, the display region includes a second edge A2, a third virtual line Z23 is located on a side of a second virtual line Z22 closer to a first virtual line Z21, and the third virtual line Z23 is located between the first virtual line Z21 and the second virtual line Z22.

In an embodiment, the multiple first sub-pixels 11 are red sub-pixels, the multiple second sub-pixels 12 are blue sub-pixels, and the multiple third sub-pixels 13 are green sub-pixels. With continued reference to FIGS. 4 and 5, the third virtual line Z23 is located on a side of the second virtual line Z22 closer to the first virtual line Z21, and the third virtual line Z23 is located between the first virtual line Z21 and the second virtual line Z22, that is, the third sub-pixels 13 whose centers are located on the third virtual line Z23 is more offset toward a side farther away from the second edge A2, and the third sub-pixels 13 whose centers are located on the second virtual line Z22 are more offset toward a side of the second edge A2, that is, the number of the third sub-pixels 13 at the edge is reduced so that the green color fringing effect caused by the third sub-pixels 13 at the edge can be improved. In addition, since the first sub-pixels 11 whose centers are located on the first virtual line Z21 is closer to the third sub-pixels 13 whose centers are located on the third virtual line Z23 so that the first sub-pixels 11 and the third sub-pixels 13 are mixed, thereby further improving the green color fringing effect caused by the third sub-pixels 13 being located at the edge.

Based on the preceding embodiments, in an embodiment, with continued reference to FIGS. 4 and 5, the display panel 100 provided in the embodiments of the present application further includes the display region AA. The display region includes at least one edge. The centers of the first sub-pixels 11 second closest to the edge are located on a fourth virtual line Z4, the centers of the second sub-pixels 12 closest to the edge are located on a fifth virtual line Z5, and the centers of the third sub-pixels 13 are located on a sixth virtual line Z6. Extension directions of the fourth virtual line Z4, the fifth virtual line Z5, and the sixth virtual line Z6 are substantially the same, and spatial positions of the fourth virtual line Z4, the fifth virtual line Z5, and the sixth virtual line Z6 are different. In an embodiment, as shown in FIG. 4, each of the extension directions of the fourth virtual line Z4, the fifth virtual line Z5, and the sixth virtual line Z6 is, for example, a second direction, where the second direction includes a row direction; alternatively, FIG. 5 is a structure diagram of another display panel according to an embodiment of the present application, as shown in FIG. 5, the second direction includes a column direction.

In this embodiment, the centers of the first sub-pixels 11 second closest to the edge are located on the fourth virtual line Z4, and the centers of the second sub-pixels 12 closest to the edge are located on the fifth virtual line Z5, that is, the first sub-pixels 11 and the second sub-pixels 12 are staggered. In the case where the first sub-pixels 11 and the second sub-pixels 12 are close to the edge, the color fringing effect can be weakened; in addition, in the case where the third sub-pixels 13 are close to the edge, since the first sub-pixels 11 and the second sub-pixels 12 are staggered, one of the sub-pixels is more offset toward the third sub-pixels 13 and mixed with the third sub-pixels 13 so that the color fringing effect can be weakened.

In an embodiment, with continued reference to FIGS. 4 and 5, the display region includes a third edge A3, and a sixth virtual line Z16 is located on a side of a fourth virtual line Z14 farther away from a fifth virtual line Z15.

In an embodiment, the multiple first sub-pixels 11 are red sub-pixels, the multiple second sub-pixels 12 are blue sub-pixels, and the multiple third sub-pixels 13 are green sub-pixels. With continued reference to FIGS. 4 and 5, the sixth virtual line Z16 is located on a side of the fourth virtual line Z14 farther away from the fifth virtual line Z15, that is, the third sub-pixels whose centers are located at the fourth virtual line Z14 are closer to the third sub-pixels whose centers are located on the sixth virtual line Z16; in addition, since the centers of the first sub-pixels 11 second closest to the edge are located on the fourth virtual line Z4 and the centers of the second sub-pixels 12 closest to the edge are located on the fifth virtual line Z5, that is, the first sub-pixels 11 and the second sub-pixels 12 are staggered, the first sub-pixels 11, the second sub-pixels 12, and the third sub-pixels 13 are more evenly distributed and thus the magenta fringing effect caused by the first sub-pixels 11 and the second sub-pixels 12 whose centers are located on the same virtual line can be improved.

In an embodiment, with continued reference to FIGS. 4 and 5, the display region includes a fourth edge A4, a sixth virtual line Z26 is located on a side of a fourth virtual line Z24 farther away from a fifth virtual line Z25, and the fourth virtual line Z24 is located between the fifth virtual line Z25 and the sixth virtual line Z26.

In an embodiment, the multiple first sub-pixels 11 are red sub-pixels, the multiple second sub-pixels 12 are blue sub-pixels, and the multiple third sub-pixels 13 are green sub-pixels. With continued reference to FIGS. 4 and 5, the sixth virtual line Z26 is located on a side of the fourth virtual line Z24 farther away from the fifth virtual line Z25, and the fourth virtual line Z24 is located between the fifth virtual line Z25 and the sixth virtual line Z26, that is, the third sub-pixels 13 whose centers are located on the sixth virtual line Z26 are offset toward a side of the fourth edge A4, the third sub-pixels 13 whose centers are located on the fourth virtual line Z24 are closer to the third sub-pixels 13 whose centers are located on the sixth virtual line Z26, and the first sub-pixels 11 and the third sub-pixels 13 are mixed so that the green color fringing effect caused by the third sub-pixels 13 being located at the edge is improved.

Based on the preceding solution, in an embodiment, the third sub-pixels 13 corresponding to the first long side of the first virtual trapezoid 21 and closer to the fourth edge A4 and the first sub-pixels 11 and/or the second sub-pixels 12 overlap in the second direction, thereby further weakening the green color fringing effect caused by the third sub-pixels 13 being located at the edge.

It is to be noted that in FIG. 4, the case where the first edge A1 is the left edge of the display region AA, the second edge A2 is the right edge of the display region AA, the third edge A3 is the upper edge of the display region AA, and the fourth edge A4 is the lower edge of the display region AA is used as an example, and in FIG. 5, the case where the first edge A1 is the upper edge of the display region AA, the second edge A2 is the lower edge of the display region AA, the third edge A3 is the left edge of the display region AA, and the fourth edge A4 is the right edge of the display region AA is used as an example, which does not constitute a limitation to the present application. Those skilled in the art can set the position of the sub-pixels according to the actual situation, but this solution can all solve the problem of the color fringing effect of the display panel.

With continued reference to FIGS. 2 and 3, the first virtual trapezoid 21 includes a first long side 211, a first oblique side 212, a first short side 213, and a second oblique side 214 that are sequentially connected; the second virtual trapezoid 22 includes a second long side 221, a third oblique side 222, a second short side 223, and a fourth oblique side 224 that are sequentially connected; the first long side 211 and the first oblique side 212 form a first included angle $\alpha 1$, and the first long side 211 and the second oblique side 214 form a second included angle $\alpha 2$; the second long side 221 and the third oblique side 222 form a third included angle $\beta 1$, and the second long side 221 and the fourth oblique side 224 form a fourth included angle $\beta 2$. A sum of the first included angle $\alpha 1$ and the second included angle $\alpha 2$ is a first angle, a sum of the third included angle $\beta 1$ and the fourth included angle $\beta 2$ is a second angle, and a difference between the first angle and the second angle is within a first preset range.

In this embodiment, since the sum of the first included angle $\alpha 1$ and the second included angle $\alpha 2$ is the first angle, the sum of the third included angle $\beta 1$ and the fourth included angle $\beta 2$ is the second angle, and the difference between the first angle and the second angle is within the first preset range. In an embodiment, the first preset range may be, for example, greater than or equal to 0° and less than or equal to 10°; in an embodiment, the first preset range may be, for example, greater than or equal to 0° and less than or equal to 4°; in an embodiment, the first preset range may be, for example, greater than or equal to 0° and less than or equal to 5°; in an embodiment, the first preset range may be, for example, greater than or equal to 0° and less than or equal to 6°. In an embodiment, the first preset range may be 0°, 5°, and 10°. In this manner, a better arrangement of the sub-pixels without apparent hollow regions can be ensured, thereby effectively avoiding apparent gaps, avoiding waste of space, and ensuring the display effect of the display panel 100.

The range of the first included angle $\alpha 1$ may satisfy, for example, $82° \leq \alpha 1 \leq 88°$, such as 82°, 83°, 84°, 85°, 86°, 87°, 88°, etc.; in an embodiment, the range of $\alpha 1$ satisfies $83° \leq \alpha 1 \leq 86°$, such as 83°, 86°, etc. The first long side 211 and the second oblique side 214 form the second included angle $\alpha 2$, where the range of the second included angle $\alpha 2$ may satisfy, for example, $82° \leq \alpha 2 \leq 88°$, such as 82°, 83°, 84°, 85°, 86°, 870, 88°, etc.; in an embodiment, the range of $\alpha 2$ satisfies $83° \leq \alpha 2 \leq 86°$, such as 83°, 86°, etc. The second long side 221 and the third oblique side 222 form the third included angle $\beta 1$, where the range of the third included angle $\beta 1$ may satisfy, for example, $82° \leq \beta 1 \leq 88°$, such as 82°, 83°, 84°, 85°, 86°, 87°, 88°, etc.; in an embodiment, the range of $\beta 1$ satisfies $83° \leq \beta 1 \leq 86°$, such as 83°, 86°, etc. The second long side 221 and the fourth oblique side 224 form the fourth included angle $\beta 2$, where the range of the fourth included angle $\beta 2$ may satisfy, for example, $82° \leq \beta 2 \leq 88°$, such as 82°, 83°, 84°, 85°, 86°, 87°, 88°, etc.; in an embodiment, the range of $\beta 2$ satisfies $83° \leq \beta 2 \leq 86°$, such as 83°, 86°, etc.

It is to be noted that in the case where the display panel has a certain resolution, when the virtual rectangular shape in the "diamond" arrangement becomes the virtual trapezoid of this application, the virtual trapezoid includes two oblique sides, one short side, and one long side; when the angle between each of the two oblique sides and the long side changes, the distances between the oblique sides, the long side, and the short side also change accordingly. For example, in the case where the angle between each of the two oblique sides and the long side is 86°, this angle is less than the angle in the "diamond" arrangement, which is 90°, the oblique sides corresponding to the virtual trapezoid gradually become longer, the long side corresponding to the virtual trapezoid gradually becomes longer, and the short side corresponding to the virtual trapezoid becomes shorter accordingly.

Figure 6:
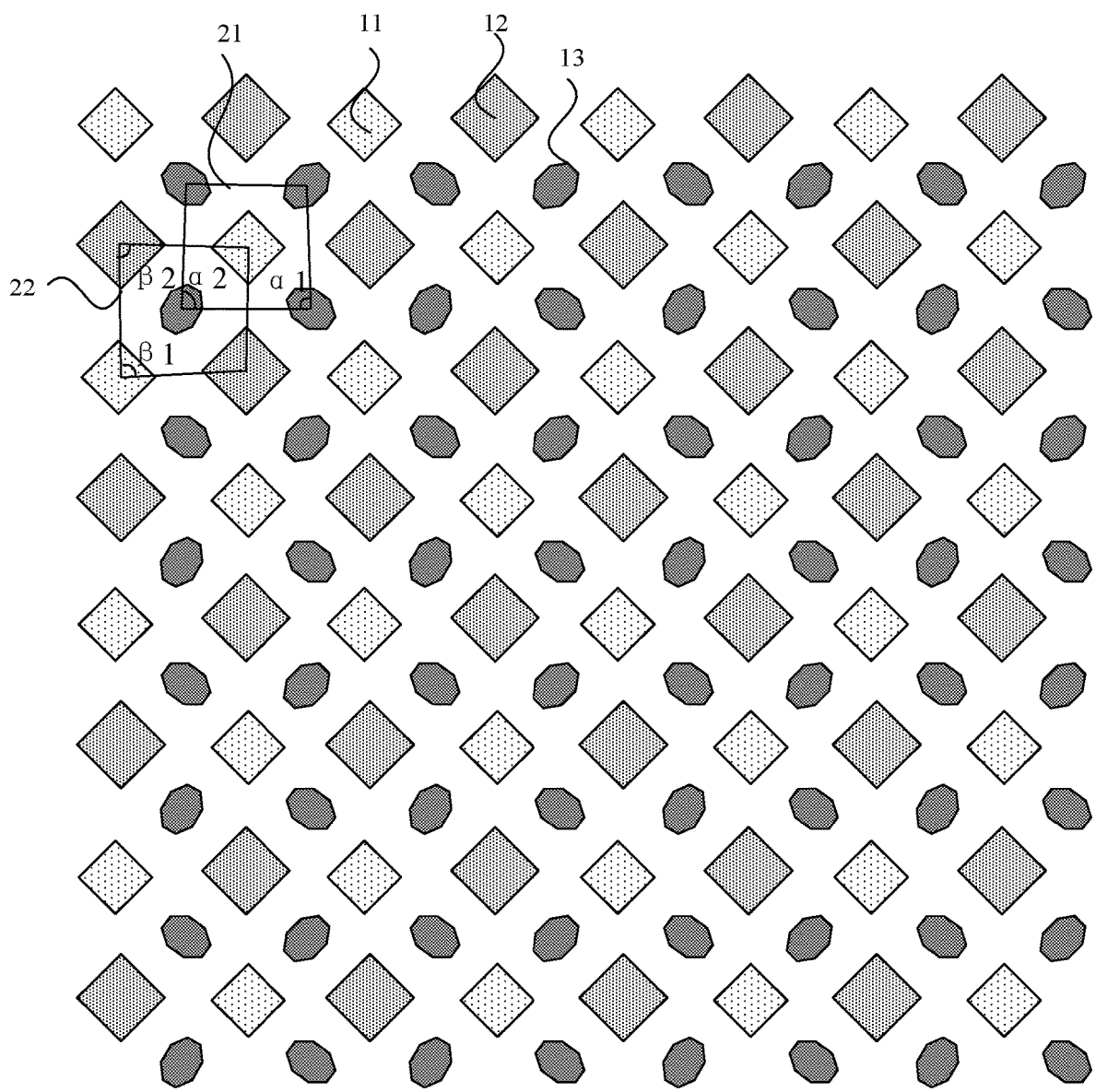
FIG. 6 is a structure diagram of another display panel according to an embodiment of the present application.
Figure 7:
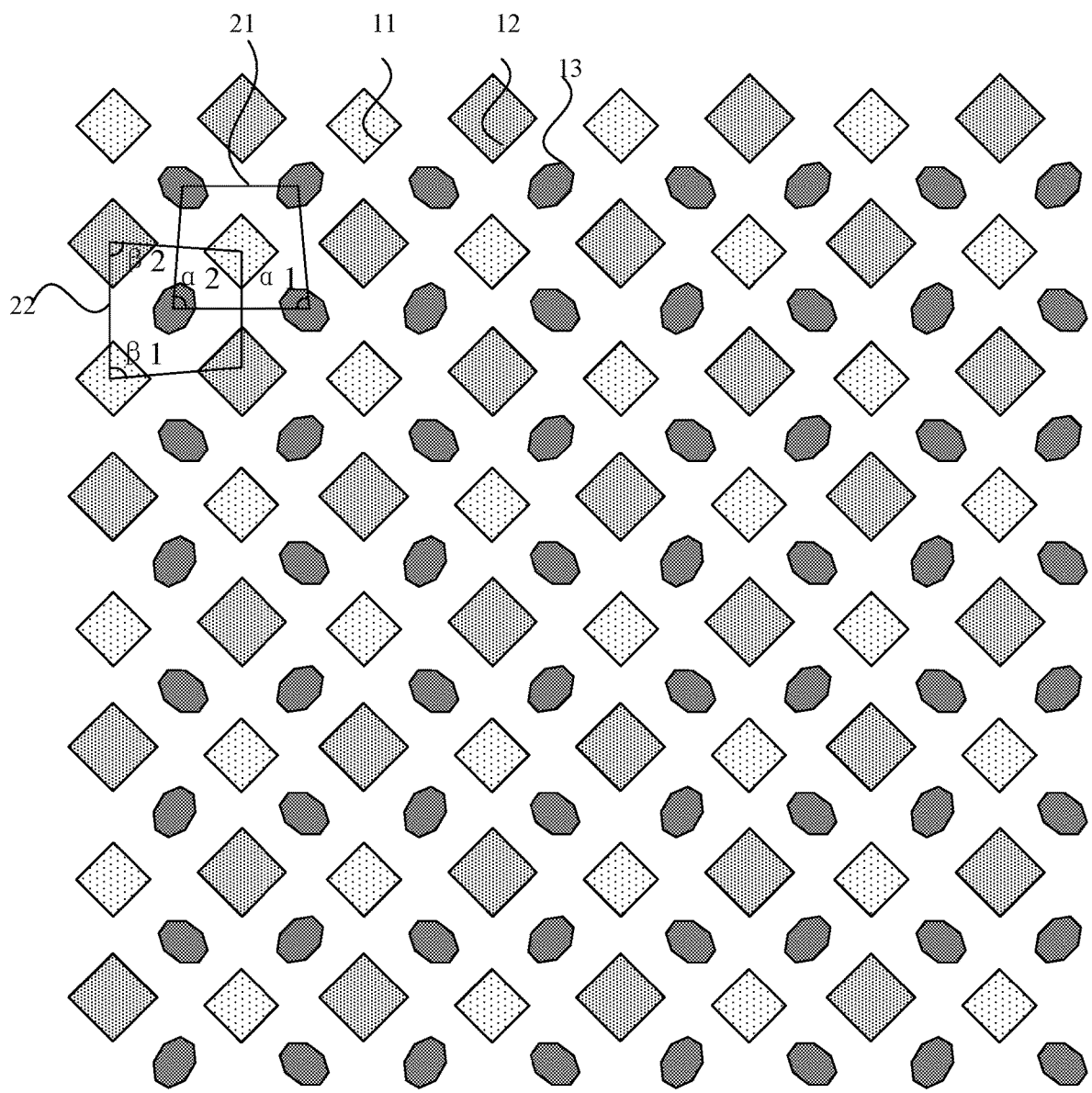
FIG. 7 is a structure diagram of another display panel according to an embodiment of the present application.
Figure 8:
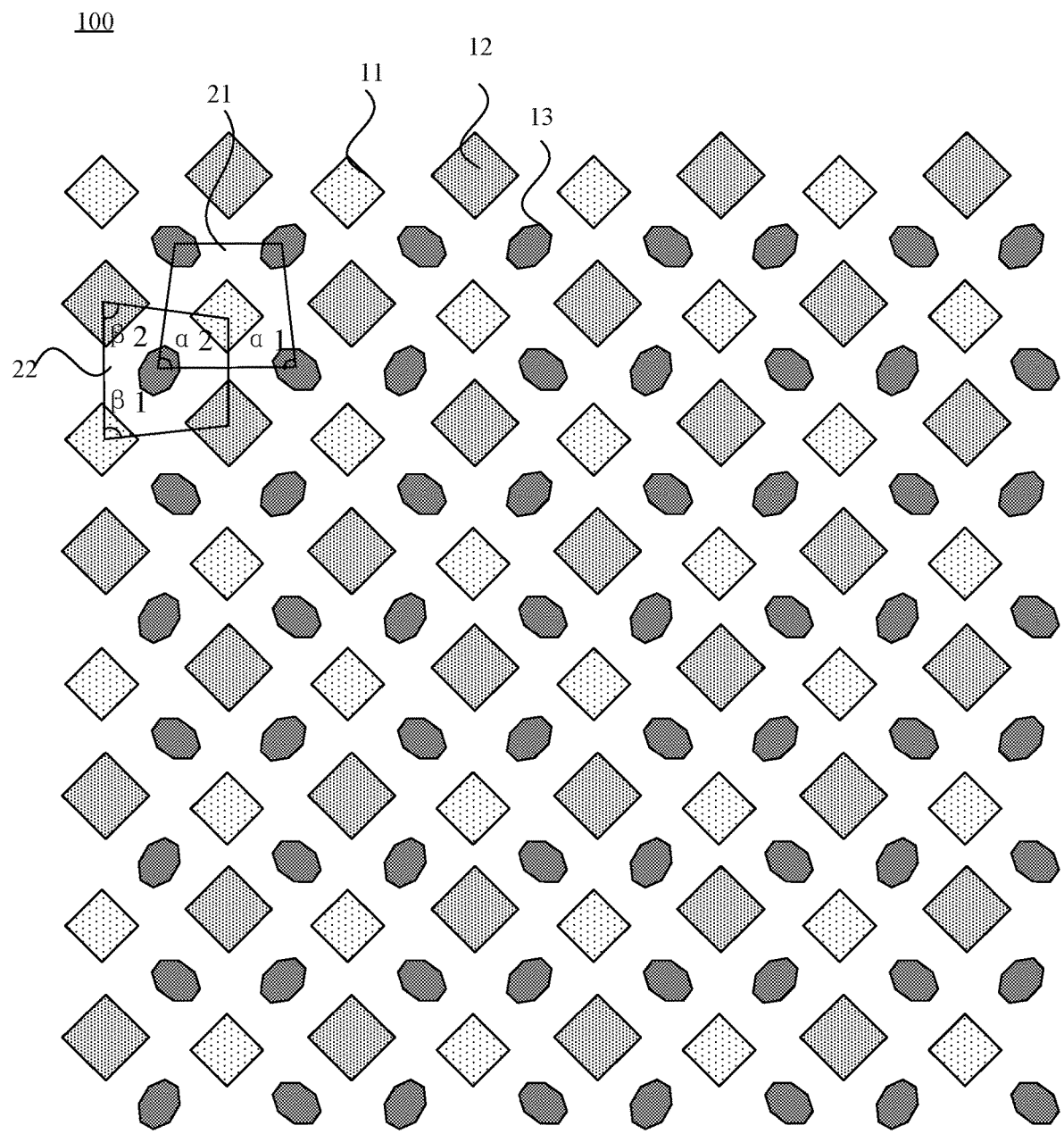
FIG. 8 is a structure diagram of another display panel according to an embodiment of the present application.
Figure 9:
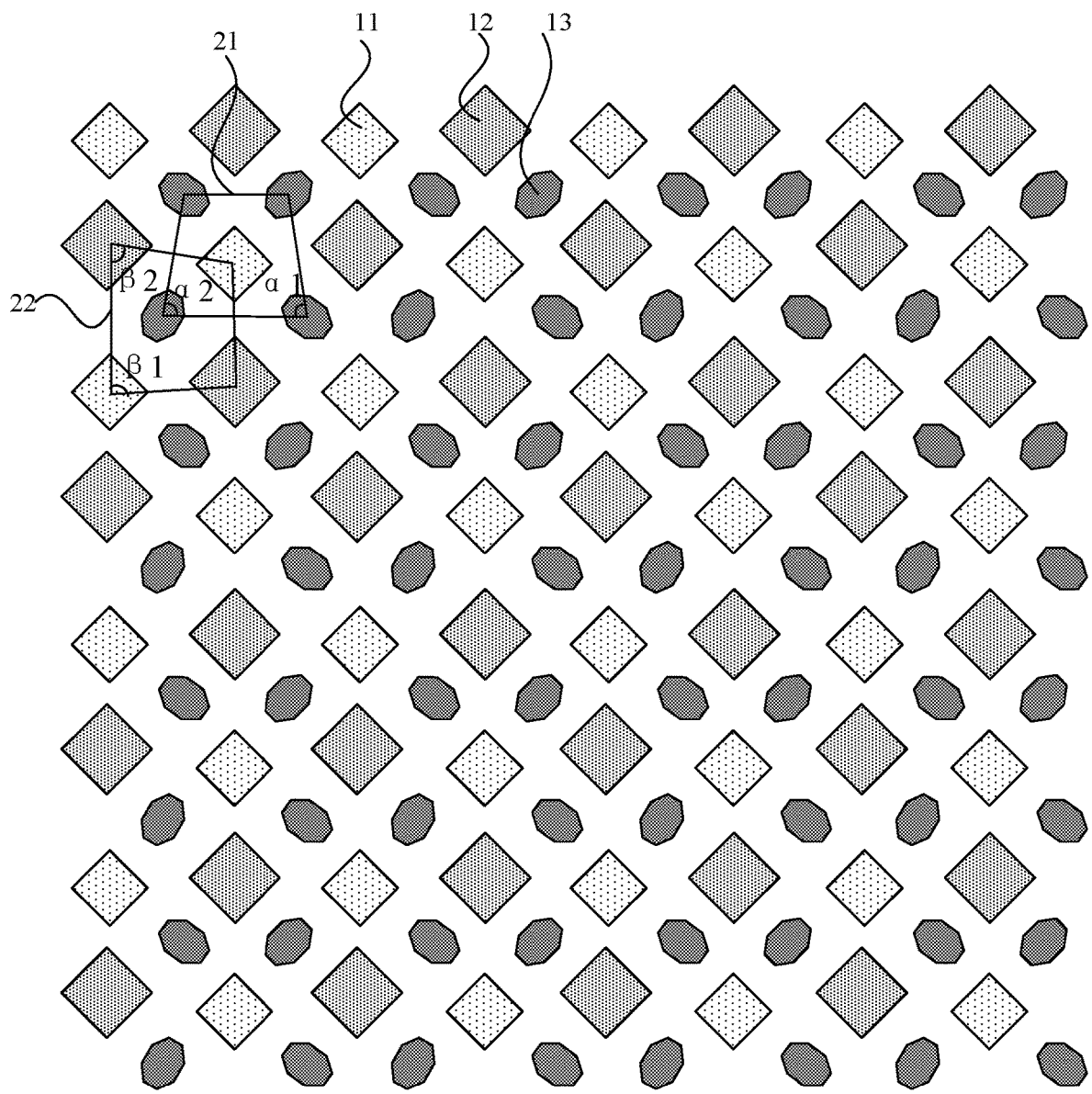
FIG. 9 is a structure diagram of another display panel according to an embodiment of the present application.
Figure 10:
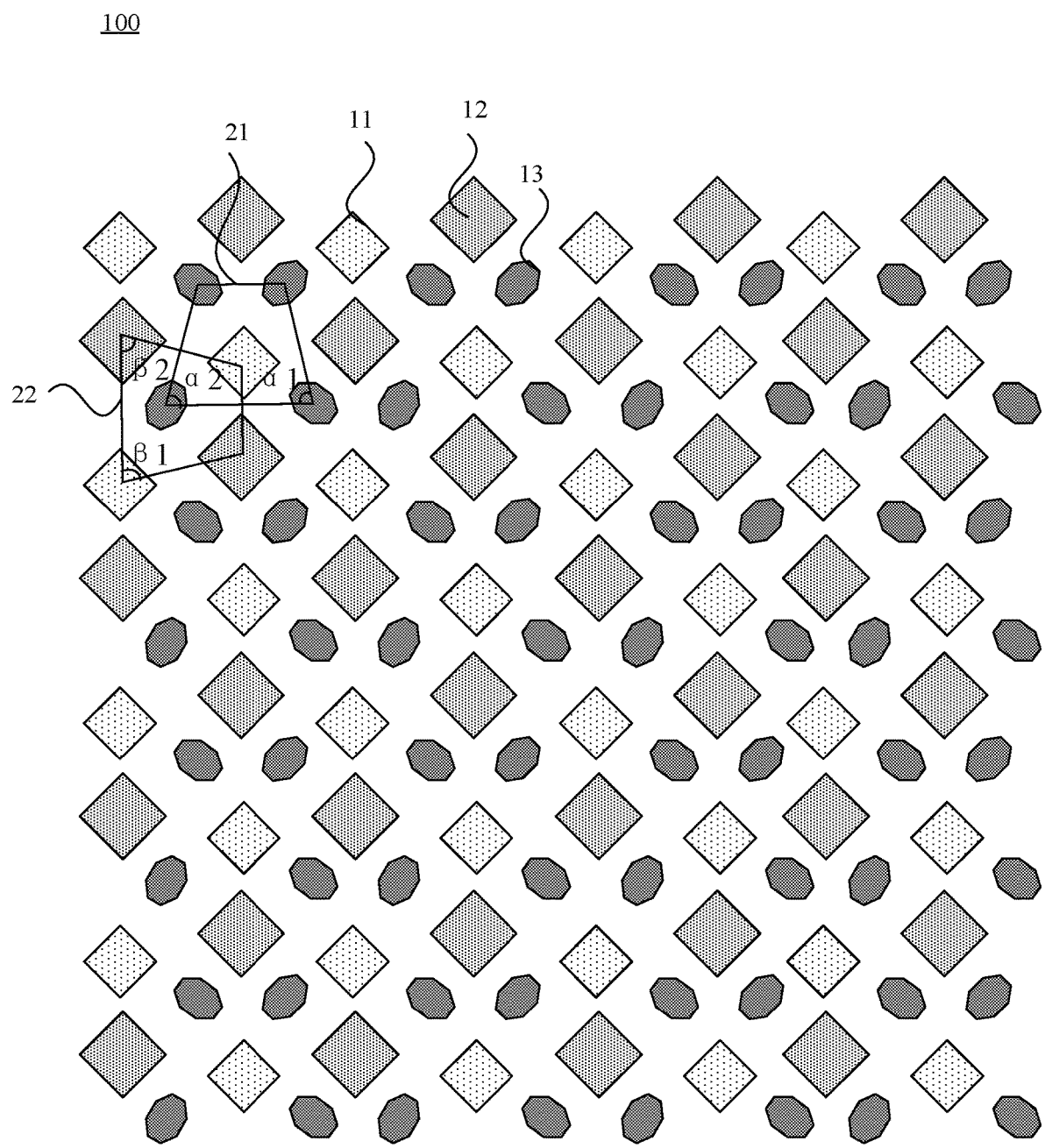
FIG. 10 is a structure diagram of another display panel according to an embodiment of the present application.

In an embodiment, Table 1 describes the color fringing effect in cases where the first included angle $\alpha 1$ of the first virtual trapezoid 21, the second included angle $\alpha 2$ of the first virtual trapezoid 21, the third included angle $\beta 1$ of the second virtual trapezoid 22, and the fourth included angle $\beta 2$ of the second virtual trapezoid 22 are the same and equal to 90°, 88°, 86°, 83°, 81°, and 76°. FIG. 6 shows the structure of the display panel in the case where the first included angle $\alpha 1$, the second included angle $\alpha 2$, the third included angle $\beta 1$, and the fourth included angle $\beta 2$ each are 88°. FIG. 7 shows the structure of the display panel in the case where the first included angle $\alpha 1$, the second included angle $\alpha 2$, the third included angle $\beta 1$, and the fourth included angle $\beta 2$ each are 86°. FIG. 8 shows the structure of the display panel in the case where the first included angle $\alpha 1$, the second included angle $\alpha 2$, the third included angle $\beta 1$, and the fourth included angle $\beta 2$ each are 83°. FIG. 9 shows the structure of the display panel in the case where the first included angle $\alpha 1$, the second included angle $\alpha 2$, the third included angle $\beta 1$, and the fourth included angle $\beta 2$ each are 81°. FIG. 10 shows the structure of the display panel in the case where the first included angle $\alpha 1$, the second included angle $\alpha 2$, the third included angle $\beta 1$, and the fourth included angle $\beta 2$ each are 76°.

It is to be noted that in the preceding examples, only the case where the first included angle $\alpha 1$, the second included angle $\alpha 2$, the third included angle $\beta 1$, and the fourth included angle $\beta 2$ are equal is used as an example. However, the present application is not limited to this. In other optional embodiments, it is also feasible that the first included angle $\alpha 1$ is equal to the second included angle $\alpha 2$, and the third included angle β1 is equal to the fourth included angle β2, but the first included angle α1 is greater than the third included angle β1.

TABLE 1

| Angle (α1 = α2 = β1 = β2) | Display effect | | | | |
|---|---|---|---|---|---|
| | Left side | Right side | Upper side | Lower side | Overall display |
| 90° | Serious magenta color fringing effect | Serious green color fringing effect | Serious magenta color fringing effect | Serious green color fringing effect | Color mixing and being on when being turned off of the RB sub-pixels do not exist |
| 88° | Relatively serious magenta color fringing effect | Relatively serious green color fringing effect | Relatively serious magenta color fringing effect | Relatively serious green color fringing effect | Color mixing and being on when being turned off of the RB sub-pixels do not exist |
| 86° | Slight magenta color fringing effect | Slight green color fringing effect | Slight magenta color fringing effect | Slight green color fringing effect | Color mixing and being on when being turned off of the RB sub-pixels do not exist |
| 83° | Slight magenta color fringing effect | Slight green color fringing effect with a broken-line shaped right edge | Slight magenta color fringing effect | Slight green color fringing effect | Color mixing and being on when being turned off of the RB sub-pixels exist |
| 81° | Slight magenta color fringing effect | Relatively serious green color fringing effect with a broken-line shaped right edge | Slight magenta color fringing effect | Slight green color fringing effect | Color mixing and being on when being turned off of the RB sub-pixels exist |
| 76° | Slight magenta color fringing effect | Relatively serious green color fringing effect with a serious broken-line shaped right edge | Slight magenta color fringing effect | Slight green color fringing effect | Serious color mixing and being on when being turned off of the RB sub-pixels exist |

Referring to FIGS. 1, 6, 7, 8, 9, and 10 and Table 1, in the case where the first included angle α1, the second included angle α2, the third included angle β1, and the fourth included angle β2 each are 90°, the magenta color fringing effect on the left side is serious, the green color fringing effect on the right side is serious, the magenta color fringing effect on the upper side is serious, and the green color fringing effect on the lower side is serious. For details, see the explanation of the preceding content, which will not be repeated herein.

In the case where the first included angle α1, the second included angle α2, the third included angle β1, and the fourth included angle β2 each are 88°, for the left edge, the offset angles of the third sub-pixels are relatively small, the distances from the first sub-pixels and the second sub-pixels at the left edge to the offset third sub-pixels are relatively large, the sharing effect of the three types of sub-pixels is not good, and the magenta color fringing effect on the left side is relatively serious; for the right edge, the offset angles of the third sub-pixels are relatively small, the offsets of two third sub-pixels in the column direction are rather small, and the green color fringing effect is relatively serious; for the upper edge, the offsets of the first sub-pixels and the second sub-pixels in the row direction are relatively small, part of the first sub-pixels and the second sub-pixels are shared, and the magenta color fringing effect is relatively serious; for the lower edge, the distances between two third sub-pixels and the first sub-pixels are relatively large due to the relatively small offsets of the first sub-pixels, the sharing effect of the two third sub-pixels and the first sub-pixels is poor, and the green color fringing effect on the lower side is relatively serious. It can be seen that in the case where the angles of the two trapezoids each are 88°, the color fringing displayed on the side is not improved well.

In the case where the first included angle α1, the second included angle α2, the third included angle β1, and the fourth included angle β2 each are 86°, for the left edge, the offset angles of the third sub-pixels are moderate, the distances between the first sub-pixels and the second sub-pixels at the left edge and the offset third sub-pixels are moderate, the sharing effect of the three types of sub-pixels is apparent, and the magenta color fringing effect on the left side is slight; for the right edge, the third sub-pixels in odd rows are offset toward the inside, the centers of gravity of two third sub-pixels are inward, the number of third sub-pixels in the green color fringe is reduced, and at the same time, the first sub-pixels are offset downward and closer to the third sub-pixels in even rows, the green color fringing effect is slight, and at the same time, due to the moderate offsets of two third sub-pixels in the column direction, the right edge appears as a basically straight edge, and no jaggedness deformation occurs; for the upper edge, the offsets of the first sub-pixels and the second sub-pixels in the row direction are moderate, the first sub-pixels are offset downward and closer to the third sub-pixels, compared with the case where the centers of the first sub-pixels and the second sub-pixels are located on the same straight line and the centers of the third sub-pixels are located on another straight line in the "diamond" arrangement, in the case where the included angles each are 86°, the centers of gravity of the first sub-pixels are closer to the third sub-pixels, the centers of gravity of the three colors of sub-pixels are more evenly distributed, and the magenta color fringing effect on the upper side is weakened; for the lower edge, the first sub-pixels are offset downward and closer to the edges of the third sub-pixels, the first sub-pixels and the second sub-pixels are shared, and the green color fringing effect on the lower side is slight. At the same time, from the overall effect, since the angles of the two trapezoids are 86°, the distances between the first sub-pixels and the second sub-pixels are moderate, and the problem of color mixing and being on when being turned off of the first sub-pixels and the second sub-pixels does not exist. It can be seen that in the case where the angles of the two trapezoids are 86°, the overall display and the display on the four sides are better.

In the case where the first included angle α1, the second included angle α2, the third included angle β1, and the fourth included angle β2 each are 83°, for the left edge, the offset angles of the third sub-pixels are moderate, the distances between the first sub-pixels and the second sub-pixels at the left edge and the offset third sub-pixels are moderate, the sharing effect of the three types of sub-pixels is apparent, and the magenta color fringing effect on the left side is slight; for the right edge, two third sub-pixels are offset in the column direction, the number of third sub-pixels in the green color fringe is reduced, and the green color fringing effect is slight, however, since the offsets of the two third sub-pixels in the column direction become larger, the right edge appears as a broken-line shape, and the jaggedness deformation occurs at the edge; for the upper edge, the offsets of the first sub-pixels and the second sub-pixels in the row direction are moderate, the distances between the first sub-pixels and the second sub-pixels become larger, and the magenta color fringing effect is slight; for the lower edge, since the offsets of the first sub-pixels are moderate, the distance between one of the two third sub-pixels and the first sub-pixels is close to the distance between the other one of the two third sub-pixels and the first sub-pixels, the sharing effect of the two third sub-pixels and the first sub-pixels is apparent, and the green color fringing effect on the lower side is slight. At the same time, from the overall effect, since the included angles of the two trapezoids are 83°, the included angles of the two trapezoids become smaller, the short sides corresponding to the trapezoids become shorter, the distances between the first sub-pixels and the second sub-pixels are relatively close, the problem of color mixing and being on when being turned off of the first sub-pixels and the second sub-pixels exists, and the overall display effect is not good. It can be seen that in the case where the included angles of the two trapezoids are 83°, the display effects at the left edge, the upper edge, and the lower edge are better, but the display effect at the right edge and the overall display effect are relatively poor.

In the case where the first included angle $\alpha 1$, the second included angle $\alpha 2$, the third included angle $\beta 1$, and the fourth included angle $\beta 2$ each are 81°, for the left edge, the offset angles of the third sub-pixels are moderate, the distances between the first sub-pixels and the second sub-pixels at the left edge and the offset third sub-pixels are moderate, the sharing effect of the three types of sub-pixels is apparent, and the magenta color fringing effect on the left side is slight; for the right edge, two third sub-pixels are offset in the column direction, the number of third sub-pixels in the green color fringe is reduced, and the green color fringing effect is slight, however, since the offsets of the two third sub-pixels in the column direction become larger, the right edge appears as a broken-line shape, and the jaggedness deformation occurs at the edge; for the upper edge, the offsets of the first sub-pixels and the second sub-pixels in the row direction are moderate, the distances between the first sub-pixels and the second sub-pixels become larger, and the magenta color fringing effect is slight; for the lower edge, since the offsets of the second sub-pixels are moderate, the distance between one of the two third sub-pixels and the second sub-pixels is close to the distance between the other one of the two third sub-pixels and the second sub-pixels, the sharing effect of the two third sub-pixels and the second sub-pixels is apparent, and the green color fringing effect on the lower side is slight. At the same time, from the overall effect, since the included angles of the two trapezoids each are 81°, the included angles of the two trapezoids become smaller, the short sides corresponding to the trapezoids become shorter, the distances between the first sub-pixels and the second sub-pixels are close, the problem of color mixing and being on when being turned off of the first sub-pixels and the second sub-pixels exists, and the overall display effect is not good. It can be seen that in the case where the included angles of the two trapezoids each are 81°, the display effects at the left edge, the upper edge, and the lower edge are better, but the display effect at the right edge and the overall display effect are worse.

In the case where the first included angle $\alpha 1$, the second included angle $\alpha 2$, the third included angle $\beta 1$, and the fourth included angle $\beta 2$ each are 76°, for the left edge, the offset angles of the third sub-pixels are moderate, the distances between the first sub-pixels and the second sub-pixels at the left edge and the offset third sub-pixels are moderate, the sharing effect of the three types of sub-pixels is apparent, and the magenta color fringing effect on the left side is slight; for the right edge, two third sub-pixels are offset in the column direction, the number of third sub-pixels in the green color fringe is reduced, and the green color fringing effect is slight, however, since the offsets of the two third sub-pixels in the column direction become larger, the right edge appears as an apparent broken-line shape, and the serious jaggedness deformation occurs at the edge; for the upper edge, the offsets of the first sub-pixels and the second sub-pixels in the row direction are moderate, the distances between the first sub-pixels and the second sub-pixels become larger, and the magenta color fringing effect is slight; for the lower edge, since the offsets of the second sub-pixels are moderate, the distance between one of the two third sub-pixels and the second sub-pixels is close to the distance between the other one of the two third sub-pixels and the second sub-pixels, the sharing effect of the two third sub-pixels and the second sub-pixels is apparent, and the green color fringing effect on the lower side is slight. At the same time, from the overall effect, since the included angles of the two trapezoids each are 76°, the included angles of the two trapezoids become smaller, the short sides corresponding to the trapezoids become shorter, the distances between the first sub-pixels and the second sub-pixels are rather close, the problem of serious color mixing and being on when being turned off of the first sub-pixels and the second sub-pixels exists, and the overall display effect is not good. It can be seen that in the case where the included angles of the two trapezoids are 76°, the display effects at the left edge, the upper edge, and the lower edge are better, but the display effect at the right edge and the overall display effect are rather poor.

To sum up, in the case where the first included angle $\alpha 1$, the second included angle $\alpha 2$, the third included angle $\beta 1$, and the fourth included angle $\beta 2$ each are 90°, a serious color fringing effect exists on the side, and the display effect on the side is rather poor; in the case where the first included angle $\alpha 1$, the second included angle $\alpha 2$, the third included angle $\beta 1$, and the fourth included angle $\beta 2$ each are 86°, the color fringing effect on the side is weakened, and the overall display effect is better; in the case where the first included angle $\alpha 1$, the second included angle $\alpha 2$, the third included angle $\beta 1$, and the fourth included angle $\beta 2$ each are 83°, part of the side effect is weakened, and the display effect on the right side and the overall display effect is relatively poor, which brings a new problem, that is, the edge appears as a jagged shape and color mixing or being on when being turned off between sub-pixels exists; in the case where the first included angle $\alpha 1$, the second included angle $\alpha 2$, the third included angle $\beta 1$, and the fourth included angle $\beta 2$ each are 81°, part of the side effect is weakened, and the display effect on the right side and the overall display effect are worse; in the case where the first included angle $\alpha 1$, the second included angle $\alpha 2$, the third included angle $\beta 1$, and the fourth included angle $\beta 2$ each are 76°, part of the side effect is weakened, and the display effect on the right side and the overall display effect is rather poor. It can be seen that in the case where the first included angle $\alpha 1$, the second included angle $\alpha 2$, the third included angle $\beta 1$, and the fourth included angle β2 each are 86°, the overall display effect and the display effect on the side are both good.

It is to be noted that in the preceding examples, the color fringing effect is described only according to the structures of the display panels shown in FIGS. 1 to 10, that is, the upper, the lower, the left, and the right mentioned in the preceding content are only for the display panels shown in FIGS. 1 to 10 and do not represent the upper, the lower, the left, and the right of the actual display panel.

It is to be noted that in the preceding examples, only the case where the first sub-pixels 11 are the red sub-pixels, the second sub-pixels 12 are the blue sub-pixels, and the third sub-pixels 13 are the green sub-pixels is used as an example, which does not constitute a limitation to the present application. In other optional embodiments, the light-emitting colors of the first sub-pixels 11, the second sub-pixels 12, and the third sub-pixels 13 may also change, that is, the light-emitting colors of the first sub-pixels 11, the second sub-pixels 12, and the third sub-pixels 13 are different. In an embodiment, the first sub-pixels 11, the second sub-pixels 12, and the third sub-pixels 13 are a respective one of a red sub-pixel, a blue sub-pixel, or a green sub-pixel and are different from each other. In an embodiment, the first sub-pixels 11 may be the blue sub-pixels, the second sub-pixels 12 may be the red sub-pixels, and the third sub-pixels 13 may be the green sub-pixels.

In an embodiment, the first virtual trapezoid 21 and the second virtual trapezoid 22 may be, for example, an isosceles trapezoid or a right trapezoid.

It is to be noted that in FIGS. 2 to 10, only the case where the shapes of the first sub-pixels 11 and the second sub-pixels 12 are squares and the shapes of the third sub-pixels 13 are octagons is used as an example for an exemplary description, but the shapes of the first sub-pixels 11, the second sub-pixels 12, and the third sub-pixels 13 are not specifically limited in the embodiments of the present application. Boundaries of the square and the octagon represent opening boundaries of sub-pixels corresponding to the square and the octagon. The case where the display panel is an organic light-emitting display panel is used as an example, and the boundaries of the square and the octagon are effective opening boundaries of sub-pixels of a pixel definition layer (PDL layer) and represent effective light-emitting areas (opening areas) of light-emitting layers of the sub-pixels.

A wireframe around the first sub-pixel 11 represents a virtual side 111 of the first sub-pixel 11, a wireframe around the second sub-pixel 12 represents a virtual side 121 of the second sub-pixel 12, and a wireframe around the third sub-pixel 13 represents a virtual side 131 of the third sub-pixel 13. The virtual side refers to an outer boundary of the sub-pixel in a case of blocking by the mask and does not really exist. In an embodiment, with continued reference to FIG. 2, in a pixel unit 10, the virtual side 111 of the first sub-pixel 11 and the virtual side 121 of the second sub-pixel 12 corresponding to the short side of the second virtual trapezoid 22 intersect and are connected to the virtual side 111 of the first sub-pixel 11 and the virtual side 121 of the second sub-pixel 12 corresponding to the long side of the second virtual trapezoid 22. In this manner, the arrangement of the first sub-pixels 11, the second sub-pixels 12, and the third sub-pixels 13 is more compact, thereby avoiding waste of space.

Figure 11:
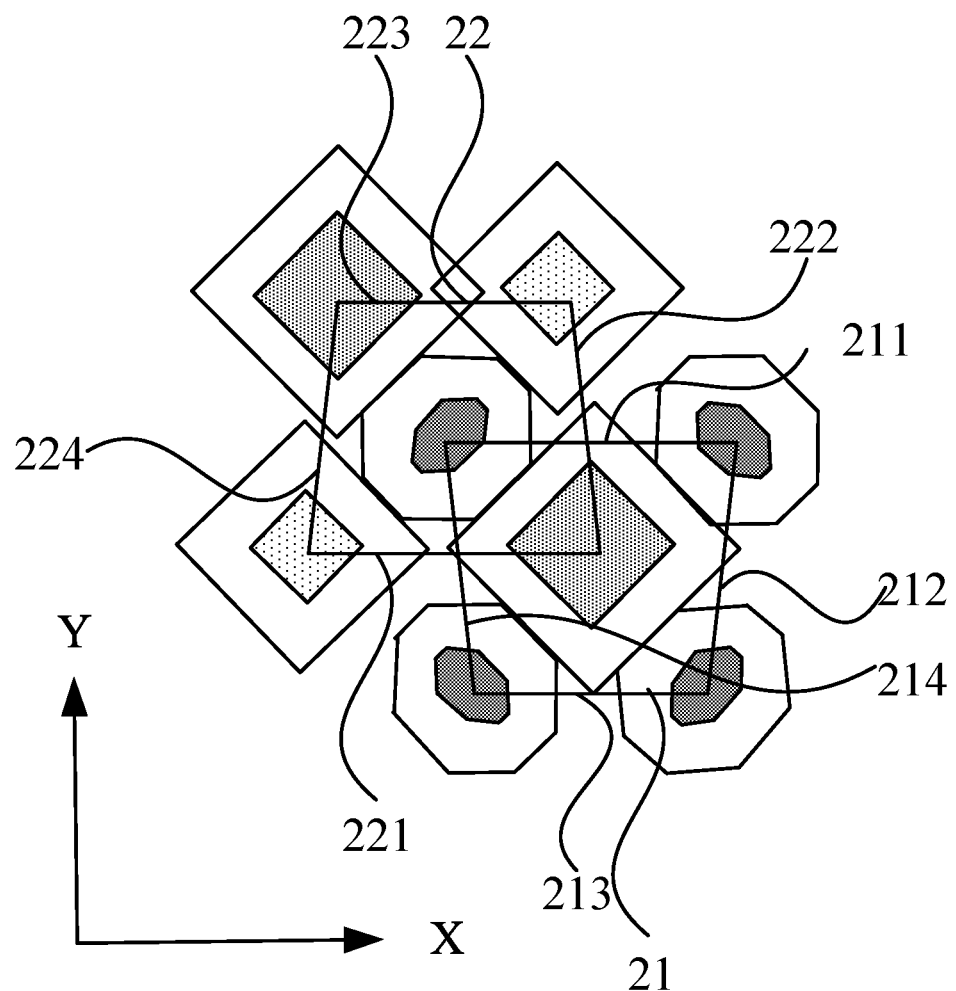
FIG. 11 is a partial structure diagram of a display panel according to an embodiment of the present application.

It is to be further noted that FIG. 2 only shows one pixel arrangement structure, that is, the first long side 211 and the first short side 213 of the first virtual trapezoid 21 extend in an X direction and the second long side 221 and the second short side 223 of the second virtual trapezoid 22 extend in a Y direction, which does not constitute a limitation to the present application. For example, it is also feasible that the first long side 211 and the first short side 213 of the first virtual trapezoid 21 extend in the X direction, and the second long side 221 and the second short side 223 of the second virtual trapezoid 22 extend in the X direction (as shown in FIG. 11).

It is to be further noted that the center of the sub-pixel (the center of the first sub-pixel 11, the center of the second sub-pixel 12, and the center of the third sub-pixel 13) refers to a geometric center of a light-emitting region of the sub-pixel, that is, the center of the light-emitting layer of the sub-pixel, and is specifically determined according to the shape of the sub-pixel. In this embodiment, the case where the shapes of the first sub-pixels 11 and the second sub-pixels 12 are squares and the shapes of the third sub-pixels 13 are octagons is used as an example for an exemplary description.

In an embodiment, the first included angle α1 is equal to the second included angle α2, and the third included angle β1 is equal to the fourth included angle β2. That is, the first virtual trapezoid 21 is an isosceles trapezoid, and the second virtual trapezoid 22 is also an isosceles trapezoid. In this manner, the pixel arrangement is more uniform and compact, and the display effect of the display panel is ensured.

In an embodiment, the first included angle α1 is equal to the third included angle β1, that is, the angles of the first virtual trapezoid 21 and the second virtual trapezoid 22 are the same, which further makes the pixel arrangement more uniform and compact, and ensures the display effect of the display panel. In an embodiment, the first included angle α1 is 86°, the second included angle α2 is 86°, the third included angle β1 is 86°, and the fourth included angle β2 is 86°.

In an embodiment, the first included angle α1 is greater than the third included angle β1. In this manner, it can be ensured that the opening of the third sub-pixel 13 is relatively large and the display effect is better. In an embodiment, the first included angle α1 is 86°, the second included angle α2 is 86°, the third included angle β1 is 83°, and the fourth included angle β2 is 83°; In an embodiment, the first included angle α1 is 88°, the second included angle α2 is 88°, the third included angle β1 is 86°, and the fourth included angle β2 is 86°.

In an embodiment, the light-emitting areas of the third sub-pixels 13 are equal.

As shown in FIG. 1, four third sub-pixels 13 surround one first sub-pixel 11, and/or four third sub-pixels 13 surround one second sub-pixel 12 so that in the case where setting regions of the third sub-pixels 13 are determined, setting regions of the first sub-pixels 11 and setting regions of the second sub-pixels 12 can be determined. In this embodiment, the light-emitting areas of the third sub-pixels 13 are equal so that the difficulty of design and preparation process can be reduced.

In an embodiment, with continued reference to FIGS. 2 and 3, the center of the third sub-pixel 13 and a point of intersection T1 of two diagonals of the second virtual trapezoid 22 do not overlap, that is, the center of the third sub-pixel 13 is offset relative to the point of intersection T1 of the two diagonals of the second virtual trapezoid 22 and does not intersect with the point of intersection T1 of the two diagonals of the second virtual trapezoid 22.

This is since it is considered that the centers of two first sub-pixels 11 and two second sub-pixels 12 surrounding the third sub-pixel 13 form the second virtual trapezoid 22 so that the region surrounded by the centers of the two first sub-pixels 11 and the two second sub-pixels 12 becomes larger. Therefore, the center of the third sub-pixel 13 and the point of intersection T1 of the two diagonals of the second virtual trapezoid 22 do not overlap. In this manner, it can be ensured that the pixel opening of the third sub-pixel 13 is relatively large, and the distances between the third sub-pixel 13 and sub-pixels surrounding the third sub-pixel 13 are relatively small, and thus the display effect of the display panel is improved.

In an embodiment, with continued reference to FIGS. 2 and 3, the distance L between the center of the third sub-pixel 13 and the point of intersection T1 of the two diagonals of the second virtual trapezoid 22 satisfies 1 μm≤L≤5 μm. In an embodiment, the distance L between the center of the third sub-pixel 13 and the point of intersection T1 of the two diagonals of the second virtual trapezoid 22 is 1 μm, 2 μm, 3 μm, 3.5 μm, 3.8 μm, 4 μm, 5 μm, and so on.

In an embodiment, the distances between the centers of the two first sub-pixels 11 and the two second sub-pixels 12 surrounding the third sub-pixel 13 and the center of the third sub-pixel 13 are respectively a first distance L1, a second distance L2, a third distance L3, and a fourth distance L4, where the first distance L1, the second distance L2, the third distance L3, and the fourth distance L4 are not equal, so as to ensure that the display panel has a better display effect.

Figure 12:
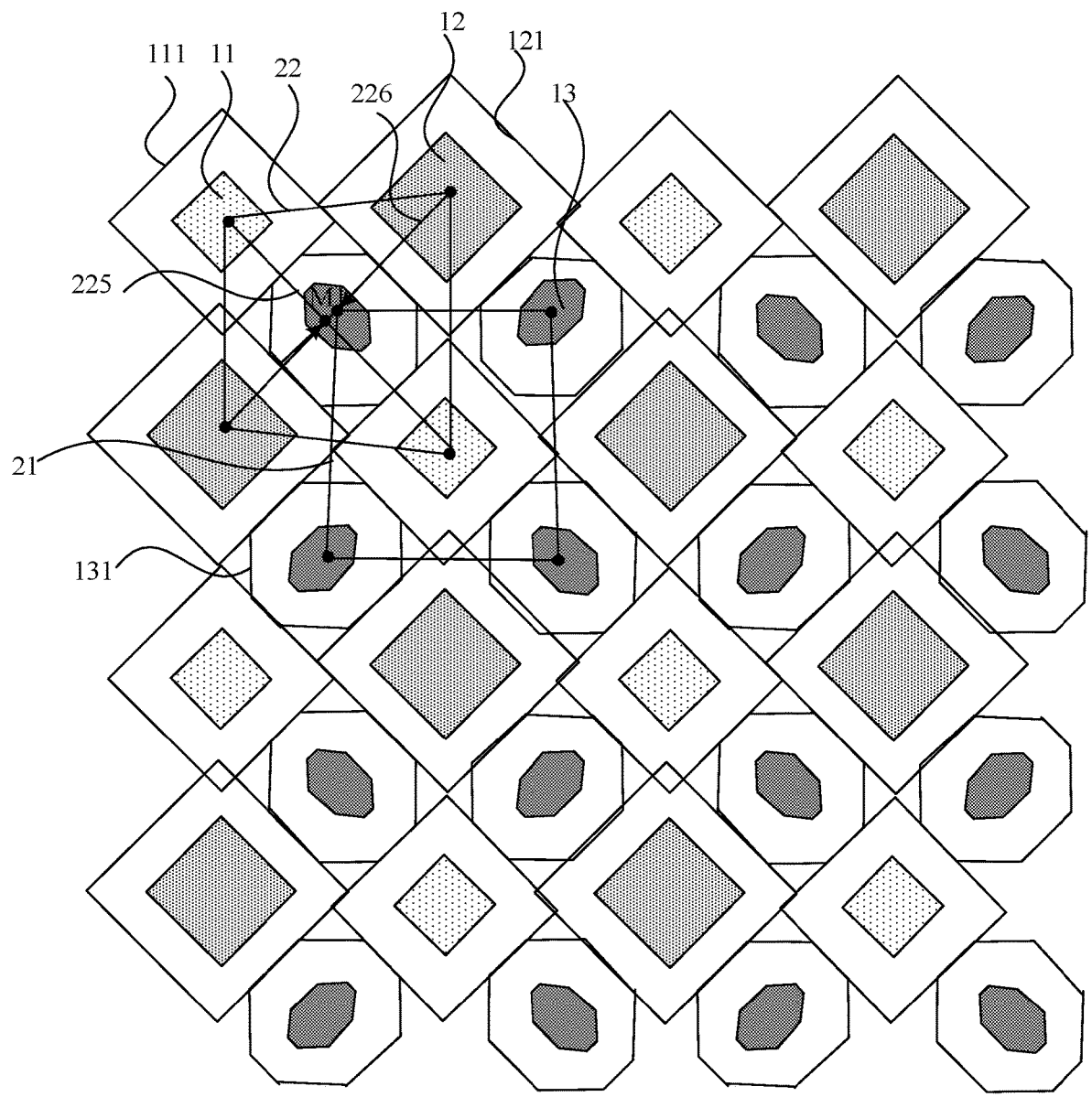
FIG. 12 is a partial structure diagram of another display panel according to an embodiment of the present application.

In an embodiment, FIG. 12 is a partial structure diagram of another display panel according to an embodiment of the present application. As shown in FIG. 12, the second virtual trapezoid 22 includes a first diagonal 225 and a second diagonal 226; two end points of the first diagonal 225 respectively coincide with centers of two first sub-pixels 11 adjacent to the same third sub-pixel 13; two end points of the second diagonal 226 respectively coincide with centers of two second sub-pixels 12 adjacent to the same third sub-pixel 13, where a distance M1 between the center of the third sub-pixel 13 and the first diagonal 225 satisfies 0.5 μm≤M1≤3.5 μm.

Generally, the structure of an OLED display device mainly includes multiple light-emitting sub-pixels such as red sub-pixels, blue sub-pixels, and green sub-pixels. Each light-emitting pixel includes an anode, a hole injection layer, a hole transport layer, a light-emitting layer, an electron transport layer, an electron injection layer, and a cathode. In the case where a driving voltage is supplied to the anode and the cathode, the holes in the anode move toward the light-emitting layer through the hole injection layer and the hole transport layer, and the electrons in the cathode move toward the light-emitting layer through the electron injection layer and the electron transport layer. In this manner, the holes and the electrons are recombined in the light-emitting layer so that photons are emitted and thus pixel light emission is achieved.

The hole injection layer, the hole transport layer, the light-emitting layer, the electron transport layer, and the electron injection layer each are formed by evaporation of an entire mask and cover an entire pixel region. In the case where a certain light-emitting pixel is controlled to emit light, the holes flow from the anode to the cathode, and at the same time, a lateral leakage flow is generated and reaches the adjacent light-emitting pixel through the hole transport layer and the hole injection layer, thereby causing light-emitting pixels of other colors to be on when being turned off. For the problem of being on when being turned off between sub-pixels of different colors, a turn-on voltage of the sub-pixel is mainly used as a standard. The larger the turn-on voltage of the sub-pixel corresponding to a pure color image is, the easier it is to supply holes to a sub-pixel with a small turn-on voltage. Therefore, the sub-pixel with a small turn-on voltage has the problem of being on when being turned off. For the preceding sub-pixels of three colors, the turn-on voltage of the blue sub-pixel is the largest, the turn-on voltage of the green sub-pixel is relatively large, and the turn-on voltage of the red sub-pixel is the smallest. Therefore, when a green pure color image is lit, the red sub-pixel is prone to the leakage flow. At the same time, to reduce the lateral leakage flows between adjacent sub-pixels of different colors during the display of the pure color image and to reduce the risk of being on when being turned off of the sub-pixels, generally, a magnitude of an opposite surface between two adjacent sub-pixels of different colors is reduced or a distance between two adjacent sub-pixels of different colors is increased. The magnitude of the opposite surface refers to a right overlapping length of two adjacent sides of two adjacent sub-pixels of different colors.

In an embodiment, the first sub-pixels 11 are red sub-pixels, the second sub-pixels 12 are blue sub-pixels, and the third sub-pixels 13 are green sub-pixels. As shown in FIG. 12, the distance between the center of the third sub-pixel 13 and the first diagonal 225 is M1; compared with the case where the center of the third sub-pixel is located at a point of intersection of the first diagonal 225 and the second diagonal 226, magnitudes of opposite surfaces between the third sub-pixel 13 and the first sub-pixels 11 are reduced and distances between the third sub-pixel and two adjacent first sub-pixels are increased so that the lateral leakage flows between the third sub-pixel 13 and the two first sub-pixels 11 can be reduced and thus the risk of being on when being turned off between the third sub-pixel 13 and the first sub-pixels 11 can be reduced.

It is to be noted that the distance M1 between the center of the third sub-pixel 13 and the first diagonal is a fixed distance, and the distance is, for example, in the range of 0.5 μm to 3.5 μm such as 0.5 μm, 1 μm, 1.5 μm, 2 μm, 2.7 μm, 3 μm, 3.5 μm, etc. so that the leakage flows between sub-pixels can be reduced and thus the problem being on when turned off of sub-pixels can be avoided.

In an embodiment, with continued reference to FIG. 12, the center of the third sub-pixel 13 and the second diagonal 226 overlap. During the product verification process, magnitudes of opposite surfaces between the third sub-pixel 13 and two second sub-pixels 12 corresponding to the second virtual trapezoid 22 may be kept basically unchanged, and magnitudes of opposite surfaces between the third sub-pixel 13 and two first sub-pixels 11 may be reduced so that the lateral leakage flows of the first sub-pixels 11 can be reduced. The advantage of this arrangement is that the problem of being on when sub-pixels are turned off can be avoided, and the third sub-pixels 13 can be better distributed in a region surrounded by two first sub-pixels 11 and two second sub-pixels 12, so as to ensure a better display effect of the display panel.

Figure 13:
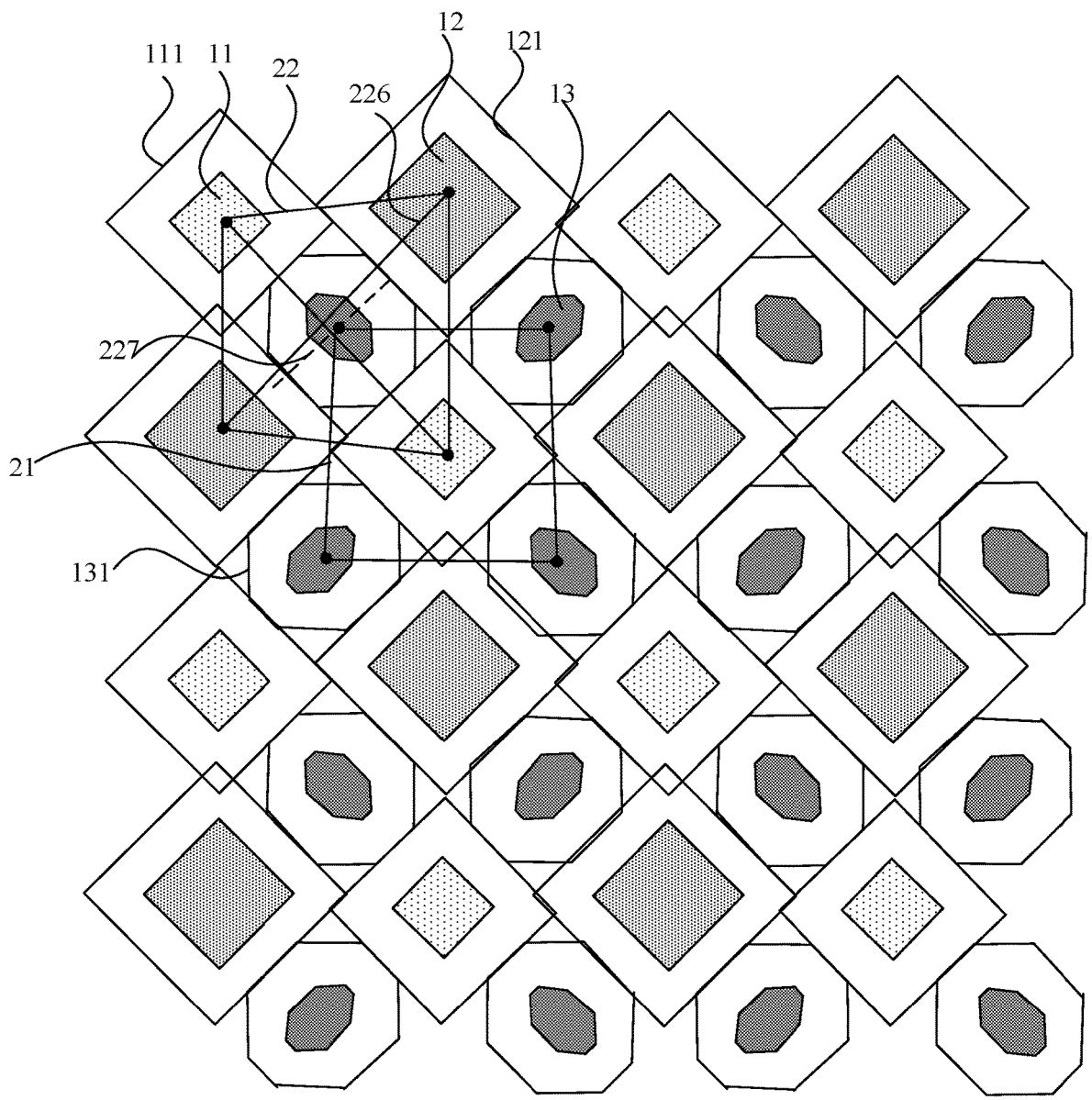
FIG. 13 is a partial structure diagram of another display panel according to an embodiment of the present application.

In an embodiment, FIG. 13 is a partial structure diagram of another display panel according to an embodiment of the present application. As shown in FIG. 13, the second virtual trapezoid 22 includes the first diagonal 225 and the second diagonal 226; two end points of the first diagonal 225 respectively coincide with centers of two first sub-pixels 11 adjacent to the same third sub-pixel 13; two end points of the second diagonal 226 respectively coincide with centers of two second sub-pixels 12 adjacent to the same third sub-pixel 13; the center of the third sub-pixel 13 and a mi perpendicular of the first diagonal 225 overlap. The advantage of this arrangement is that the problem of being on when sub-pixels are turned off can be avoided, distances between the third sub-pixel 13 and two adjacent first sub-pixels 11 are the same, and the improvement degrees of the lateral leakage flows of two adjacent first sub-pixels 11 are similar so that the improvement effects of the lateral leakage flows of the first sub-pixels 11 in the second virtual trapezoid 22 are better.

In an embodiment, distances between the center of the third sub-pixel 13 and the centers of two first sub-pixels 11 corresponding to the first diagonal 225 are equal. In this manner, the following problem can be avoided: the distances between the center of the third sub-pixel 13 and the centers of the two first sub-pixels 11 corresponding to the first diagonal 225 are not equal and thus a poor display effect is caused. Therefore, it is ensured that the display panel has a better display effect.

Figure 14:
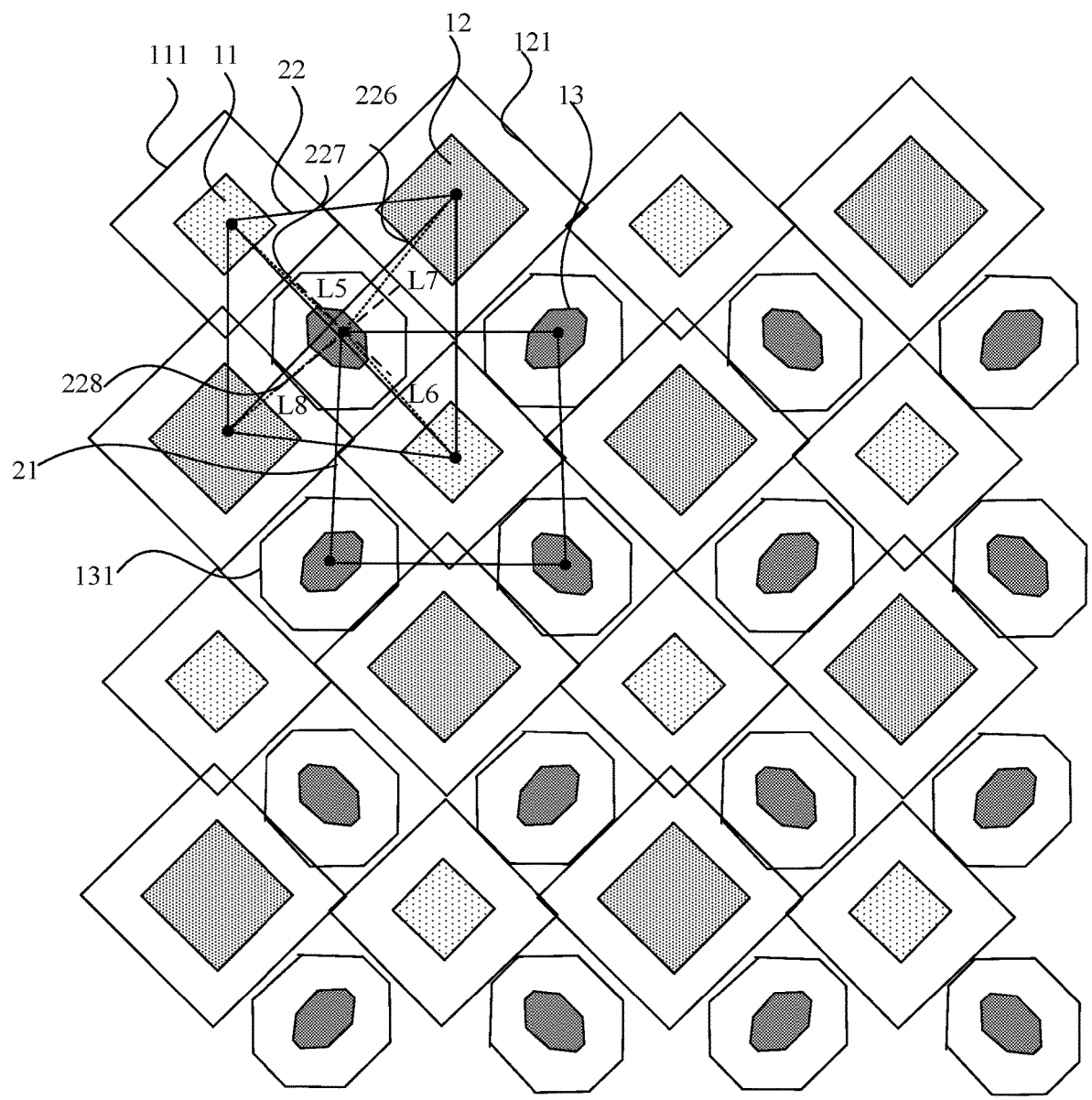
FIG. 14 is a partial structure diagram of another display panel according to an embodiment of the present application.

In an embodiment, FIG. 14 is a partial structure diagram of a display panel according to an embodiment of the present application. As shown in FIG. 14, a mid-perpendicular corresponding to the first diagonal 225 is a first mid-perpendicular 228, and a mid-perpendicular corresponding to the second diagonal 226 is a second mid-perpendicular 227; the center of the third sub-pixel 13 and a point of intersection of the first mid-perpendicular 228 and the second mid-perpendicular 227 overlap. That is, the center of the third sub-pixel 13 is offset relative to the point of intersection of the two diagonals (the first diagonal 225 and the second diagonal 226) of the second virtual trapezoid 22 that is, the center of the third sub-pixel 13 and the point of intersection of the two mid-perpendiculars (the first mid-perpendicular 228 and the second mid-perpendicular 227) overlap. Since the center of the third sub-pixel 13 is located at a center of gravity of the region surrounded by two first sub-pixels 11 and two second sub-pixels 12, it can be ensured that the display panel has a better display effect.

In an embodiment, with continued reference to FIG. 14, the distances between the centers of the two first sub-pixels 11 and the two second sub-pixels 12 surrounding the third sub-pixel 13 and the center of the third sub-pixel 13 are respectively a fifth distance L5, a sixth distance L6, a seventh distance L7, and an eighth distance L8, where the fifth distance L5, the sixth distance L6, the seventh distance L7, and the eighth distance L8 are equal, so as to ensure that the display panel has a better display effect.

It can be seen from the preceding embodiments that the center of the third sub-pixel 13 is offset in the following three manners: in a first manner, the center of the third sub-pixel 13 is offset relative to the point of intersection T1 of two diagonals of the second virtual trapezoid 22; in a second manner, the center of the third sub-pixel 13 is offset relative to the mid-perpendicular of the second diagonal of the second virtual trapezoid 22; in a third manner, the center of the third sub-pixel 13 is offset relative to the point of intersection of two diagonals of the second virtual trapezoid 22 and coincides with the point of intersection of two corresponding mid-perpendiculars. Through the preceding three manners of offset, it can be ensured that the display panel has a better display effect.

Figure 15:
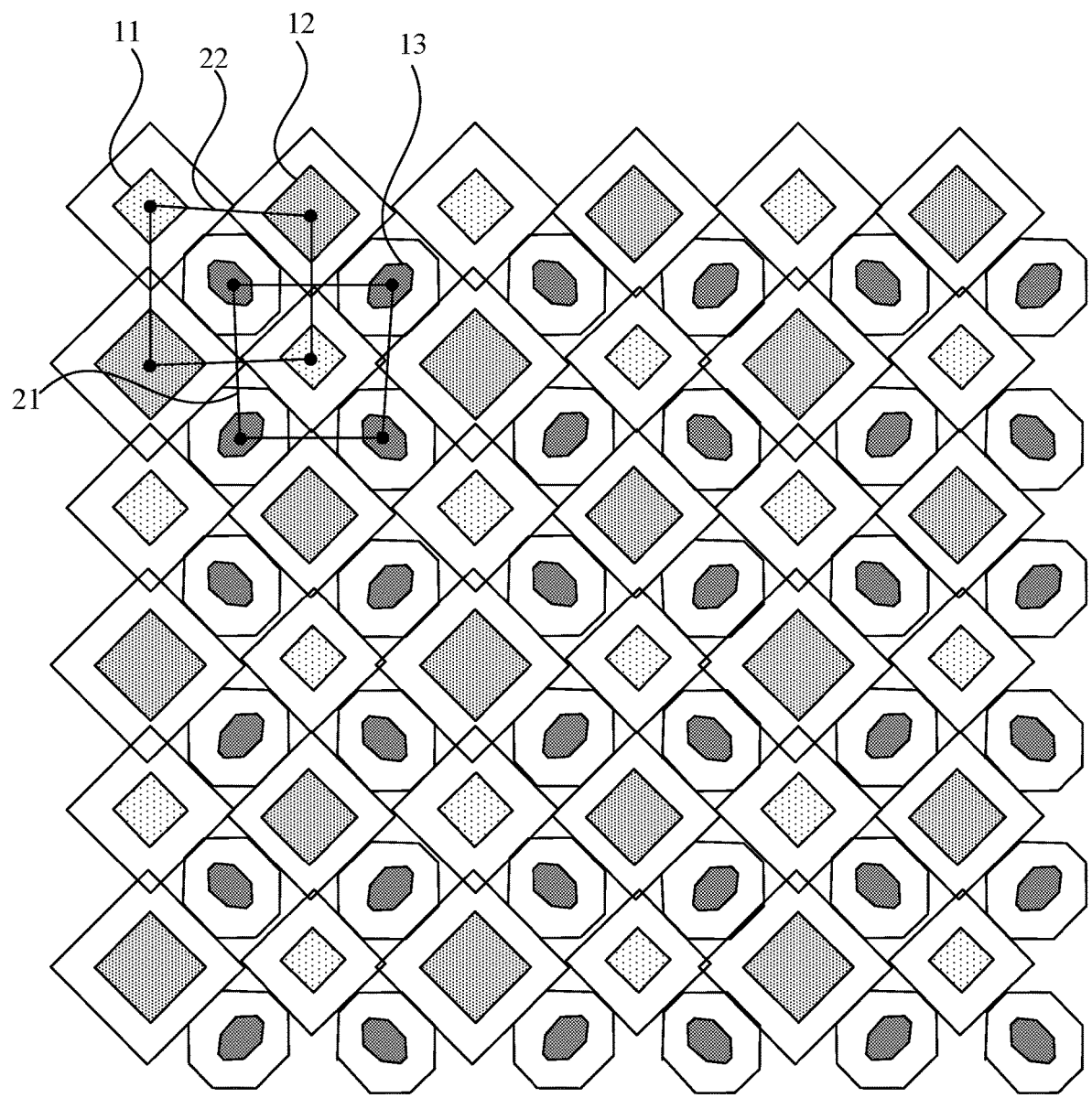
FIG. 15 is a structure diagram of another display panel according to an embodiment of the present application.

In an embodiment, FIG. 15 is a structure diagram of another display panel according to an embodiment of the present application. As shown in FIG. 15, light-emitting areas of two first sub-pixels 11 adjacent to the same third sub-pixel 13 are different; light-emitting areas of two second sub-pixels 12 adjacent to the same third sub-pixel 13 are different. That is, the light-emitting area of the first sub-pixel 11 corresponding to the second long side of the second virtual trapezoid is different from the light-emitting area of the first sub-pixel 11 corresponding to the second short side of the second virtual trapezoid, and the light-emitting area of the second sub-pixel 12 corresponding to the second long side of the second virtual trapezoid is different from the light-emitting area of the second sub-pixel 12 corresponding to the second short side of the second virtual trapezoid 22. In this manner, it can be ensured that the arrangement of the sub-pixels is compact, and the display effect of the display panel is improved.

Figure 16:
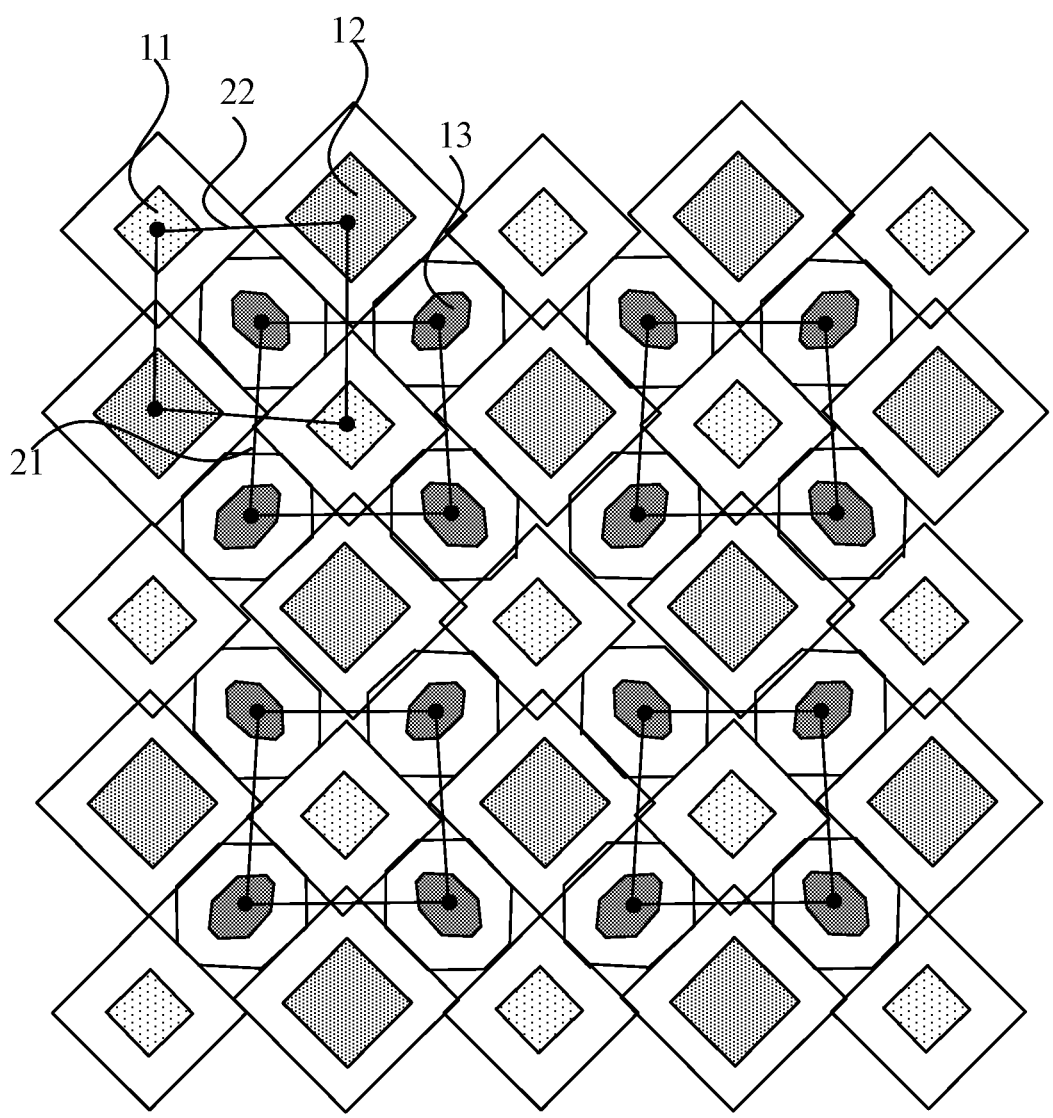
FIG. 16 is a structure diagram of another display panel according to an embodiment of the present application.
Figure 17:
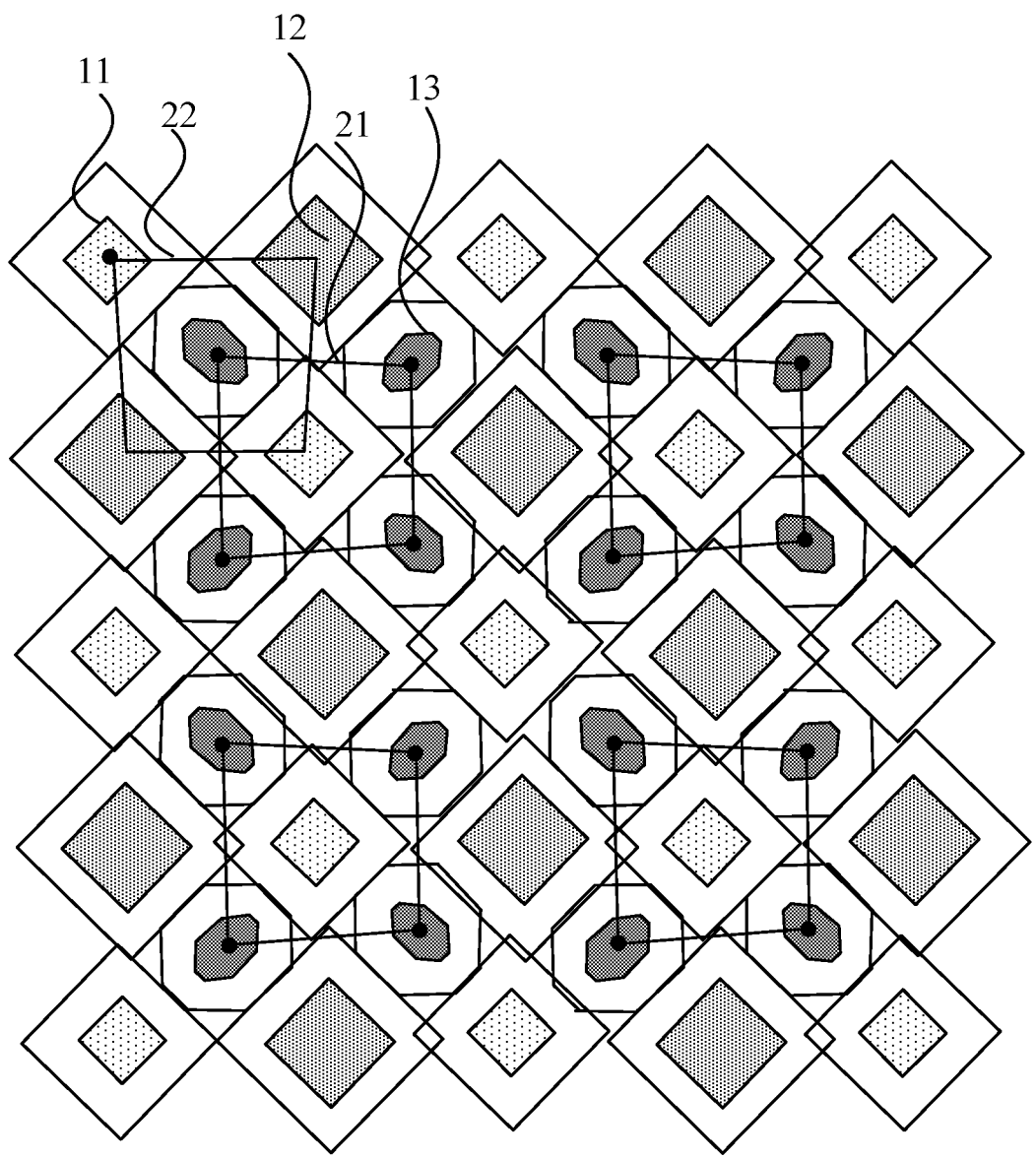
FIG. 17 is a structure diagram of another display panel according to an embodiment of the present application.

In an embodiment, FIG. 16 is a structure diagram of another display panel according to an embodiment of the present application. As shown in FIG. 16, among four third sub-pixels 13 surrounding the first sub-pixel 11, light-emitting areas of the third sub-pixels 13 arranged in the first direction are the same, and light-emitting areas of the third sub-pixels 13 arranged in the second direction are different, where the first direction is the row direction, and the second direction is the column direction. Alternatively, FIG. 17 is a structure diagram of another display panel according to an embodiment of the present application. As shown in FIG. 17, among four third sub-pixels 13 surrounding the first sub-pixel 11, light-emitting areas of the third sub-pixels 13 arranged in the first direction are the same, and light-emitting areas of the third sub-pixels 13 arranged in the second direction are different, where the first direction is the column direction, and the second direction is the row direction.

In one pixel unit 10, the distance between two third sub-pixels 13 corresponding to the first long side of the first virtual trapezoid 21 and the distance between two third sub-pixels 13 corresponding to the first short side of the first virtual trapezoid 21 are different. Therefore, light-emitting areas of the two third sub-pixels 13 corresponding to the first long side of the first virtual trapezoid 21 and the light-emitting areas of the two third sub-pixels 13 corresponding to the first short side of the first virtual trapezoid 21 are different so that even if the distance between the two third sub-pixels 13 corresponding to the first long side of the first virtual trapezoid 21 and the distance between the two third sub-pixels 13 corresponding to the first short side of the first virtual trapezoid 21 are different, a better display effect can still be ensured.

In an embodiment, with continued reference to FIG. 16 or 17, the light-emitting areas of the two third sub-pixels 13 corresponding to the first long side of the first virtual trapezoid 21 are greater than the light-emitting areas of the two third sub-pixels 13 corresponding to the first short side of the first virtual trapezoid 21.

In this embodiment, the light-emitting areas of the two third sub-pixels 13 corresponding to the first long side of the first virtual trapezoid 21 are greater than the light-emitting areas of the two third sub-pixels 13 corresponding to the first short side of the first virtual trapezoid 21. In this manner, the following problem can be avoided: in the case where the light-emitting areas of the third sub-pixels 13 are the same, the distance between the two third sub-pixels 13 corresponding to the first long side of the first virtual trapezoid 21 is large, and the distance between the two third sub-pixels 13 corresponding to the first short side of the first virtual trapezoid 21 is small so that uneven display is caused. Therefore, a better display effect is ensured.

In an embodiment, with continued reference to FIGS. 2 and 3, the second short side 223 includes a first end point 2231 and a second end point 2232, and the second long side 221 includes a third end point 2211 and a fourth end point 2212. The third oblique side 222 connects the first end point 2231 and the third end point 2211, and the fourth oblique side 224 connects the second end point 2232 and the fourth end point 2212. A foot of the first end point 2231 on the second long side 221 is a first foot C1, and a distance between the first foot C1 and the third end point 2211 is a ninth distance L9; a foot of the second end point 2232 on the second long side 221 is a second foot C2, and a distance between the second foot C2 and the fourth end point 2212 is a tenth distance L10, where the tenth distance L10 is less than or equal to the ninth distance L9. A length value of the ninth distance L9 is x, and a length value of a distance between the first foot C1 and the second foot C2 is y, where 0<x≤3/16 (x+y). That is, even if the third end point 2211 is offset relative to the first foot C1 and the fourth end point 2212 is offset relative to the second foot C2, a maximum value x of the offset satisfies 0<x≤3/16 (x+y). In this manner, the following case can be avoided: the display effect is affected due to excessive offsets of the third end point 2211 and the fourth end point 2212.

Similarly, the first short side 213 includes a first end point 2131 and a second end point 2132, and the first long side 211 includes a third end point 2111 and a fourth end point 2112. The first oblique side 212 connects the first end point 2111 and the third end point 2131, and the second oblique side 214 connects the second end point 2132 and the fourth end point 2112. A foot of the first end point 2131 on the first long side 211 is a third foot C3, and a distance between the third foot C3 and the third end point 2111 is a ninth distance L9; a foot of the second end point 2132 on the first long side 211 is a fourth foot C4, and a distance between the fourth foot C4 and the fourth end point 2112 is a tenth distance L10, where the tenth distance L10 is less than or equal to the ninth distance L9. A length value of the ninth distance L9 is x, and a length value of a distance between the third foot C3 and the fourth foot C4 is y, where 0<x≤3/16 (x+y). That is, even if the third end point 2111 is offset relative to the third foot C3 and the fourth end point 2112 is offset relative to the fourth foot C4, a maximum value x of the offset satisfies 0<x≤3/16 (x+y). In this manner, the following case can be avoided: the display effect is affected due to excessive offsets of the third end point 2111 and the fourth end point 2112.

Based on the preceding solution, in an embodiment, 0<x≤3.8 μm, that is, the third end point 2111 is offset relative to the first foot C1, but the offset of the third end point 2111 relative to the third foot C3 is greater than 0 and less than or equal to 3.8 μm, and the offset of the fourth end point 2112 relative to the fourth foot C4 is greater than 0 and less than or equal to 3.8 μm. In this manner, the following case can be avoided: the display effect is affected due to excessive offsets of the third end point 2111 and the fourth end point 2112.

Figure 18:
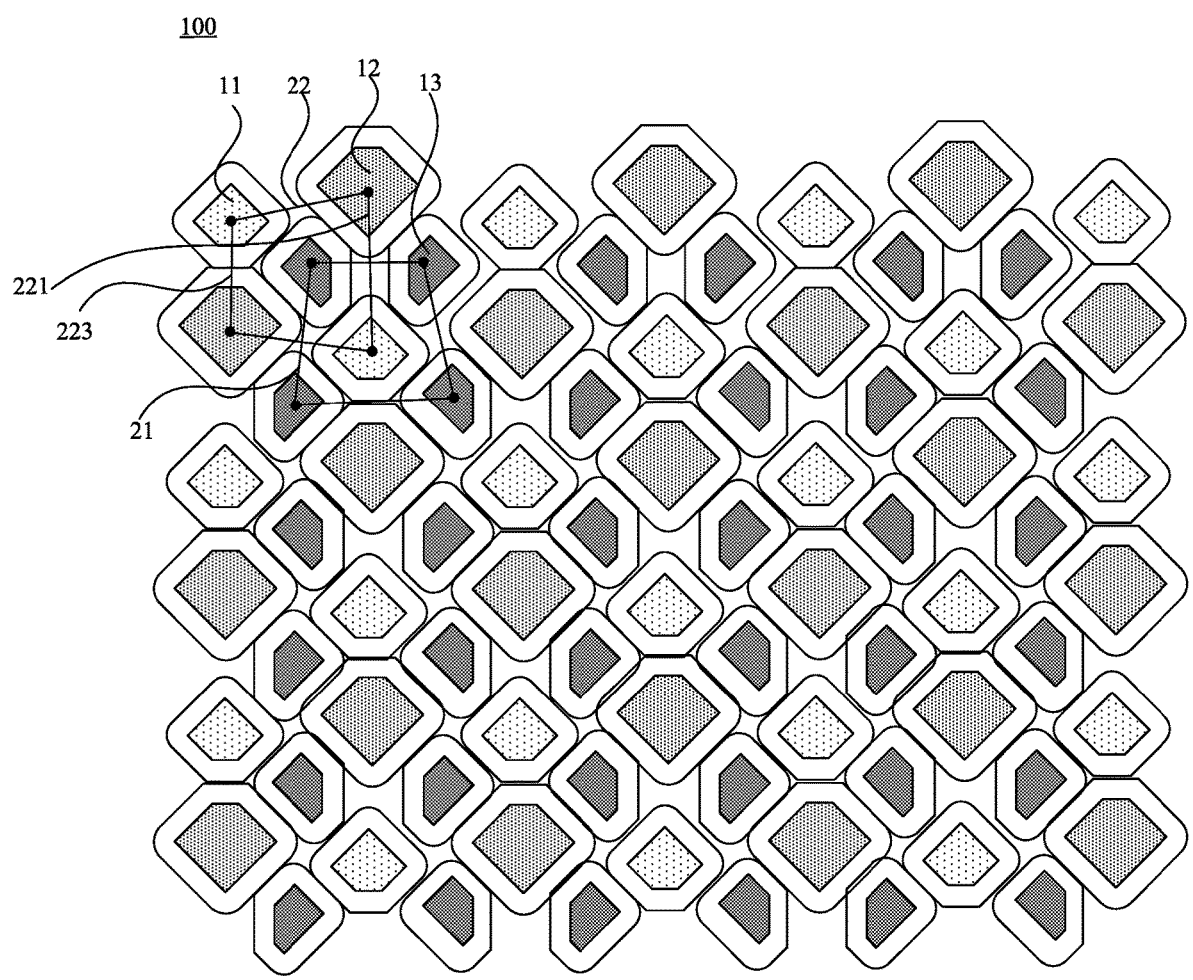
FIG. 18 is a structure diagram of another display panel according to an embodiment of the present application.

Based on the preceding solutions, in an embodiment, FIG. 18 is a structure diagram of another display panel according to an embodiment of the present application. As shown in FIG. 18, at least one of the first sub-pixel 11, the second sub-pixel 12, or the third sub-pixel 13 has cut corners.

In this embodiment, at least one of the first sub-pixel 11, the second sub-pixel 12, or the third sub-pixel 13 is corner-cut. For example, the first sub-pixel 11 and the second sub-pixel 12 are corner-cut; or only the third sub-pixel 13 is corner-cut; or not only the light-emitting layers of the first sub-pixel 11 and the second sub-pixel 12 are corner-cut, but also the light-emitting layer of the third sub-pixel 13 is corner-cut. In this manner, the arrangement of the sub-pixels is compact, and the display effect of the display panel is ensured.

In an embodiment, at least one of the first sub-pixel 11 or the second sub-pixel 12 has cut corners, and the shapes of both the first sub-pixel 11 and the second sub-pixel 12 include a pentagon, where the pentagon includes right-like angles and obtuse-like angles.

Generally, the shape of the sub-pixel is a regular shape such as a rectangle or a square. In this embodiment, the first sub-pixel 11 and the second sub-pixel 12 are set as pentagons, and the pentagons include right-like angles and obtuse-like angles, for example, three right-like angles and two obtuse-like angles, that is, compared with the shape of the sub-pixel as a rectangle, the first sub-pixel 11 and the second sub-pixel 12 are corner-cut so that the arrangement of the sub-pixels is compact and the display effect of the display panel is ensured.

In an embodiment, with continued reference to FIG. 18, the pentagon includes at least one right-angled side and an obtuse-angled side, for example, four right-angled sides and one obtuse-angled side, and two right-angled sides adjacent to the obtuse-angled side have the same side length. In this manner, it can be ensured that the opening ratios of the first sub-pixels 11 and the second sub-pixels 12 are relatively large and the display panel has a better display effect.

In an embodiment, with continued reference to FIG. 18, the third sub-pixel 13 has cut corners, the shape of the third sub-pixel 13 includes a pentagon, and the pentagon includes right-like angles and obtuse-like angles, for example, three right-like angles and two obtuse-like angles. That is, the first sub-pixel 11 and the second sub-pixel 12 are set as pentagons, compared with the shape of the sub-pixel as a rectangle, the third sub-pixel 13 is corner-cut so that the arrangement of the sub-pixels is compact, and the display effect of the display panel is ensured.

In an embodiment, with continued reference to FIG. 18, a center of one of the first sub-pixels 11 and a center of one of the second sub-pixels 12 respectively coincide with end points of the second short side 223, and an obtuse-angled side of the first sub-pixel 11 is opposite to an obtuse-angled side of the second sub-pixel 12; a center of the other first sub-pixel 11 and a center of the other second sub-pixel 12 respectively coincide with end points of the second long side 221, and an obtuse-angled side of the first sub-pixel 11 and an obtuse-angled side of the second sub-pixel 12 face away from each other; an obtuse-angled side of the third sub-pixel 13 faces the second long side 221. In this manner, it can be ensured that the arrangement of the sub-pixels is compact, and the display panel has a better display effect.

It is to be noted that in the case where the sub-pixel has cut corners, the center of the sub-pixel is used for restoring the sub-pixel with cut corners to a shape before the corner-cutting process, and the center of the shape is the center of the corner-cut sub-pixel.

Figure 19:
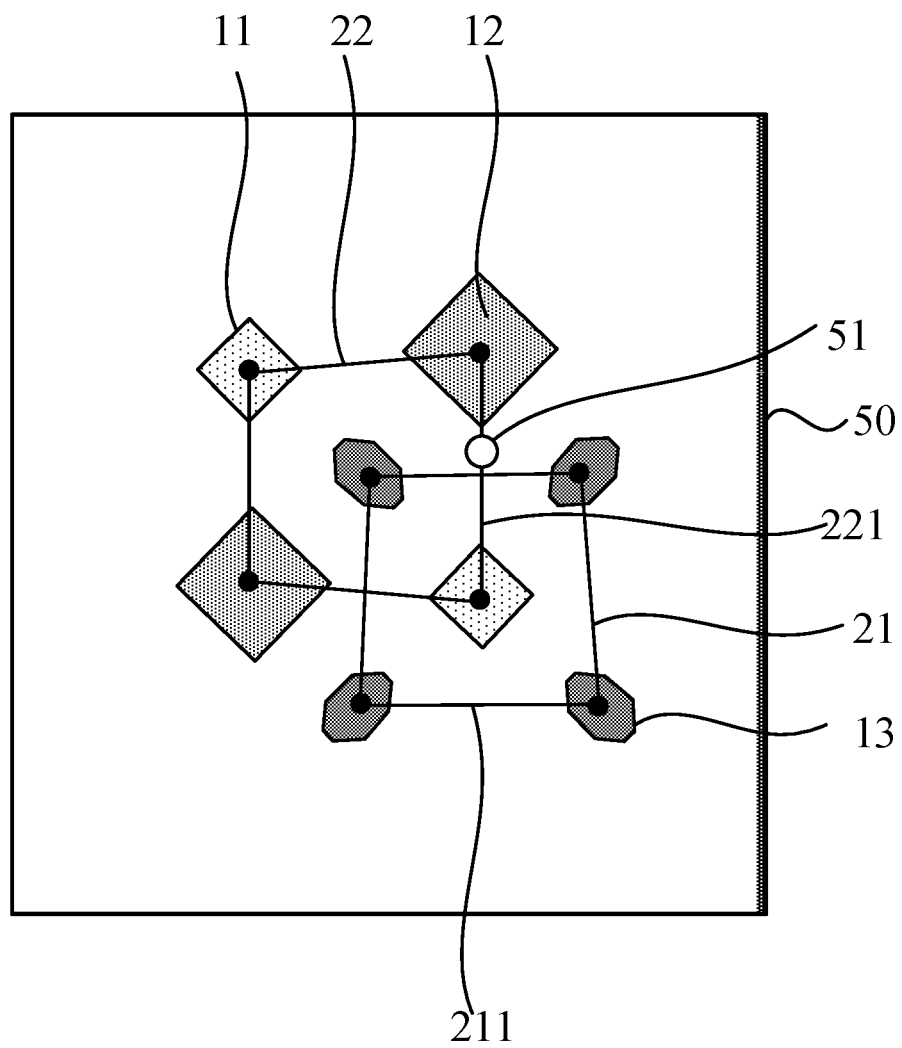
FIG. 19 is a partial structure diagram of another display panel according to an embodiment of the present application.
Figure 20:
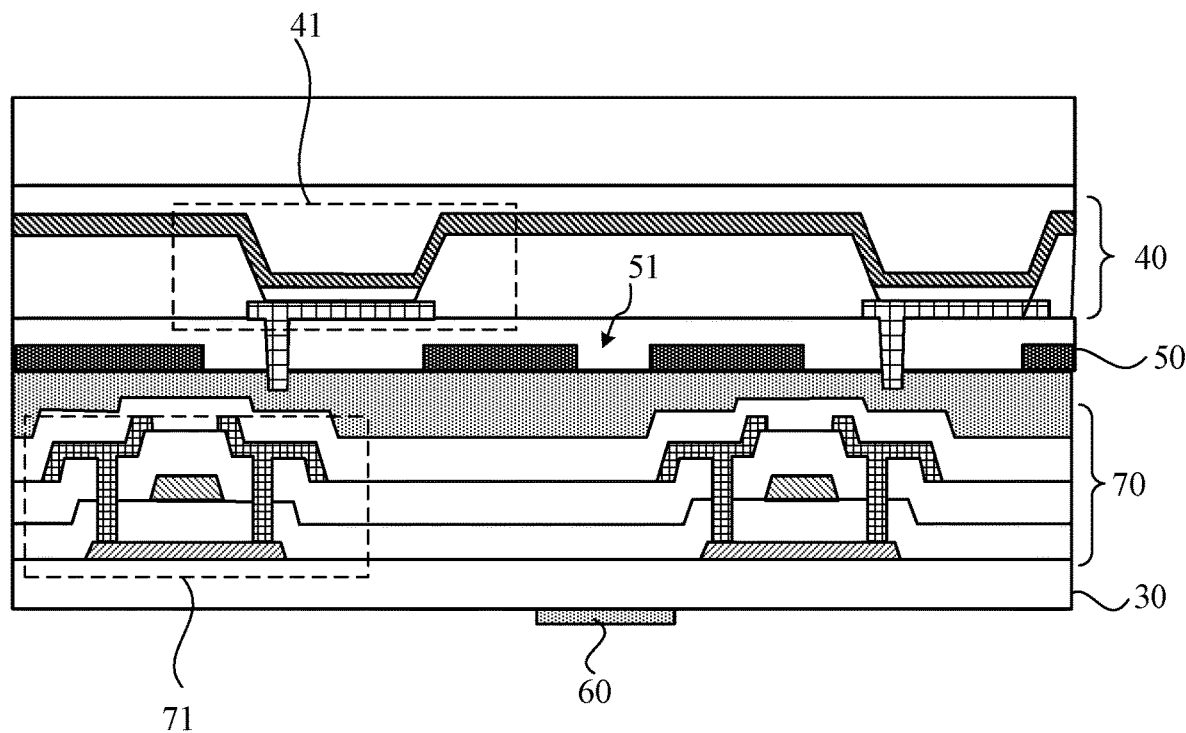
FIG. 20 is a sectional diagram of the display panel corresponding to FIG. 19.

Based on the preceding solutions, in an embodiment, FIG. 19 is a partial structure diagram of another display panel according to an embodiment of the present application, and FIG. 20 is a sectional diagram of the display panel corresponding to FIG. 19. As shown in FIGS. 19 and 20, the display panel provided in the embodiments of the present application further includes a substrate 30, a light-blocking layer 50, and a light sensor 60. The light-blocking layer 50 includes multiple imaging apertures 51. The light sensor 60 in a vertical direction of a plane where the substrate 30 is located and each imaging aperture 51 in the vertical direction of the plane where the substrate 30 is located overlap. Each imaging aperture 51 and at least part of the first long side 211 of the first virtual trapezoid 21 overlap; or the each imaging aperture 51 and at least part of the second long side 221 of the second virtual trapezoid 22 overlap. In FIG. 16, the case where each imaging aperture 51 and at least part of the second long side 221 of the second virtual trapezoid 22 overlap is used as an example for description. In an embodiment, the display panel further includes a display layer 40 and a pixel circuit layer 70. The display layer 40 is disposed on a side of the substrate 30 and includes multiple light-emitting elements 41. The pixel circuit layer 70 is disposed between the substrate 30 and the display layer 40 and includes multiple pixel circuits 71. Each of the multiple pixel circuits 71 is electrically connected to a respective one of the multiple light-emitting elements 41. Each of the multiple pixel circuits 71 is configured to drive a respective one of the multiple light-emitting elements 41 electrically connected to the each of the multiple pixel circuits 71 to emit light. The sub-pixel further includes a pixel circuit 71.

It is to be noted that the embodiments of the present application do not limit the number of light-blocking layers 50. In FIG. 20, the case where one light-blocking layer 50 exists is used as an example for illustration. In other embodiments, the display panel may include two light-blocking layers. Other structures in the display panel may be described with reference to the preceding embodiments and will not be described herein. The light sensor 60 may be configured, for example, to achieve fingerprint identification. Specifically, the light-blocking layer 50 is provided with multiple imaging apertures 51, and part of the light-emitting elements 41 in the display layer 40 are reused as fingerprint identification light sources. After light generated by the light-emitting elements 41 reaches a contact surface where a fingerprint is in contact with a display screen, since fingerprint valleys and fingerprint ridges have different reflection degrees for the light, the light reflected back is incident to the light sensor 60 through the multiple imaging apertures 51. A fingerprint image may be imaged to the light sensor 60 through the aperture imaging principle, to achieve the fingerprint identification.

In this embodiment, since the centers of four third sub-pixels 13 surrounding the first sub-pixel 11 form the first virtual trapezoid 21, the centers of two first sub-pixels 11 and two second sub-pixels 12 surrounding the third sub-pixel 13 form the second virtual trapezoid 22, the distance between two third sub-pixels 13 corresponding to the long side of the first virtual trapezoid 21 becomes larger, and the distance between the first sub-pixel 11 and the second sub-pixel 12 corresponding to the long side of the second virtual trapezoid 22 becomes larger. Therefore, in the embodiments of the present application, the imaging aperture 51 and the first long side 211 of the first virtual trapezoid 21 overlap; or the imaging aperture 51 and the second long side 221 of the second virtual trapezoid 22 overlap so that more space in which the imaging aperture 51 is arranged exists, thereby increasing the aperture of the imaging aperture 51 in an extension direction of the first long side 211 and/or an extension direction of the second long side 221. In this manner, a light-transmitting area of the imaging aperture 51 can be increased, the amount of fingerprint identification signal can be increased, the time for fingerprint identification can be shortened, and the adverse effects caused by the diffraction of the imaging aperture 51 can be reduced. In an embodiment, the length of the second long side 221 of the second virtual trapezoid 22 in FIG. 19 is relatively long, so the imaging aperture 51 is configured to overlap with the second long side 221.

Figure 21:
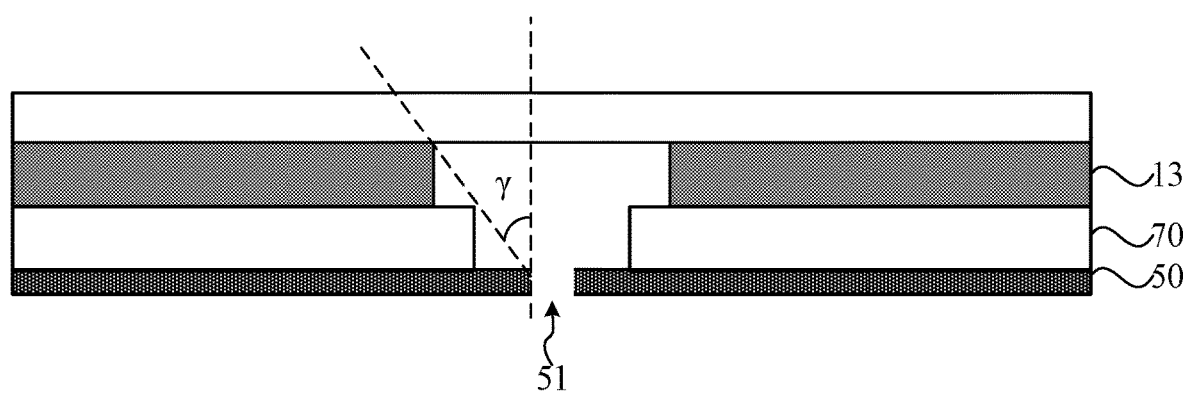
FIG. 21 is a diagram illustrating the relationship between the light emitted by a third sub-pixel and a distance between the third sub-pixel and an imaging aperture according to an embodiment of the present application.

It is considered that in the case where the centers of two first sub-pixels 11 and two second sub-pixels 12 form the second virtual trapezoid 22, although the distance between the first sub-pixel 11 and the second sub-pixel 12 corresponding to the long side of the second virtual trapezoid 22 becomes larger so that more space in which the imaging aperture 51 is arranged exists, the distance between the third sub-pixel 13 and the imaging aperture 51 becomes smaller. In addition, since the first sub-pixel 11 is closed during fingerprint unlocking, the distance between the third sub-pixel 13 and the imaging aperture 51 mainly affects the sensitivity of fingerprint unlocking. For example, FIG. 21 is a diagram illustrating the relationship between the light emitted by a third sub-pixel and a distance between the third sub-pixel and an imaging aperture according to an embodiment of the present application. Referring to FIG. 21, in the case where the distance between the third sub-pixel 13 and the imaging aperture 51 is smaller, the angle between the light emitted by the third sub-pixel 13 and a direction perpendicular to the substrate 30 is smaller so that more stray light enters the imaging aperture 51, interferes with fingerprint unlocking and affects the sensitivity of fingerprint unlocking.

Therefore, in the case where the resolution of the display panel is 400 ppi, the distance between the second sub-pixel 12 and the imaging aperture 51 may be greater than 6 μm and the distance between the third sub-pixel 13 and the imaging aperture 51 may be greater than 6 μm. In this manner, the following case can be avoided: the light emitted by the second sub-pixel 12 and the third sub-pixel 13 directly enters the imaging aperture 51 and interferes with fingerprint unlocking.

In addition, the fingerprint unlocking in cases where the first included angle $\alpha 1$ of the first virtual trapezoid 21, the second included angle $\alpha 2$ of the first virtual trapezoid 21, the third included angle $\beta 1$ of the second virtual trapezoid 22, and the fourth included angle $\beta 2$ of the second virtual trapezoid 22 are the same and equal to 90°, 88°, 86°, and 83° is studied below.

Figure 22:
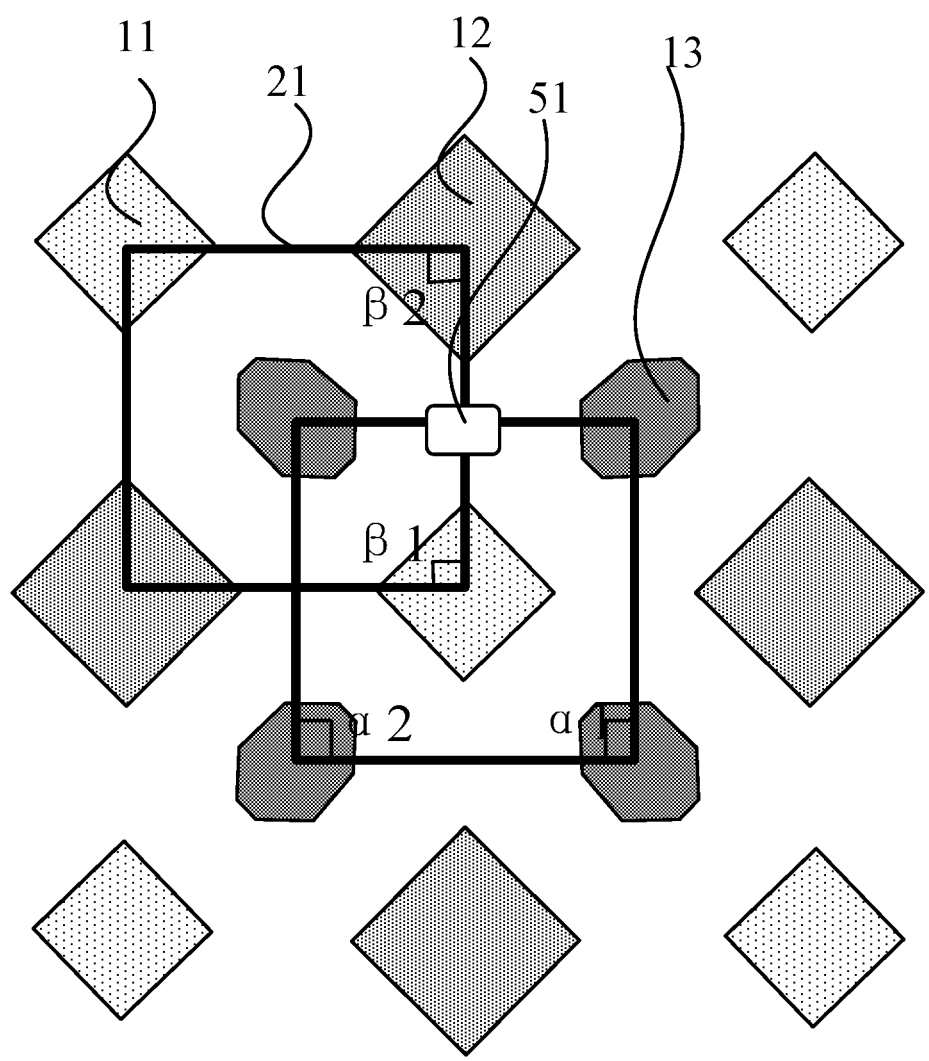
FIG. 22 is a partial structure diagram of another display panel according to an embodiment of the present application.
Figure 23:
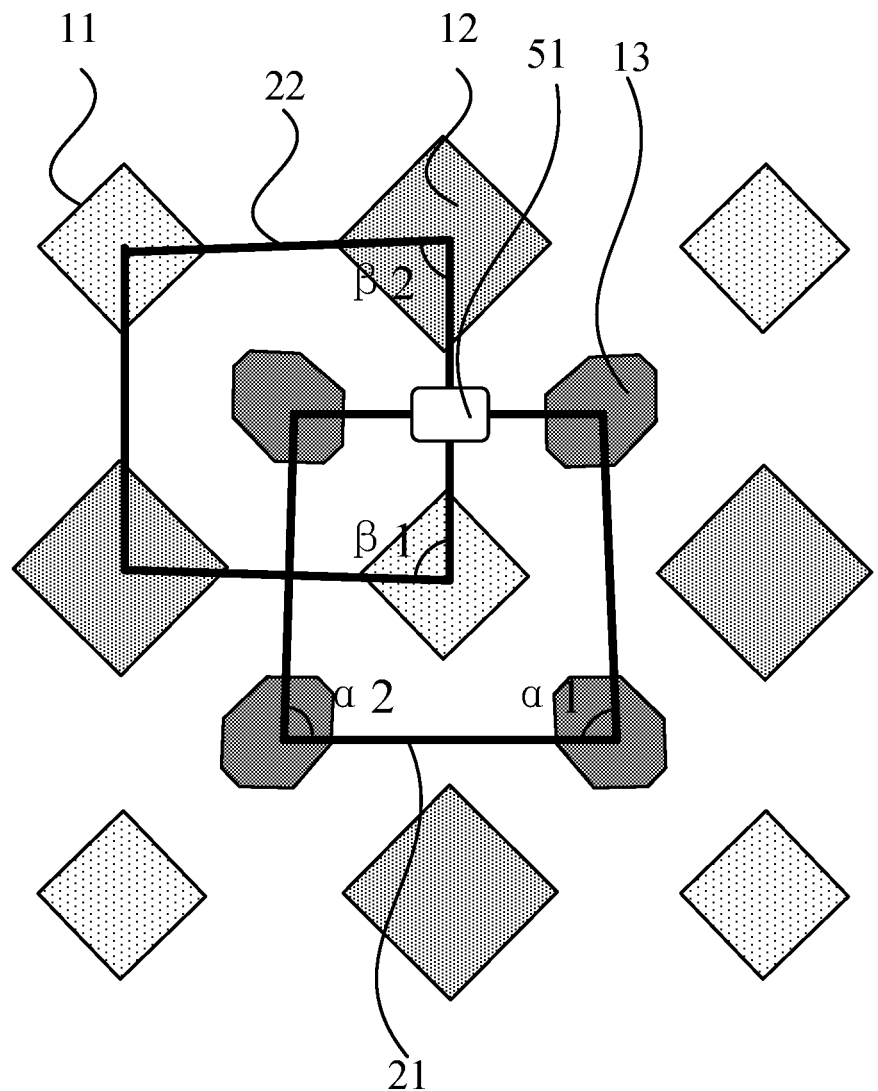
FIG. 23 is a partial structure diagram of another display panel according to an embodiment of the present application.
Figure 24:
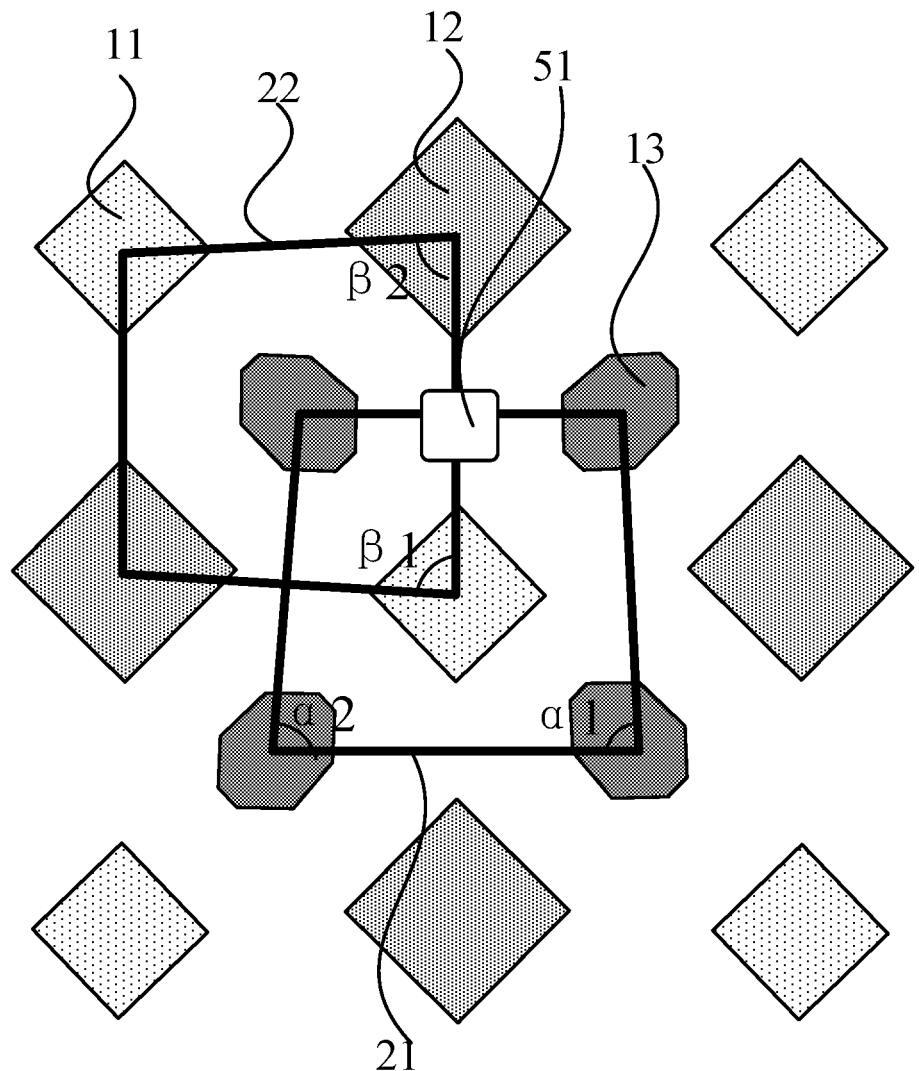
FIG. 24 is a partial structure diagram of another display panel according to an embodiment of the present application.
Figure 25:
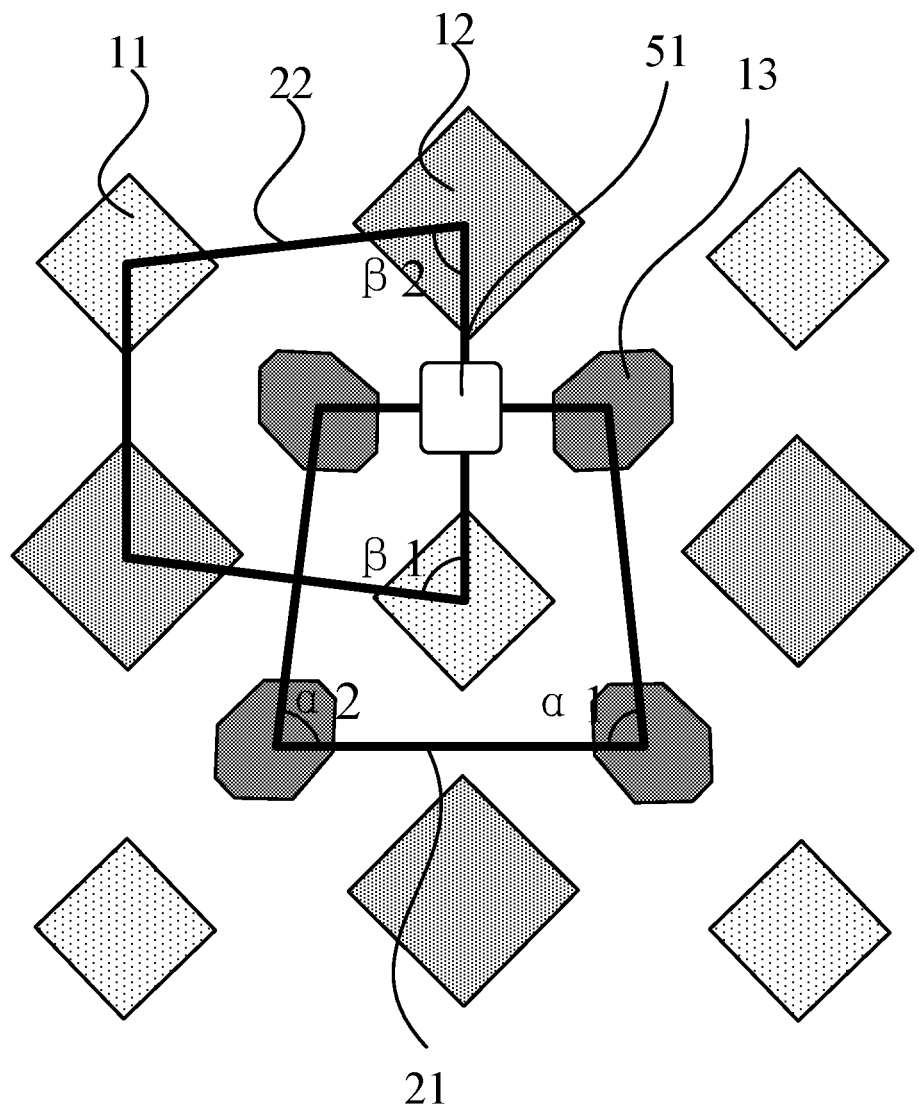
FIG. 25 is a partial structure diagram of another display panel according to an embodiment of the present application.

In an embodiment, Table 2 describes the fingerprint unlocking in cases where the first included angle $\alpha 1$ of the first virtual trapezoid 21, the second included angle $\alpha 2$ of the first virtual trapezoid 21, the third included angle $\beta 1$ of the second virtual trapezoid 22, and the fourth included angle $\beta 2$ of the second virtual trapezoid 22 are the same and equal to 90°, 88°, 86°, or 83°. FIG. 22 shows the structure of the display panel in the case where the first included angle $\alpha 1$, the second included angle $\alpha 2$, the third included angle $\beta 1$, and the fourth included angle $\beta 2$ each are 90°. FIG. 23 shows the structure of the display panel in the case where the first included angle $\alpha 1$, the second included angle $\alpha 2$, the third included angle $\beta 1$, and the fourth included angle $\beta 2$ each are 88°. FIG. 24 shows the structure of the display panel in the case where the first included angle $\alpha 1$, the second included angle $\alpha 2$, the third included angle $\beta 1$, and the fourth included angle $\beta 2$ each are 86°. FIG. 25 shows the structure of the display panel in the case where the first included angle $\alpha 1$, the second included angle $\alpha 2$, the third included angle $\beta 1$, and the fourth included angle $\beta 2$ each are 83°.

It is to be noted that in the preceding examples, only the case where the first included angle $\alpha 1$, the second included angle $\alpha 2$, the third included angle $\beta 1$, and the fourth included angle $\beta 2$ are equal is used as an example. However, the present application is not limited to this. In other optional embodiments, it is also feasible that the first included angle $\alpha 1$ is equal to the second included angle $\alpha 2$, and the third included angle $\beta 1$ is equal to the fourth included angle $\beta 2$, but the first included angle $\alpha 1$ is greater than the third included angle $\beta 1$.

TABLE 2

| | | | | Fingerprint unlocking | | |
|---|---|---|---|---|---|---|
| Angle ($\alpha 1 = \alpha 2$, $\beta 1 = \beta 2$) | Area of the imaging aperture ($\mu m^2$) | Finger print signal (ml) | Time for unlocking (ms) | Distance between the imaging aperture and the first sub-pixel | Distance between the imaging aperture and the second sub-pixel | Distance between the imaging aperture and the third sub-pixel |
| 90° | 75 | 100 | 550 | 9.8 | 10.9 | 7.4 |
| 88° | 90 | 120 | 520 | 10.4 | 10.2 | 6.8 |
| 86° | 100 | 138 | 490 | 11.2 | 9.9 | 6.4 |
| 83° | 110 | 110 | 530 | 11.8 | 9.2 | 5.7 |

Referring to FIGS. 22, 23, 24, and 25 and Table 2, in the case where the first included angle α1, the second included angle α2, the third included angle β1, and the fourth included angle β2 each are 90°, the distance between the first sub-pixel 11 and the imaging aperture 51 is 9.8 μm, the distance between the second sub-pixel 12 and the imaging aperture 51 is 10.9 μm, and the distance between the third sub-pixel 13 and the imaging aperture 51 is 7.4 μm, that is, the distance between the second sub-pixel 12 and the imaging aperture 51 and the distance between the third sub-pixel 13 and the imaging aperture 51 each are greater than 6 μm so that the light emitted by the second sub-pixel 12 and the third sub-pixel 13 can be prevented from directly entering the imaging aperture 51. However, the distance between the first sub-pixel 11 and the second sub-pixel 12 is relatively small, resulting in a relatively small area of the imaging aperture 51. For example, the area of the imaging aperture 51 is only 75 μm². In this manner, the light-transmitting area of the imaging aperture 51 is insufficient, the amount of fingerprint identification signal is small, which is only 100 ml, and the time for fingerprint unlocking is increased. For example, the time for fingerprint unlocking is 550 ms, and the fingerprint unlocking speed is slow.

In the case where the first included angle α1, the second included angle α2, the third included angle β1, and the fourth included angle β2 each are 88°, the distance between the first sub-pixel 11 and the imaging aperture 51 is 10.4 μm, the distance between the second sub-pixel 12 and the imaging aperture 51 is 10.2 μm, and the distance between the third sub-pixel 13 and the imaging aperture 51 is 6.8 μm. It can be seen that in the case where the first included angle α1, the second included angle α2, the third included angle β1, and the fourth included angle β2 become smaller, the distance between the third sub-pixel 13 and the imaging aperture 51 becomes smaller, but the distance between the third sub-pixel 13 and the imaging aperture 51 and the distance between and the second sub-pixel 12 and the imaging aperture 51 are still greater than 6 μm so that the light emitted by the second sub-pixel 12 and the third sub-pixel 13 can be prevented from directly entering the imaging aperture 51 and is still within a controllable range; at the same time, the distance between the first sub-pixel 11 and the second sub-pixel 12 is increased so that more space in which the imaging aperture 51 is arranged exists, that is, the area of the imaging aperture 51 is increased, for example, the area of the imaging aperture 51 is 90 μm². Compared with the case where the first angle α1, the second angle α2, the third included angle β1, and the fourth included angle β2 each are 90°, the area of the imaging aperture 51 is increased by 15 μm². In this manner, the amount of fingerprint identification signal is increased, for example, 120 ml so that the time for fingerprint identification is shortened. For example, the time for fingerprint unlocking is 520 ms, and the fingerprint unlocking speed is improved.

In the case where the first included angle α1, the second included angle α2, the third included angle β1, and the fourth included angle β2 each are 86°, the distance between the first sub-pixel 11 and the imaging aperture 51 is 11.2 μm, the distance between the second sub-pixel 12 and the imaging aperture 51 is 9.9 μm, and the distance between the third sub-pixel 13 and the imaging aperture 51 is 6.4 μm. It can be seen that in the case where the first included angle α1, the second included angle α2, the third included angle β1, and the fourth included angle β2 become less than what is mentioned above, the distance between the third sub-pixel 13 and the imaging aperture 51 becomes smaller, but the distance between the third sub-pixel 13 and the imaging aperture 51 and the distance between and the second sub-pixel 12 and the imaging aperture 51 are still greater than 6 μm so that the light emitted by the second sub-pixel 12 and the third sub-pixel 13 can be prevented from directly entering the imaging aperture 51; at the same time, the distance between the first sub-pixel 11 and the second sub-pixel 12 is increased so that more space in which the imaging aperture 51 is arranged exists, that is, the area of the imaging aperture 51 is increased, for example, the area of the imaging aperture 51 is 100 μm². Compared with the case where the first angle α1, the second angle α2, the third included angle β1, and the fourth included angle β2 each are 90°, the area of the imaging aperture 51 is increased by 25 μm². In this manner, the amount of fingerprint identification signal is increased, for example, 138 ml so that the time for fingerprint identification is shortened. For example, the time for fingerprint unlocking is 490 ms, and the fingerprint unlocking speed is the fastest.

In the case where the first included angle α1, the second included angle α2, the third included angle β1, and the fourth included angle β2 each are 83°, the distance between the first sub-pixel 11 and the imaging aperture 51 is 11.8 μm, the distance between the second sub-pixel 12 and the imaging aperture 51 is 9.2 μm, and the distance between the third sub-pixel 13 and the imaging aperture 51 is 5.7 μm. It can be seen that in the case where the first included angle α1, the second included angle α2, the third included angle β1, and the fourth included angle β2 become smaller to 83°, although the distance between the first sub-pixel 11 and the second sub-pixel 12 is further increased, the area of the imaging aperture 51 is increased, for example, the area of the imaging aperture 51 is 110 μm², and the amount of fingerprint identification signal is increased, for example, 110 ml, the distance between the third sub-pixel 13 and the imaging aperture 51 is 5.7 μm, which is less than 6 μm, and the light emitted by the third sub-pixel 13 can directly enter the imaging aperture 51 and interfere with fingerprint unlocking so that the fingerprint unlocking speed drops instead. For example, the time for fingerprint unlocking is 530 ms.

To sum up, in the case where the first included angle α1, the second included angle α2, the third included angle β1, and the fourth included angle β2 each are 90°, the area of the imaging aperture 51 is relatively small, the light-transmitting area of the imaging aperture 51 is insufficient, the amount of fingerprint identification signal is small, and the fingerprint unlocking speed is slow; in the case where the first included angle α1, the second included angle α2, the third included angle β1, and the fourth included angle β2 each are 88°, the distance between the first sub-pixel 11 and the second sub-pixel 12 is increased, the area of the imaging aperture 51 is increased, the amount of fingerprint identification signal is increased, and the fingerprint unlocking speed is improved; in the case where the first included angle α1, the second included angle α2, the third included angle β1, and the fourth included angle β2 each are 86°, the distance between the first sub-pixel 11 and the second sub-pixel 12 is further increased, the area of the imaging aperture 51 is increased, the amount of fingerprint identification signal is increased, and the fingerprint unlocking speed is the fastest; in the case where the first included angle α1, the second included angle α2, the third included angle β1, and the fourth included angle β2 each are 83°, the distance between the first sub-pixel 11 and the second sub-pixel 12 is further increased, the area of the imaging aperture 51 is increased, but the distance between the third sub-pixel 13 and the imaging aperture 51 is less than 6 μm, and the light emitted by the third sub-pixel 13 can directly enter the imaging aperture 51 and interfere with fingerprint unlocking so that the fingerprint unlocking speed drops instead. In the case where the first included angle α1, the second included angle α2, the third included angle β1, and the fourth included angle β2 each are 86°, the fingerprint unlocking speed is the fastest.

Figure 26:
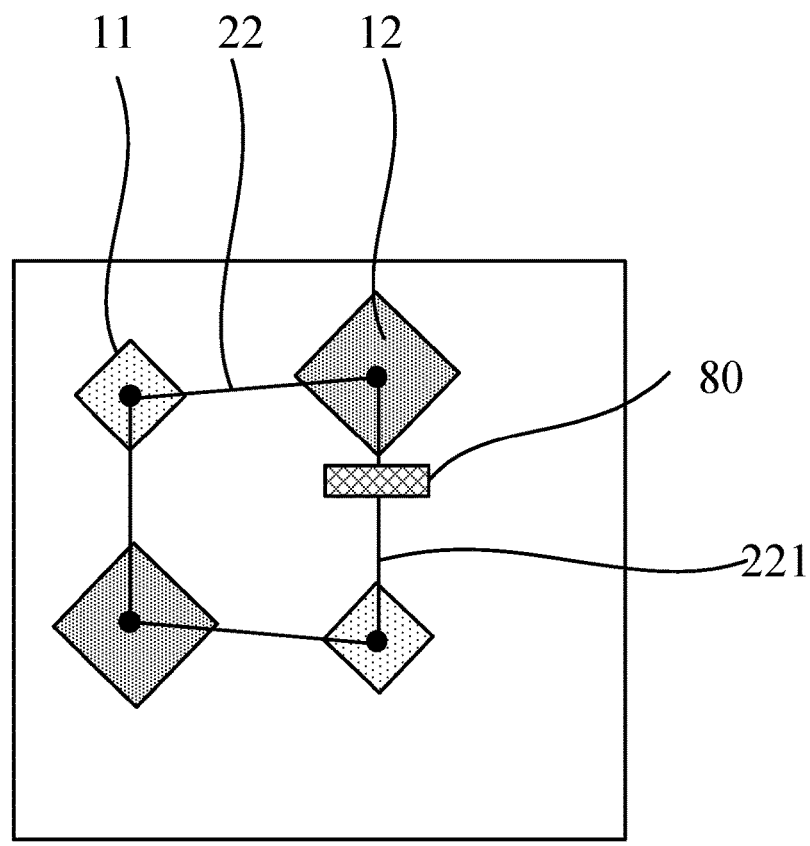
FIG. 26 is a partial structure diagram of another display panel according to an embodiment of the present application.
Figure 27:
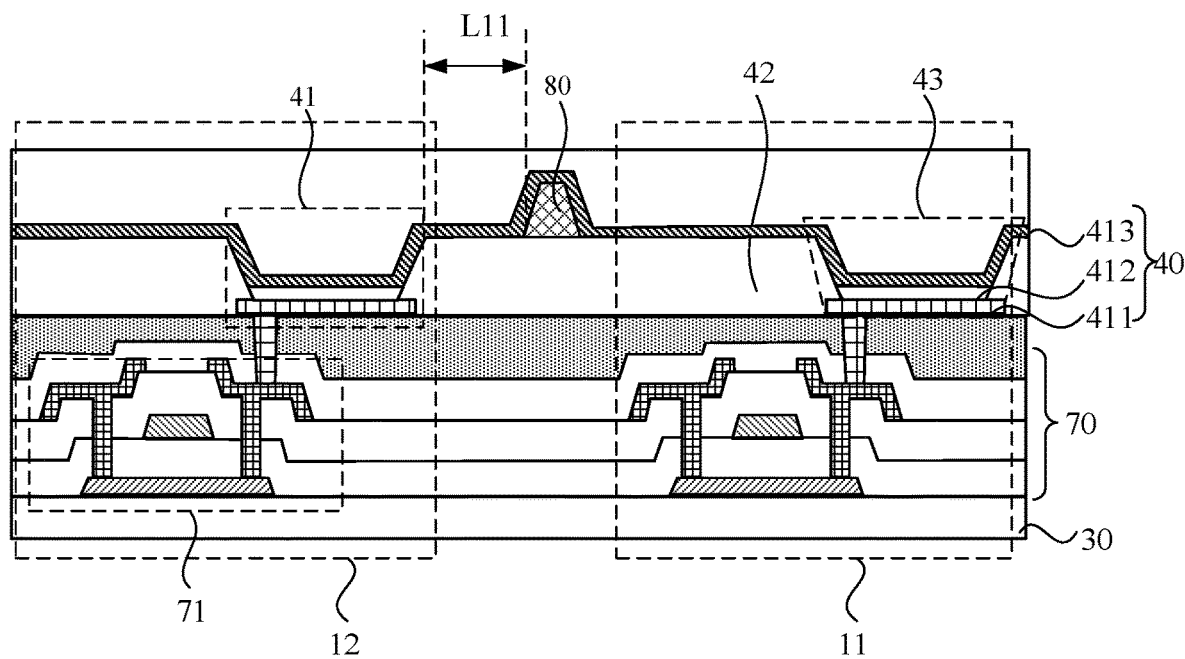
FIG. 27 is a sectional diagram of the display panel corresponding to FIG. 26.

Based on the preceding solutions, in an embodiment, FIG. 26 is a partial structure diagram of a display panel according to an embodiment of the present application, and FIG. 27 is a sectional diagram of the display panel corresponding to FIG. 26. Referring to FIGS. 26 and 27, the display panel provided in the embodiments of the present application includes a substrate 30 and a support column 80 disposed on a side of the display layer 40 facing away from the substrate 30. A distance between a vertical projection of the support column 80 on the plane where the substrate 30 is located and a vertical projection of at least part of the second long side 221 of the second virtual trapezoid 22 on the plane where the substrate 30 is located is a third preset distance. In an embodiment, the vertical projection of the support column 80 on the plane where the substrate 30 is located and the vertical projection of at least part of the second long side 221 of the second virtual trapezoid 22 on the plane where the substrate 30 is located overlap. In an embodiment, the display panel further includes the display layer 40 and the pixel circuit layer 70. The display layer 40 is disposed on a side of the substrate 30 and includes a pixel defining layer 42 and multiple light-emitting elements 41. Each light-emitting element 41 includes an anode 411, a light-emitting layer 412, and a cathode 413. The pixel defining layer 42 includes multiple pixel openings 43. The multiple pixel openings 43 and the multiple light-emitting elements 41 are arranged in one-to-one correspondence. The pixel circuit layer 70 is disposed between the substrate 30 and the display layer 40 and includes multiple pixel circuits 71. Each of the multiple pixel circuits 71 is electrically connected to a respective one of the multiple light-emitting elements 41. Each of the multiple pixel circuits 71 is configured to drive a respective one of the multiple light-emitting elements 41 electrically connected to the each of the multiple pixel circuits 71 to emit light. The sub-pixel further includes a pixel circuit 71.

In the actual preparation process, referring to FIG. 27, after the pixel opening 43 is formed on the pixel defining layer 42 to expose the anode 411, a corresponding luminescent material is evaporated in the pixel opening 43 by using a mask to form the light-emitting layer 412. In an embodiment, the light-emitting layers 412 of the light-emitting elements 41 of different light-emitting colors may be evaporated by using different masks. To avoid direct contact between the mask and the pixel defining layer 42, the support column 80 needs to be disposed above the pixel defining layer 42 to support the mask.

In this embodiment, the centers of two first sub-pixels 11 and two second sub-pixels 12 surrounding the third sub-pixel 13 form the second virtual trapezoid 22, and the distance between the first sub-pixel 11 and the second sub-pixel 12 corresponding to the long side of the second virtual trapezoid 22 becomes larger. Therefore, in the embodiments of the present application, the vertical projection of the support column 80 on the plane where the substrate 30 is located and the vertical projection of at least part of the second long side 221 on the plane where the substrate 30 is located overlap, that is, the support column 80 is disposed above the pixel defining layer 42 between the pixel opening 43 corresponding to the first sub-pixel 11 and the pixel opening 43 corresponding to the second sub-pixel 12, where the distance between the pixel opening 43 corresponding to the first sub-pixel 11 and the pixel opening 43 corresponding to the second sub-pixel 12 is relatively large so that the space in which the support column 80 is disposed can be increased and the preparation yield can be improved. In addition, for the support column 80 of the same size, in this embodiment, the distances from the support column 80 to the pixel opening 43 corresponding to the first sub-pixel 11 and the pixel opening 43 corresponding to the second sub-pixel 12 can be increased so that the support column 80 can be prevented from blocking the light emitted by the light-emitting element 41 and thus the color shift can be reduced. Therefore, to ensure the process yield, the following needs to be considered: the distances from the support column 80 to the pixel opening 43 corresponding to the first sub-pixel 11 and the pixel opening 43 corresponding to the second sub-pixel 12 satisfy a yield design value, and the second long side 221 and the second short side 223 of the second virtual trapezoid 22 both satisfy a process design value, that is, a minimum distance between the pixel openings of the first sub-pixel 11 and the second sub-pixel 12.

Figure 28:
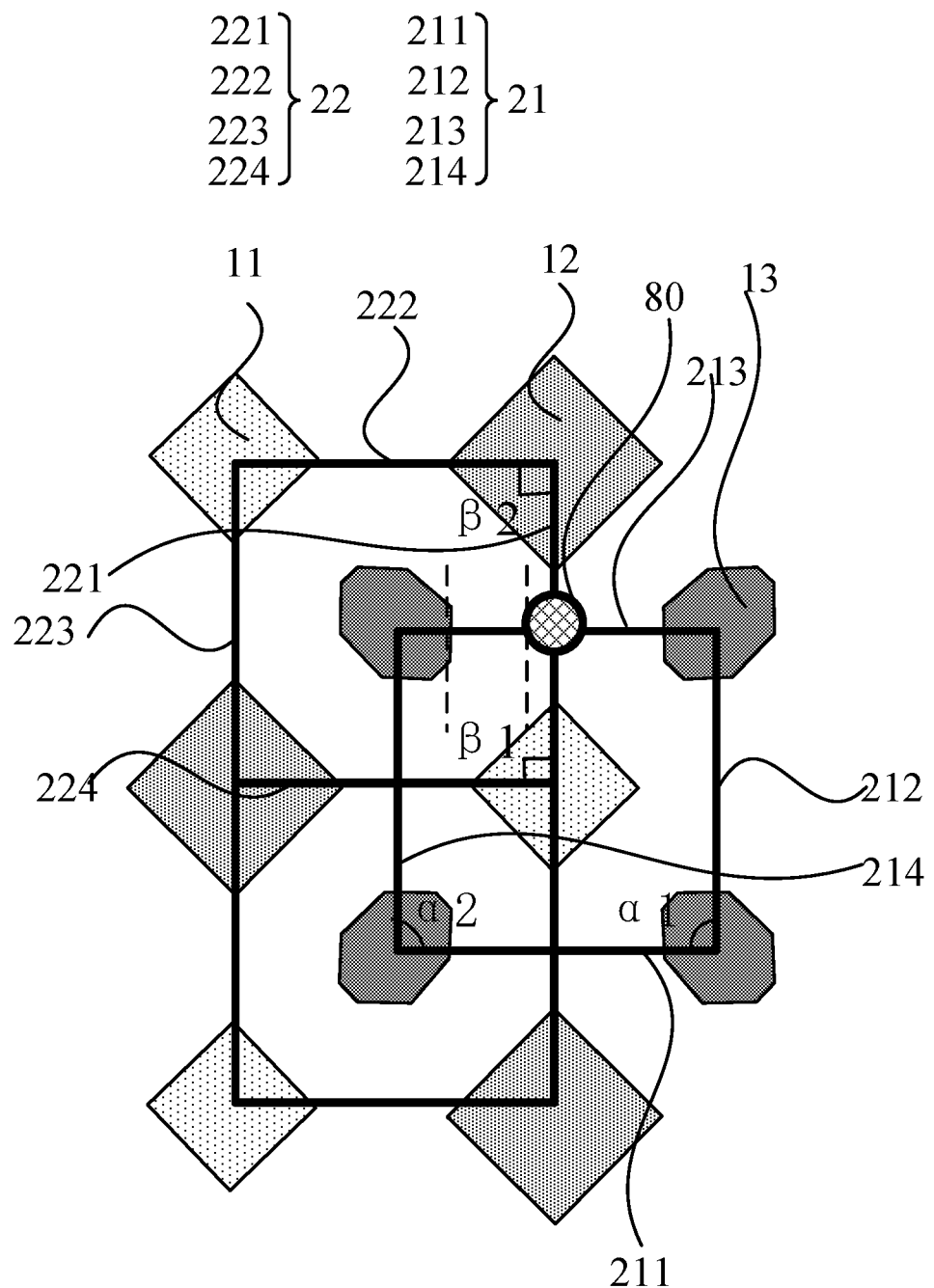
FIG. 28 is a partial structure diagram of another display panel according to an embodiment of the present application.
Figure 29:
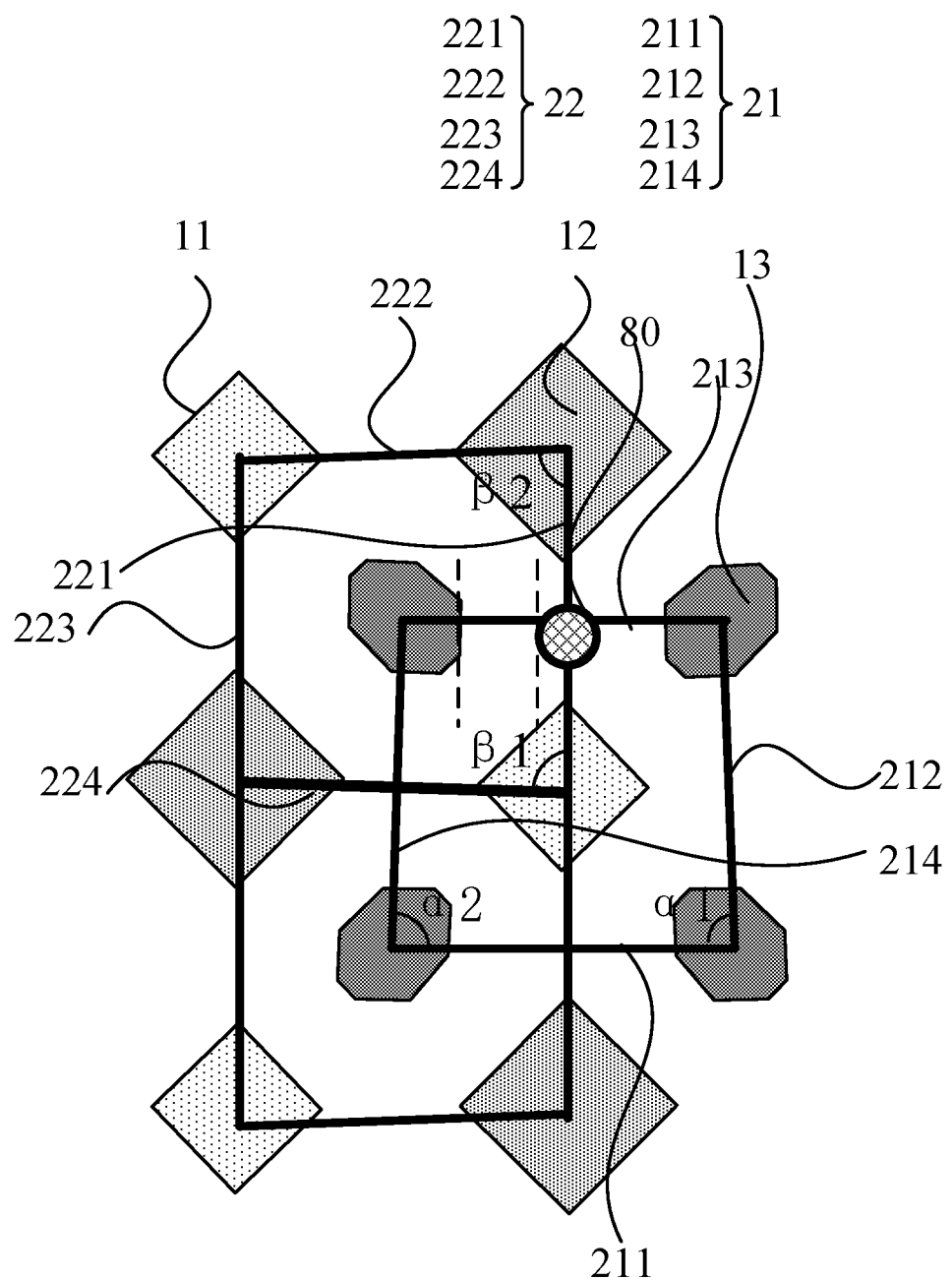
FIG. 29 is a partial structure diagram of another display panel according to an embodiment of the present application.
Figure 30:
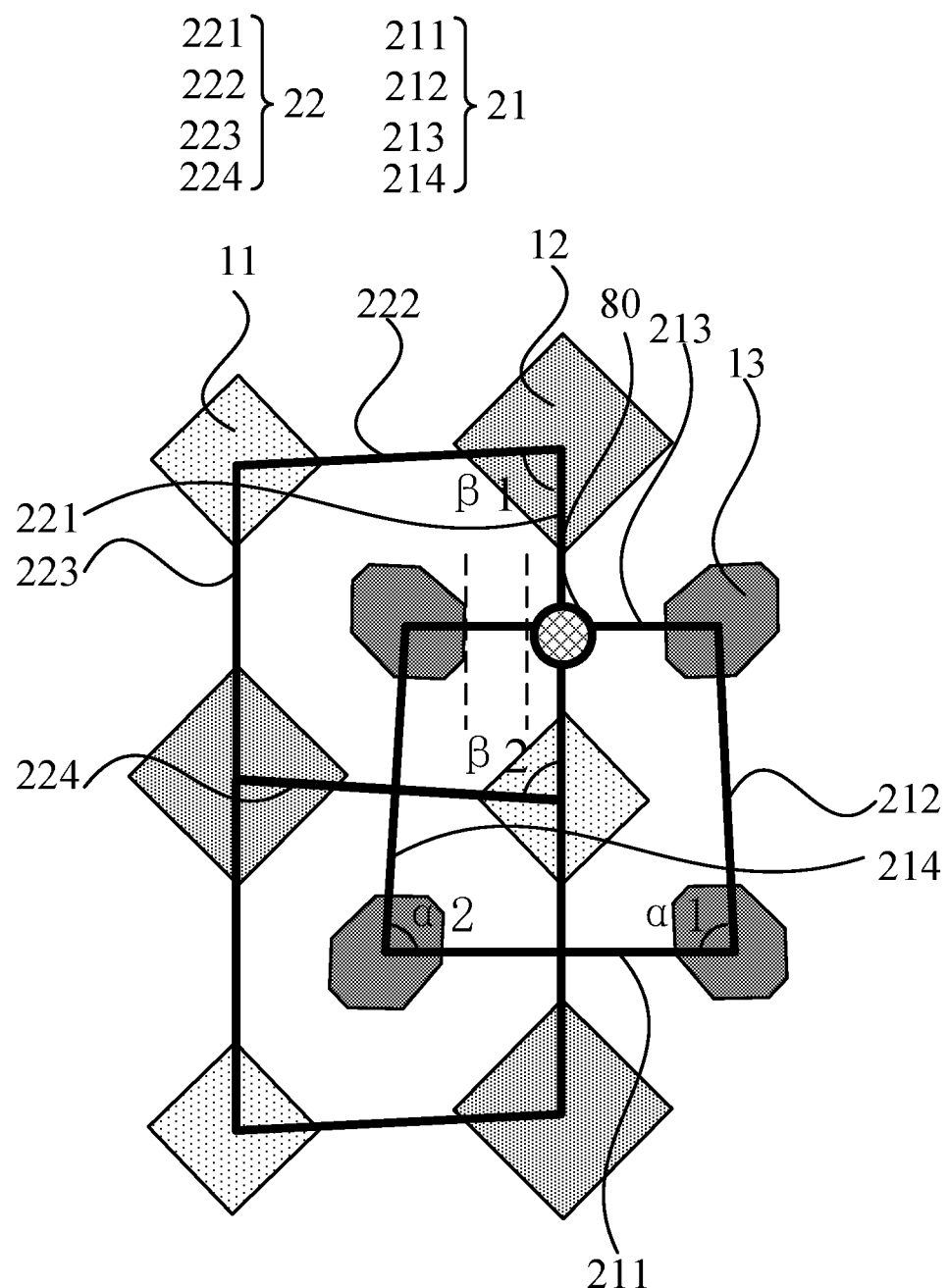
FIG. 30 is a partial structure diagram of another display panel according to an embodiment of the present application.
Figure 31:
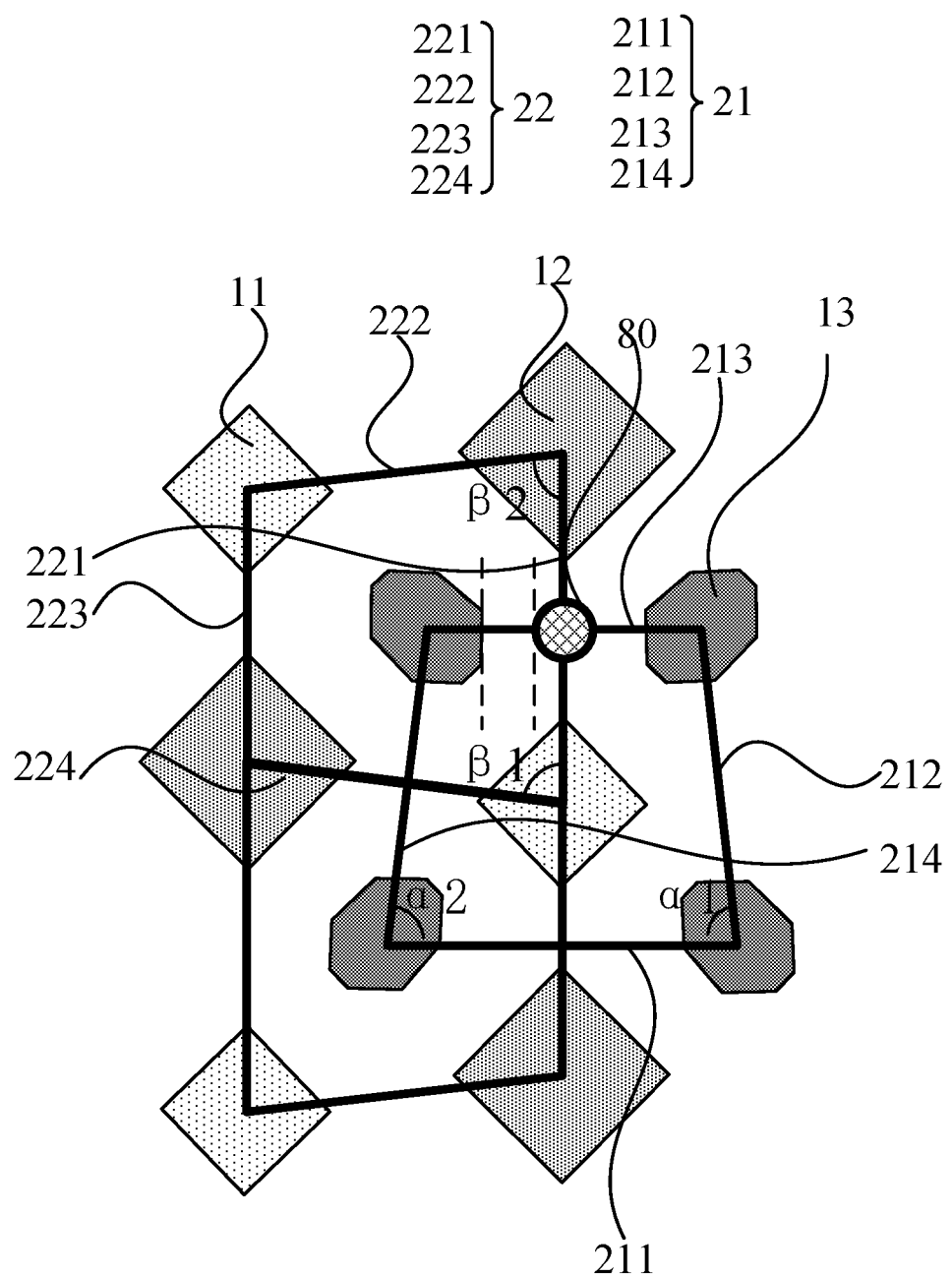
FIG. 31 is a partial structure diagram of another display panel according to an embodiment of the present application.

In an embodiment, FIG. 28 shows the structure of the display panel in the case where the first included angle α1 and the second included angle α2 each are equal to 90° and the third included angle β1 and the fourth included angle β2 each are equal to 90°. FIG. 29 shows the structure of the display panel in the case where the first included angle α1 and the second included angle α2 each are equal to 88° and the third included angle β1 and the fourth included angle β2 each are equal to 88°. FIG. 30 shows the structure of the display panel in the case where the first included angle α1 and the second included angle α2 each are equal to 86° and the third included angle β1 and the fourth included angle β2 each are equal to 86°. FIG. 31 shows the structure of the display panel in the case where the first included angle α1 and the second included angle α2 each are equal to 83° and the third included angle β1 and the fourth included angle β2 each are equal to 83°. It is to be noted that in FIGS. 28 to 31, the case where the first included angle α1 is equal to the third included angle β1 is used as an example for description and does not constitute a limitation to the present application. In other optional embodiments, the first included angle α1 may also be greater than the third included angle β1.

As shown in FIGS. 28 to 31, in the case where the centers of two first sub-pixels 11 and two second sub-pixels 12 form the second virtual trapezoid 22, the second virtual trapezoid 22 includes the second long side 221, the third oblique side 222, the second short side 223, and the fourth oblique side 224 that are sequentially connected, the second long side 221 and the third oblique side 222 form the third included angle β1, the second long side 221 and the fourth oblique side 224 form the fourth included angle β2, and the distance between the vertical projection of the support column 80 on the plane where the substrate 30 is located and the vertical projection of at least part of the second long side 221 on the plane where the substrate 30 is located is the third preset distance. In an embodiment, the vertical projection of the support column 80 on the plane where the substrate 30 is located and the vertical projection of at least part of the second long side 221 on the plane where the substrate 30 is located overlap. At the same time, multiple third sub-pixels 13 form the first virtual trapezoid 21, the first virtual trapezoid 21 includes the first long side 211, the first oblique side 212, the first short side 213, and the second oblique side 214 that are sequentially connected, the first long side 211 and the first oblique side 212 form the first included angle α1, the first long side 211 and the second oblique side 212 form the second included angle α2, a certain preset distance exists between the support column 80 in the vertical direction of the plane where the substrate 30 is located and at least part of the first short side in the vertical direction of the plane where the substrate 30 is located, and the preset distance is rather small. For example, the support column 80 in the vertical direction of the plane where the substrate 30 is located and at least part of the first short side in the vertical direction of the plane where the substrate 30 is located overlap.

Referring to FIGS. 28 to 31, in the case where the first included angle α1 is equal to the second included angle α2, the third included angle β1 is equal to the fourth included angle β2, and as the first included angle α1 and the third included angle β1 gradually decrease, the second long side 221 of the second virtual trapezoid 22 gradually becomes longer, the first short side 213 of the first virtual trapezoid 21 becomes shorter accordingly, and the distance from the support column 80 to the pixel opening 43 corresponding to the first sub-pixel 11 on the first short side 213 or the pixel opening 43 corresponding to the second sub-pixel 12 on the first short side 213 becomes shorter, the problem of color shift or impurities falling into the pixel opening is prone to occur. Therefore, to ensure the process yield, in addition to the preceding two design values, the distance between the pixel opening 43 of the third sub-pixel 13 and the support column 80 needs to satisfy a minimum design value.

Figure 32:
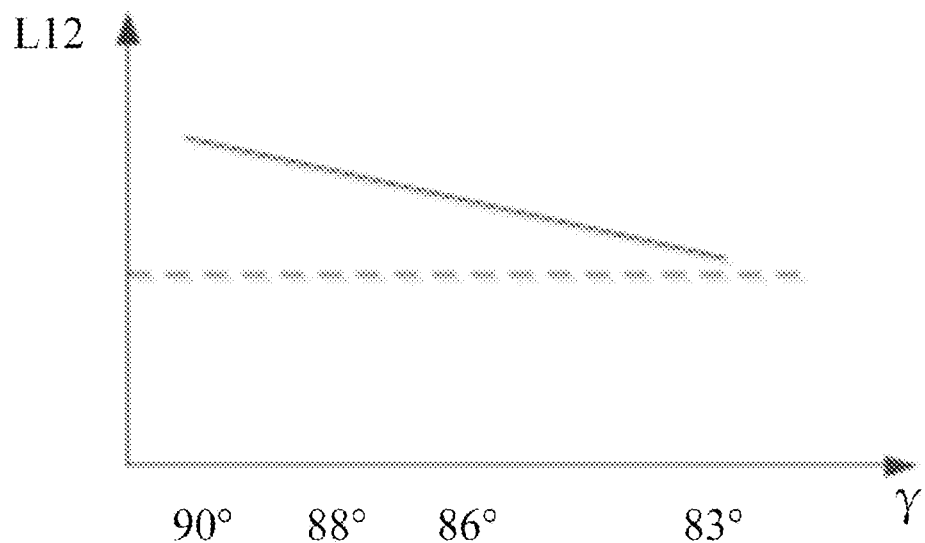
FIG. 32 is a diagram illustrating the relationship between an angel and a distance between pixel openings of a first sub-pixel and a second sub-pixel corresponding to a second long side according to an embodiment of the present application.
Figure 33:
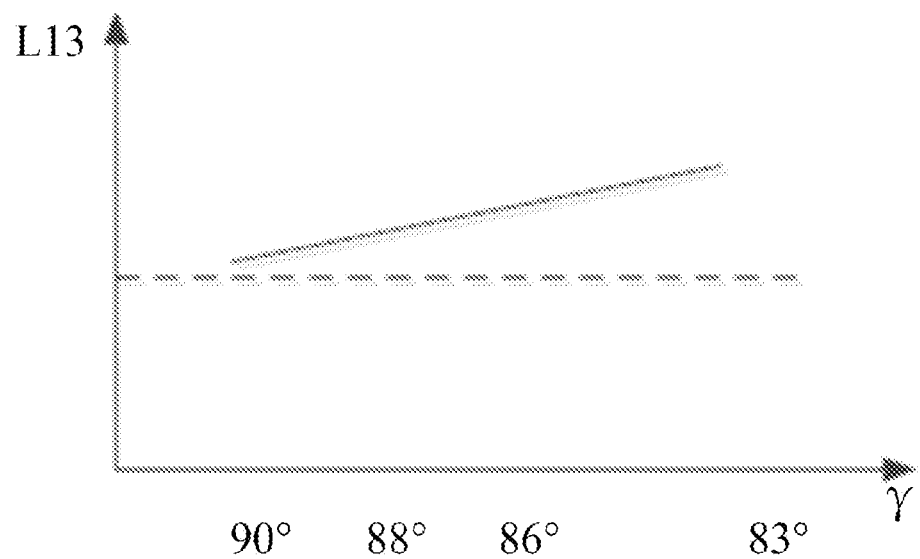
FIG. 33 is a diagram illustrating the relationship between an angel and distances from a support column to pixel openings of a first sub-pixel and a second sub-pixel corresponding to a second long side according to an embodiment of the present application.
Figure 34:
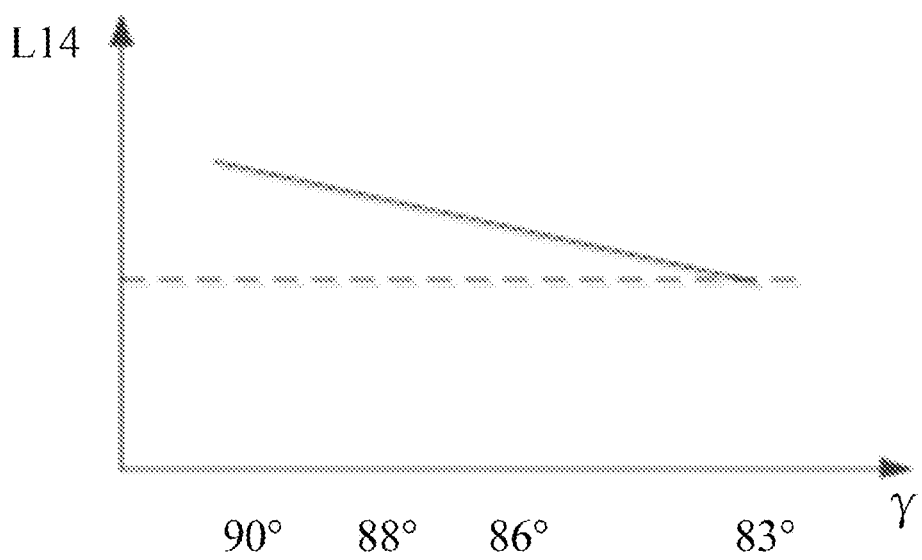
FIG. 34 is a relationship diagram of a distance from a support column to a pixel opening of a third sub-pixel in a second virtual trapezoid according to an embodiment of the present application.

In conjunction with FIGS. 32 to 34, FIG. 32 is a diagram illustrating the relationship between an angel and a distance between pixel openings of a first sub-pixel and a second sub-pixel corresponding to a second long side according to an embodiment of the present application, FIG. 33 is a diagram illustrating the relationship between an angel and distances from a support column to pixel openings of a first sub-pixel and a second sub-pixel corresponding to a second long side according to an embodiment of the present application, and FIG. 34 is a relationship diagram of a distance from a support column to a pixel opening of a third sub-pixel in a second virtual trapezoid according to an embodiment of the present application. In FIG. 32, an abscissa y denotes an angle, and an ordinate L12 denotes a distance between the pixel openings of the first sub-pixel and the second sub-pixel corresponding to the second long side in the case where the first included angle α1 and the second included angle α2 are equal, and the third included angle β1 and the fourth included angle β2 are equal, which are 90°, 88°, 86°, and 83°. In FIG. 33, an abscissa y denotes an angle, and an ordinate L13 denotes a distance from the support column to each of the pixel openings of the first sub-pixel and the second sub-pixel corresponding to the second long side in the case where the first included angle α1 and the second included angle α2 are equal, and the third included angle β1 and the fourth included angle β2 are equal, which are 90°, 88°, 86°, and 83°. In FIG. 34, an abscissa y denotes an angle, and an ordinate L14 denotes a distance from the support column to the pixel opening of the third sub-pixel in the second virtual trapezoid in the case where the first included angle α1 and the second included angle α2 are equal, and the third included angle β1 and the fourth included angle β2 are equal, which are 90°, 88°, 86°, and 83°.

Referring to FIGS. 28 to 31 and FIG. 32, as the first included angle α1 and the third included angle β1 each gradually decrease, the distance between the pixel openings 43 of the first sub-pixel 11 and the second sub-pixel 12 gradually decreases and reaches the process design value when the included angles are 83°.

Referring to FIGS. 28 to 31 and FIG. 33, as the first included angle α1 and the third included angle β1 both gradually decrease, the distances from the support column 80 to the pixel opening 43 corresponding to the first sub-pixel 11 and the pixel opening 43 corresponding to the second sub-pixel 12 gradually become longer, and the yield design value is satisfied when the included angles are 90°.

Referring to FIGS. 28 to 31 and FIG. 34, as the first included angle α1 and the third included angle β1 both gradually decrease, the distance between the pixel opening of the third sub-pixel 13 and the support column 80 gradually decreases and reaches the minimum design value when the included angles are 83°.

In the case where the first included angle α1 and the third included angle β1 each are 86°, the distances of these three aspects all exceed the design value and the process yield is the best.

It is to be noted that the number of the support columns 80 may be determined according to the actual process, and this embodiment does not limit the number of the support columns 80.

It is to be noted that in the preceding examples, only the case where the first included angle α1, the second included angle α2, the third included angle β1, and the fourth included angle β2 are equal is used as an example. However, the present application is not limited to this. In other optional embodiments, it is also feasible that the first included angle α1 is equal to the second included angle α2, and the third included angle β1 is equal to the fourth included angle β2, but the first included angle α1 is greater than the third included angle β1.

In an embodiment, with continued reference to FIG. 27, the closest distance from the support column 80 to the pixel opening 43 is an eleventh distance L11, where a length value of the eleventh distance L11 is greater than or equal to 4.5 μm. In this manner, after the support column 80 is scratched, debris can be prevented from falling into the pixel opening 43 and affecting the display.

Based on the preceding embodiments, in an embodiment, with continued reference to FIGS. 2 and 3, the second long side 221 and the second short side 223 each are parallel to a second direction Y, where the second direction Y is the column direction.

It is considered that in the actual evaporation process, an evaporation machine is provided with angle plates in the second direction Y, while the evaporation machine is not provided with the angle plates in a first direction X. In the case where the angle plates are disposed in the second direction Y, when the light-emitting layer corresponding to each sub-pixel arranged in the second direction Y is evaporated, the evaporation accuracy is high so that the luminescent material of the light-emitting layer of the first sub-pixel can be prevented from falling into the pixel opening corresponding to the second sub-pixel; or the luminescent material of the light-emitting layer of the second sub-pixel can be prevented from falling into the pixel opening corresponding to the first sub-pixel. In the case where the angle plates are not disposed in the first direction X, the evaporation accuracy is relatively low. In this embodiment, the distance between the first sub-pixel 11 and the second sub-pixel 12 in a direction (the first direction X) where the angle plates are not disposed, that is, in the first direction X, the centers of the first sub-pixel 11 and the second sub-pixel 12 respectively overlap with two end points of the oblique side of the second virtual trapezoid 22. Compared with the case where the centers of the first sub-pixel 11 and the second sub-pixel 12 overlap with two end points of the short side of the rectangle (such as the "diamond" arrangement), the distance between the second sub-pixel 12 and the first sub-pixel 11 is increased; even if the angle plates are not disposed in the first direction X, the evaporation accuracy can still be improved so that the luminescent material of the light-emitting layer of the first sub-pixel 11 can be prevented from falling into the pixel opening corresponding to the second sub-pixel 12; or the luminescent material of the light-emitting layer of the second sub-pixel 12 can be prevented from falling into the pixel opening corresponding to the first sub-pixel 11.

In an embodiment, with continued reference to FIGS. 2 and 3, the first long side 211 and the first short side 213 each are parallel to the first direction X, and the first direction X is the row direction. In this manner, it can be ensured that the arrangement of the sub-pixels is compact, and the display effect of the display panel is improved.

Figure 35:
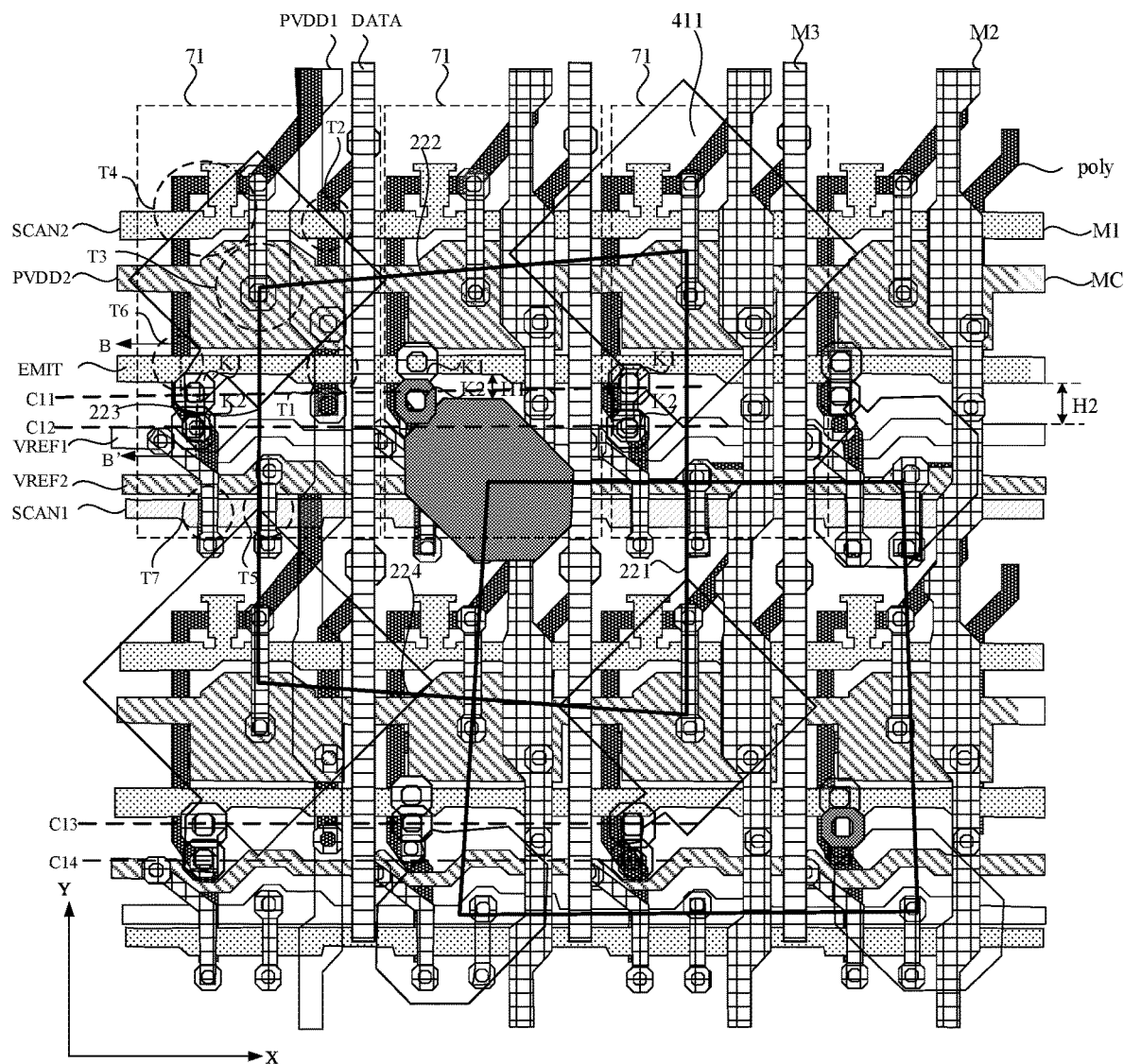
FIG. 35 is a partial structure diagram of another display panel according to an embodiment of the present application.
Figure 36:
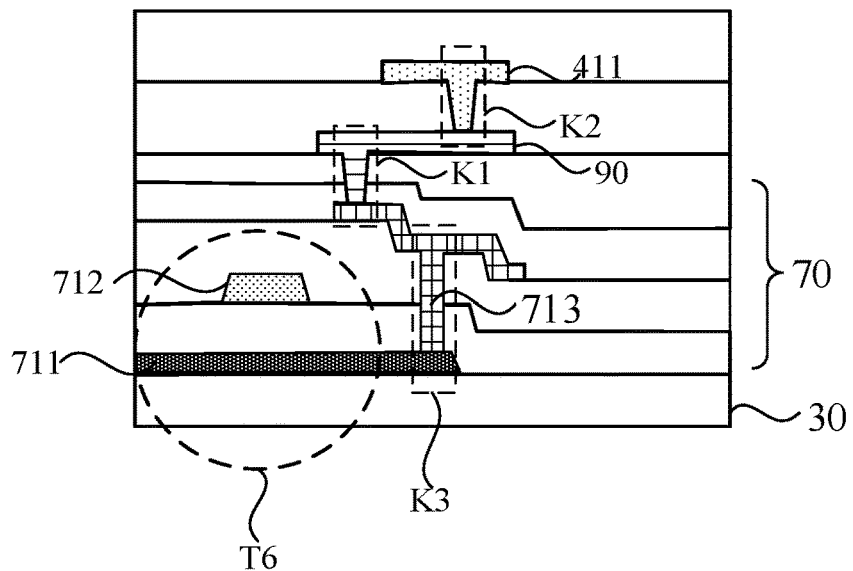
FIG. 36 is a sectional diagram taken along a direction B-B' of FIG. 35.

In an embodiment, FIG. 35 is a partial structure diagram of another display panel according to an embodiment of the present application, and FIG. 36 is a sectional diagram taken along a direction B-B' of FIG. 35. Referring to FIGS. 35 and 36, the display panel includes a substrate 30, a pixel circuit layer 70, and a display layer. The pixel circuit layer 70 is disposed on a side of the substrate 30 and includes multiple pixel circuits 71. The display layer is disposed on a side of the pixel circuit layer 70 facing away from the substrate and includes multiple light-emitting elements. Each of the multiple pixel circuits 71 is electrically connected to a respective one of the multiple light-emitting elements. In an embodiment, the pixel circuit 71 is electrically connected to the anode 411 of the light-emitting element; and the sub-pixel includes the light-emitting element and the pixel circuit 71, where the pixel circuit 71 is electrically connected to a connection portion 90 through a first via hole K1, and the connection portion 90 is electrically connected to the anode 411 of the light-emitting element through a second via hole K2, where the first via holes K1 and the second via holes K2 of at least part of the sub-pixels are arranged in the second direction Y, where the second direction Y includes the row direction, or the second direction Y includes the column direction.

It is to be noted that only the structures of the pixel circuits 71 and the anodes of the light-emitting elements are shown in FIG. 35, and other structures of the light-emitting elements are not shown. It is to be further noted that the cross section (indicated by the dashed lines) in FIG. 35 is only an example. It is to be further noted that the second direction Y may be the column direction, and the second direction Y may also be the row direction. In FIG. 35, the case where the second direction Y is the column direction is used as an example for description.

Figure 37:
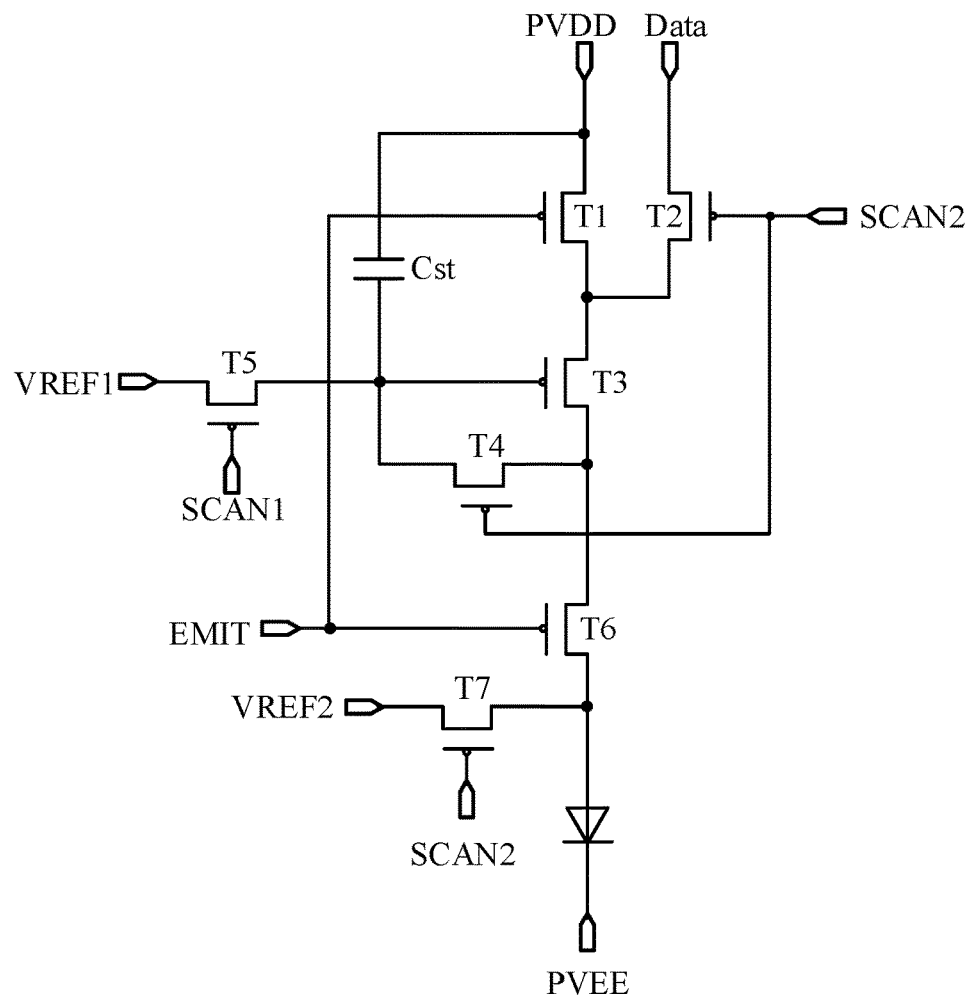
FIG. 37 is a circuit diagram of a pixel driver circuit according to an embodiment of the present application.

In an embodiment, with continued reference to FIGS. 35 and 36, the pixel circuit 71 corresponding to each sub-pixel includes multiple transistors and at least one capacitor. In FIG. 35, the case where the pixel circuit 71 includes seven transistors and one capacitor is used as an example for description. In the case where the pixel circuit 71 includes seven transistors and one capacitor, in an embodiment, FIG. 37 is a circuit diagram of a pixel driver circuit according to an embodiment of the present application. As shown in FIG. 37, the seven transistors and the one capacitor may be a drive transistor T3, a data write transistor T2, a threshold compensation transistor T4, a first reset transistor T5, a second reset transistor T7, a first light emission control transistor T1, a second light emission control transistor T6, and a storage capacitor Cst, respectively. In an embodiment, with continued reference to FIGS. 35 and 37, the display panel further includes a data signal line Data, a first power supply line PVDD, a second power supply line (not shown in the figure), a first scan line SCAN1, a second scan line SCAN2, a light emission control signal line EMIT, a first reset signal line VREF1, and a second reset signal line VREF2 A first pole of the first light emission control transistor T1 is electrically connected to the first power supply line PVDD. A first pole of the data write transistor T2 is electrically connected to the data signal line Data. A gate of the data write transistor T2 and a gate of the threshold compensation transistor T4 may be respectively electrically connected to the second scan line SCAN2. A first pole of the first reset transistor T5 is electrically connected to the first reset signal line VREF1. A first pole of the second reset transistor T7 is electrically connected to the second reset signal line VREF2. A gate of the first reset transistor T5 and a gate of the second reset transistor T7 are respectively electrically connected to the first scan line SCAN1. A gate of the first light emission control transistor T1 and a gate of the second light emission control transistor T6 may be respectively electrically connected to the light emission control signal line EMIT. The driving principle of the pixel circuit 71 is similar to the driving principle of a 7T1C pixel driver circuit in the related art, which will not be repeated herein.

Referring to FIG. 35, the display panel includes a semiconductor layer poly, a first metal layer M1, a second metal layer MC, a third metal layer M2, a fourth metal layer M3, and insulating layers located between the metal layers. In an embodiment, the first scan line SCAN1, the second scan line SCAN2, and the light emission control signal line EMIT are located in the first metal layer M1, the first reset signal line VREF1 and the second reset signal line VREF2 are located in the second metal layer MC, the first power supply line PVDD is located in the third metal layer M2, and the data signal line Data is located in the fourth metal layer M3. A first electrode 713 of the second light emission control transistor T6 is electrically connected to a first electrode region of an active layer 711 through a third via hole K3, where the first electrode 713 may be a source electrode or a drain electrode, and correspondingly, the first electrode region may be a source electrode region or a drain electrode region, which is not specifically limited in this embodiment. With continued reference to FIG. 36, the first electrode 713 is electrically connected to the connection portion 90 through the first via hole K1, and the connection portion 90 is electrically connected to the anode 411 of the light-emitting element through the second via hole K2. In this manner, the pixel circuit 71 supplies the current to the light-emitting element, to drive the light-emitting element to emit light. The connection portion 90 is disposed so that the punching depth can be reduced and thus the punching difficulty can be reduced. The third via hole K3 penetrates the insulating layer between the semiconductor layer poly and the first metal layer M1 and the insulating layer between the first metal layer M1 and the second metal layer MC so that the first electrode 713 located in the second metal layer M2 is electrically connected to the first electrode region of the active layer 711 through the third via hole K3. The first via hole K1 penetrates the insulating layer between the third metal layer M2 and the second metal layer MC so that the first electrode 713 is electrically connected to the connection portion 90 through the first via hole K1. The second via hole K2 penetrates the insulating layer between the third metal layer M2 and the fourth metal layer M3 so that the connection portion 90 is electrically connected to the anode 411 of the light-emitting element through the second via hole K2.

In this embodiment, the first via holes K1 and the second via holes K2 of at least part of the sub-pixels are arranged in the second direction Y so that the second via hole K2 and the third via hole K3 overlap. Compared with the case where each via hole needs to occupy a certain region, in this embodiment, the area occupied by the via hole can be reduced, and more space can be freed up to achieve light transmission so that the light transmittance of the fingerprint identification region under the screen can be improved, the amount of fingerprint signal can be increased, and the unlocking speed can be improved.

It is to be noted that the present application does not specifically limit the pixel circuit and the signal line electrically connected to the pixel circuit, and FIG. 35 is only an example.

It is to be noted that generally, in a layout of the "diamond" pixel arrangement, multiple first sub-pixels and second sub-pixels form a first virtual square, and the first virtual square includes a first upper side, a first lower side, a first left side, and a first right side; multiple third sub-pixels form a second virtual square, and the second virtual square includes a second upper side, a second lower side, a second left side, and a second right side. The centers of the first sub-pixel and the second sub-pixel located on the first upper side are on the same straight line, and the pixel opening area of the first sub-pixel is less than the pixel opening area of the second sub-pixel. Therefore, the second via hole K2 of the first sub-pixel is close to the light emission control signal line EMIT relative to the second via hole K2 of the second sub-pixel, and the distance between the first via hole K1 of the first sub-pixel and the light emission control signal line EMIT is basically unchanged relative to the first via hole K1 of the second sub-pixel. The relative positional relationship and layout design of the first via holes K1 and the second via holes K2 of the first sub-pixel and the second sub-pixel on the first lower side are basically the same as the relative positional relationship and layout design of the first via holes K1 and the second via holes K2 of the first sub-pixel and the second sub-pixel on the first upper side, which will not be repeated herein. At the same time, among two third sub-pixels on the second upper side, the space between the third sub-pixel located in the first virtual square and the light emission control signal line EMIT is rather small, and the first via hole K1 and the second via hole K2 cannot be disposed. Therefore, the first via hole K1 and the second via hole K2 overlap with the light emission control signal line EMIT in the vertical direction of the substrate.

In the case where the virtual square is changed to a virtual trapezoidal structure, for example, two first sub-pixels corresponding to the second virtual trapezoid may move downward so that the second virtual trapezoid is formed; for example, two third sub-pixels corresponding to the long side of the first virtual trapezoid move in a direction toward the edge of the display panel, two third sub-pixels corresponding to the short side of the first virtual trapezoid move in a direction farther away from the edge of the display panel so that the first virtual trapezoid is obtained.

With continued reference to FIG. 35, as described above, the display panel further includes the light emission control signal line EMIT; the third sub-pixel located in the second virtual trapezoid marked in the figure moves in a direction toward the second long side of the second virtual trapezoid so that a certain distance between the light emission control signal line EMIT and the left side of the anode 411 corresponding to the third sub-pixel exists. Therefore, compared with the "diamond" pixel arrangement, the second via hole K2 may move to the bottom of the first via hole K1. At the same time, the third sub-pixel is designed with cut corners so that an unblocked region is formed in this region, and the distance between the light emission control signal line EMIT and the anode 411 corresponding to the third sub-pixel is a first preset distance H1. The advantage of this arrangement is that more space can be freed up to achieve light transmission so that the light transmittance of the fingerprint identification region under the screen can be improved and thus the fingerprint identification effect can be improved. In addition, since a certain distance between the light emission control signal line EMIT and the left side of the anode 411 corresponding to the third sub-pixel exists, the first via hole K1 and the second via hole K2 corresponding to the third sub-pixel are arranged in the second direction, and thus the second via hole K2 and the third via hole K3 overlap. In this manner, the area occupied by the via hole can be further reduced, thereby improving the light transmittance of the fingerprint identification region under the screen, increasing the amount of fingerprint signal, and improving the unlocking speed. The third sub-pixel located in the second virtual trapezoid marked in the figure is compared with the third sub-pixel on the second long side of the second virtual trapezoid on the same diagonal, the layout designs of the first via holes K1 and the second via holes K2 of the two third sub-pixels are basically the same, and the movement directions of the two third sub-pixels are basically the same, which will not be repeated herein. In an embodiment, with continued reference to FIG. 35, the first via holes K1 and the second via holes K2 of all the sub-pixels are arranged in the second direction Y so that the second via holes K2 and the third via holes K3 of all the sub-pixels overlap. In this embodiment, the area occupied by the via hole can be further reduced, thereby improving the light transmittance of the fingerprint identification region under the screen, increasing the amount of fingerprint signal, and improving the unlocking speed.

In an embodiment, with continued reference to FIG. 35, a vertical projection of the second via hole K2 of the third sub-pixel on the plane where the substrate 30 is located is located between the light emission control signal line EMIT and a vertical projection of the anode 411 corresponding to the third sub-pixel on the plane where the substrate 30 is located. In an embodiment, the vertical projection of the second via hole K2 of the third sub-pixel on the plane where the substrate 30 is located is located on a side of the first via hole K1 closer to the anode 411 corresponding to the third sub-pixel.

In an embodiment, with continued reference to FIGS. 35 and 36, the display panel includes a substrate 30, a pixel circuit layer 70, and a display layer. The pixel circuit layer 70 is disposed on a side of the substrate 30 and includes multiple pixel circuits 71. The display layer is disposed on a side of the pixel circuit layer 70 facing away from the substrate and includes multiple light-emitting elements. Each of the multiple pixel circuits 71 is electrically connected to a respective one of the multiple light-emitting elements; and the sub-pixel includes the light-emitting element and the pixel circuit 71. The pixel circuit 71 is electrically connected to the connection portion 90 through the first via hole K1, and the connection portion 90 is electrically connected to the anode 411 of the light-emitting element through the second via hole K2. The first via hole K1 of the second sub-pixel and the first via hole K1 of the first sub-pixel corresponding to the third oblique side 222 are located on an eleventh virtual line C11, and the eleventh virtual line C11 extends in the first direction X. The second via hole K2 of the second sub-pixel and the second via hole K2 of the first sub-pixel corresponding to the third oblique side 222 are located on a twelfth virtual line C12, and the twelfth virtual line C12 extends in the first direction X. The first via hole K1 of the second sub-pixel and the first via hole K1 of the first sub-pixel corresponding to the fourth oblique side 224 are located on a thirteenth virtual line C13, and the thirteenth virtual line C13 extends in the first direction X. The second via hole K2 of the second sub-pixel and the second via hole K2 of the first sub-pixel corresponding to the fourth oblique side 224 are located on a fourteenth virtual line C14, and the fourteenth virtual line C14 extends in the first direction X. The first direction X includes the row direction, or the first direction X includes the column direction. In FIG. 35, the case where the first direction X is the row direction is used as an example for description. The advantage of this arrangement is that the arrangement of the via holes is simple so that the preparation difficulty can be reduced.

In an embodiment, with continued reference to FIG. 35, the display panel further includes a reset signal line and a light emission control signal line EMIT. The reset signal line may be the two mentioned above, that is, the first reset signal line VREF1 and the second reset signal line VREF2, that is, one row of sub-pixels correspond to two reset signal lines. As shown in FIG. 22; in other optional embodiments, one reset signal line is also feasible, that is, one row of sub-pixels corresponds to one reset signal line.

With continued reference to FIGS. 35 and 36, a distance between the reset signal line and the light emission control signal line EMIT is a second preset distance H2. In FIG. 23, the case where the distance between the first reset signal line VREF1 and the light emission control signal line EMIT is the second preset distance H2 is used as an example for description. In an embodiment, the display panel further includes a substrate 30, a pixel circuit layer 70, and a display layer. The pixel circuit layer 70 is disposed on a side of the substrate 30 and includes multiple pixel circuits 71. The display layer is disposed on a side of the pixel circuit layer 70 facing away from the substrate and includes multiple light-emitting elements. Each of the multiple pixel circuits 71 is electrically connected to a respective one of the multiple light-emitting elements; and the sub-pixel includes the light-emitting element and the pixel circuit 71. The pixel circuit 71 is electrically connected to the connection portion 90 through the first via hole K1, and the connection portion 90 is electrically connected to the anode 411 of the light-emitting element through the second via hole K2. The first via hole K1 and the second via hole K2 of the first sub-pixel and the first via hole K1 and the second via hole K2 of the second sub-pixel are disposed between the reset signal line and the light emission control signal line EMIT.

Referring to FIG. 35, the first sub-pixel 11 corresponding to the second short side 223 of the second virtual trapezoid 22 is offset compared to the "diamond" arrangement. For example, in FIG. 35, the first sub-pixel 11 moves in the −Y direction. In the case where the first sub-pixel moves downward, to ensure that the structure in the pixel circuit keeps unchanged, that is, the design of the pixel circuit layer keeps unchanged, the position of the second via hole K2 may move in a direction from the light emission control signal line EMIT to the reset signal line, that is, the first via hole K1 and the second via hole K2 of the first sub-pixel and the first via hole K1 and the second via hole K2 of the second sub-pixel are disposed between the reset signal line and the light emission control signal line EMIT. In this manner, it can be ensured that while the design of the pixel circuit keeps unchanged, the first via hole K1 and the first reset signal line VREF1 can be prevented from being short-circuited when the first via hole K1 moves.

In an embodiment, the first via hole K1 and the second via hole K2 corresponding to the first sub-pixel each are disposed on a side of the light emission control signal line EMIT facing away from the anode 411 corresponding to the first sub-pixel, and the first via hole K1 and the second via hole K2 corresponding to the second sub-pixel each are disposed on a side of the light emission control signal line EMIT facing away from the anode 411 corresponding to the second sub-pixel.

In an embodiment, with continued reference to FIG. 35, among the first sub-pixel and the second sub-pixel, the second via hole K2 is disposed on a side of the first via hole K1 closer to the reset signal line. While it is ensured that the original design of the pixel circuit is unchanged, the second via hole K2 and the first via hole K1 may be arranged in the second direction Y so that the area occupied by the via hole is reduced, thereby improving the light transmittance of the fingerprint identification region under the screen, increasing the amount of fingerprint signal, and improving the unlocking speed. For the specific principle, please refer to the preceding description, which will not be repeated herein.

Figure 38:
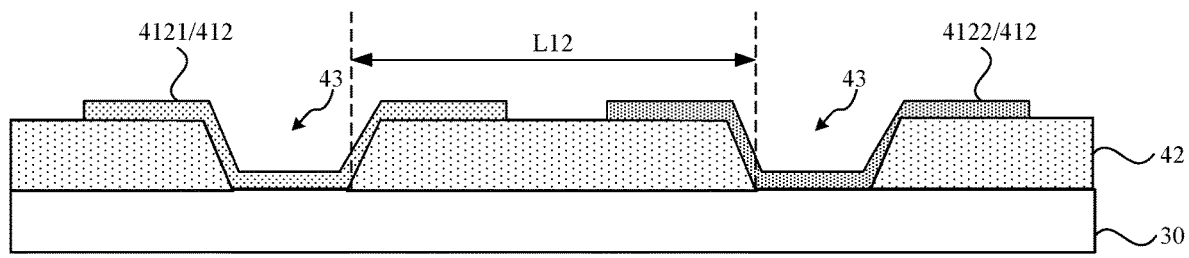
FIG. 38 is a structure diagram of part of a film layer of another display panel according to an embodiment of the present application.

Based on the same inventive concept, the embodiments of the present application further provide a display panel. In this embodiment, explanations of terms that are the same as or corresponding to those in the preceding embodiments will not be repeated herein. In an embodiment, FIG. 38 is a structure diagram of part of a film layer of another display panel according to an embodiment of the present application. As shown in FIG. 38, the display panel further includes a substrate 30 and a display layer 40. The display layer 40 is disposed on a side of the substrate 30 and includes a pixel defining layer 42 and multiple light-emitting elements. The pixel defining layer 42 includes multiple pixel openings 43, the multiple pixel openings 43 and the multiple light-emitting elements are arranged in one-to-one correspondence, and each of the multiple light-emitting elements includes a light-emitting layer 412. A ratio of a length of the light-emitting layer 412 in the first direction to a length of the light-emitting layer 412 in the second direction is different from a ratio of a length of the pixel opening 43 corresponding to the light-emitting layer 412 in the first direction to a length of the pixel opening 43 corresponding to the light-emitting layer 412 in the second direction.

Figure 39:
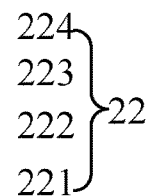
FIG. 39 is a partial structure diagram of another display panel according to an embodiment of the present application.
Figure 39:
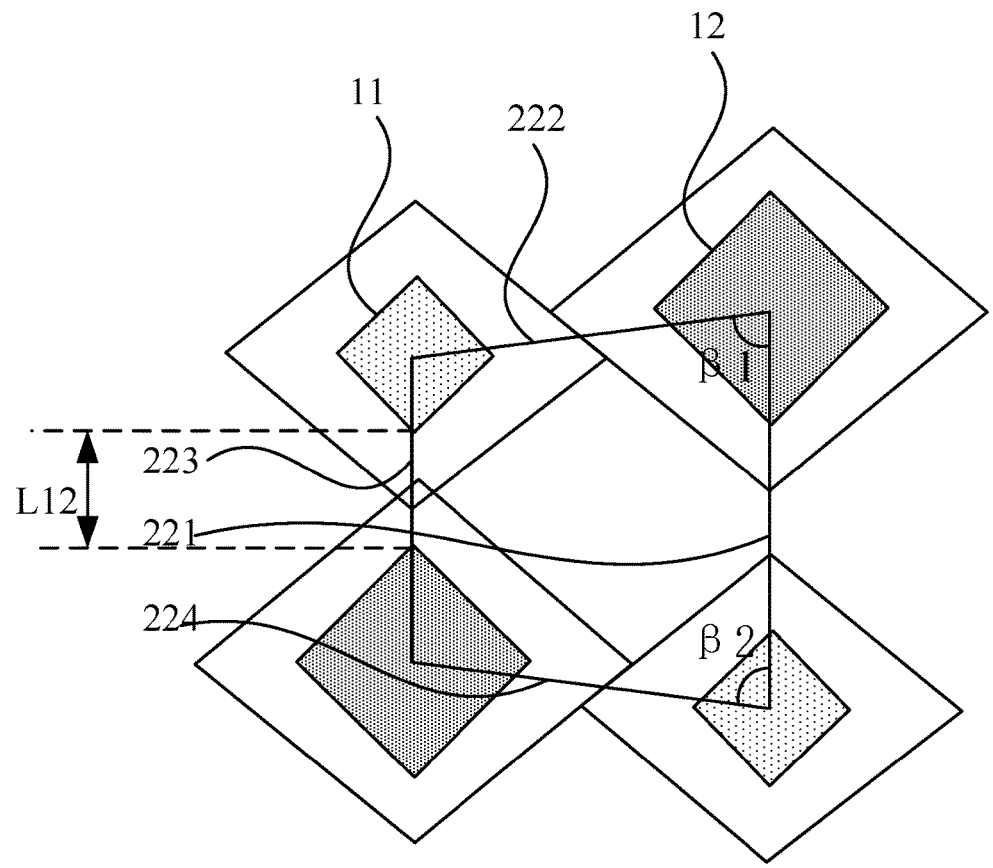

FIG. 39 is a partial structure diagram of another display panel according to an embodiment of the present application. As shown in FIG. 39, the display panel 100 further includes multiple first sub-pixels 11 and multiple second sub-pixels 12. The multiple first sub-pixels and the multiple second sub-pixels form the second virtual trapezoid 22, the centers of the multiple second sub-pixels 12 are located at first vertices of the second virtual trapezoid 22, and the centers of the multiple first sub-pixels 11 are located at second vertices of the second virtual trapezoid 22, where the first vertices and the second vertices alternate and are spaced apart; and the second virtual trapezoid includes the second long side, the third oblique side, the second short side, and the fourth oblique side, and the second long side of the second virtual trapezoid extends in the second direction.

It is to be noted that FIG. 38 only shows the light-emitting layers 412 of the light-emitting elements, that is, a first light-emitting layer 4121 corresponding to the first sub-pixel 11 and a second light-emitting layer 4122 corresponding to the second sub-pixel 12.

For example, the first direction is the row direction, and the second direction is the column direction.

Figure 40:
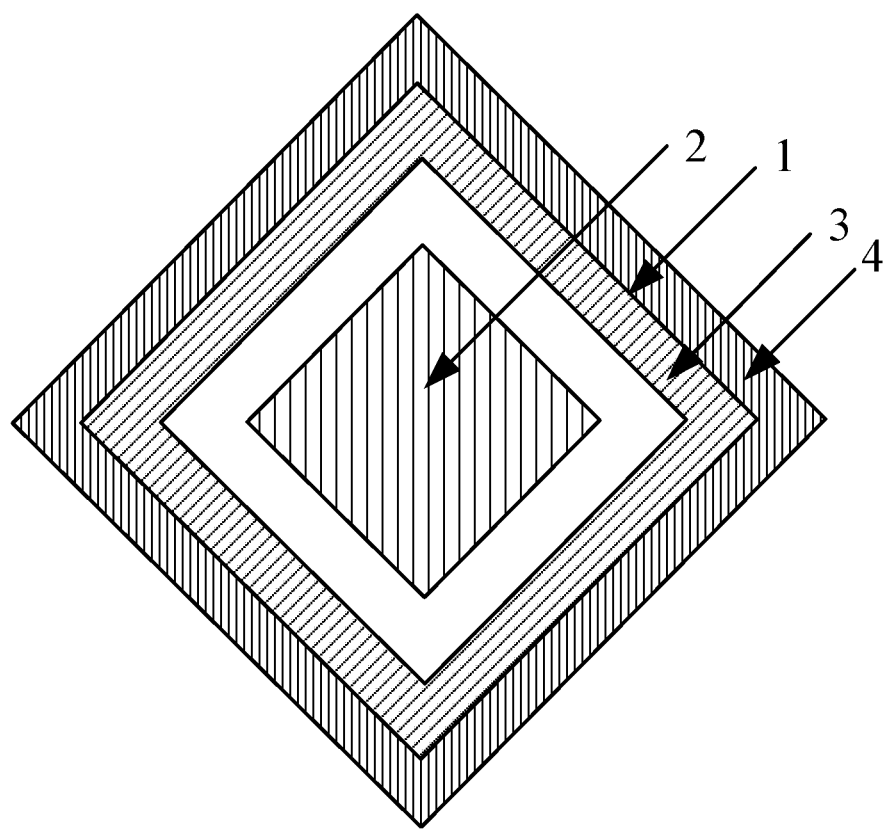
FIG. 40 is a schematic diagram of a principle of evaporating a light-emitting layer according to an embodiment of the present application.

FIG. 40 is a schematic diagram of a principle of evaporating a light-emitting layer according to an embodiment of the present application. As shown in FIG. 40, a quadrilateral indicated by arrow 1 is a mask opening corresponding to a mask, and a quadrilateral indicated by arrow 2 is the pixel opening, where a certain distance exists between the mask opening and the pixel opening. When the light-emitting layer is evaporated into the pixel opening 43 through an evaporation source and the mask, the luminescent material sprayed from nozzles of the evaporation source is scattered; in addition, a certain distance between the mask and the pixel defining layer 42 exists. Therefore, the luminescent material drifts through the mask opening of the mask in a direction from the mask opening to the pixel opening, as shown in a region indicated by arrow 3 in FIG. 40; at the same time, the luminescent material drifts in a direction from the pixel opening to the mask opening, as shown in a region indicated by arrow 4 in FIG. 40. In the case where the luminescent material drifts through the mask opening of the mask in the direction from the mask opening to the pixel opening, if the luminescent material drifts into the pixel opening, the thickness of the light-emitting layer in the pixel opening is uneven, which affects subsequent light emission. In the case where the luminescent material drifts through the mask opening of the mask in the direction from the pixel opening to the mask opening, the luminescent material may drift into adjacent pixel openings, which causes color mixing. In addition, in the case where the mask is disposed above the pixel opening, misalignment may occur. That is, considering that the luminescent material drifts through the mask opening to other regions except the pixel opening and the misalignment occurs, a certain distance (design value) between adjacent pixel openings needs to be satisfied, to ensure the yield of evaporating the light-emitting layer.

In the process of evaporating the light-emitting layer, the evaporation machine is provided with angle plates in the second direction, while the evaporation machine is not provided with the angle plates in the first direction. In the case where the angle plates are disposed in the second direction, since the angle plates can limit the drift of the scattered luminescent material, the evaporation accuracy is relatively high; in the case where the angle plates are not disposed in the first direction, the evaporation accuracy is relatively low. If the shape of the pixel opening is square, the ratio of the length of the light-emitting layer 412 in the first direction to the length of the light-emitting layer 412 in the second direction is greater than the ratio of the length of the pixel opening 43 corresponding to the light-emitting layer 412 in the first direction to the length of the pixel opening 43 corresponding to the light-emitting layer 412 in the second direction. In an embodiment, the length of the pixel opening 43 in the first direction is equal to the length of the pixel opening 43 in the second direction, and the length of the light-emitting layer 412 in the first direction is greater than the length of the light-emitting layer 412 in the second direction. For example, the ratio of the length of the pixel opening 43 in the first direction to the length of the pixel opening 43 in the second direction is 1:1, and the ratio of the length of the light-emitting layer 412 in the first direction to the length of the light-emitting layer 412 in the second direction is 1.1:1.

Since in the first direction, the length of the light-emitting layer 412 in the first direction is greater than the length of the light-emitting layer 412 in the second direction, that is, in the first direction, in the case where the light-emitting layer 412 corresponding to an adjacent sub-pixel is evaporated, the luminescent material corresponding to two adjacent light-emitting layers 412 (the first light-emitting layer 4121 corresponding to the first sub-pixel 11 and the second light-emitting layer 4122 corresponding to the second sub-pixel 12) and even the luminescent material corresponding to the first light-emitting layer 4121 drifts into the pixel opening 43 corresponding to the adjacent second sub-pixel 12, and/or the luminescent material corresponding to the second light-emitting layer 4122 drifts into the pixel opening 43 corresponding to the adjacent first sub-pixel 11, and color mixing occurs, thereby causing a low yield of evaporating the light-emitting layer. Therefore, in this embodiment, in the first direction, the centers of the first sub-pixel 11 and the second sub-pixel 12 adjacent to each other are located on the oblique side of the second virtual trapezoid 22, thereby increasing the distance between the second sub-pixel 12 and the first sub-pixel 11. In this manner, even if the angle plates are not disposed in the first direction, the evaporation accuracy can still be improved.

In an embodiment, the shape of the light-emitting layer 214 includes a rhombus. Along axis of the rhombus extends in the first direction, and a short axis of the rhombus extends in the second direction.

Figure 41:
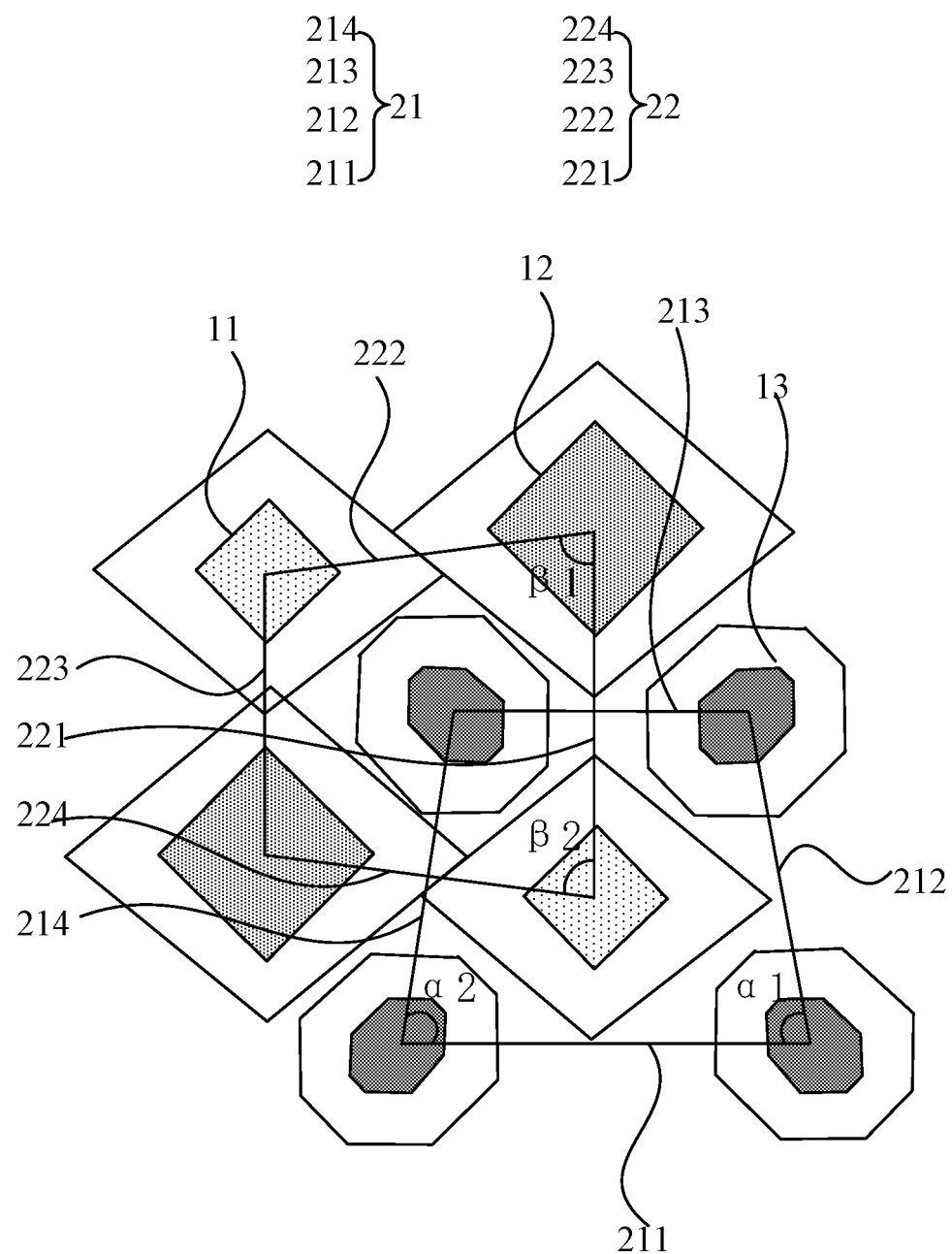
FIG. 41 is a partial structure diagram of another display panel according to an embodiment of the present application.

In an embodiment, FIG. 41 is a partial structure diagram of another display panel according to an embodiment of the present application. As shown in FIG. 41, the display panel further includes multiple third sub-pixels 13. The multiple third sub-pixels 13 form the first virtual trapezoid 21, the centers of the multiple third sub-pixels 13 are respectively located at vertices of the first virtual trapezoid 21, the first sub-pixel 11 is located inside the first virtual trapezoid 21, and the third sub-pixel 13 is located in the second virtual trapezoid 22. The first virtual trapezoid 21 includes the first long side 211, the first oblique side 212, the first short side 213, and the second oblique side 214 that are sequentially connected. The first long side 211 and the first oblique side 212 form the first included angle α1, and the first long side 211 and the second oblique side 214 form the second included angle α2; the second long side 221 and the third oblique side 222 form the third included angle β1, and the second long side 221 and the fourth oblique side 224 form the fourth included angle β2. The sum of the first included angle α1 and the second included angle α2 is the first angle, the sum of the third included angle β1 and the fourth included angle β2 is the second angle, and the difference between the first angle and the second angle is within the first preset range.

In this embodiment, the sum of the first included angle α1 and the second included angle α2 is the first angle, the sum of the third included angle β1 and the fourth included angle β2 is the second angle, and the difference between the first angle and the second angle is within the first preset range. In an embodiment, the first preset range may be greater than or equal to 0° and less than or equal to 10°. In an embodiment, the first preset range may be, for example, 0°, 5°, and 10°, that is, a better arrangement of the sub-pixels without apparent hollow regions can be ensured, thereby effectively avoiding apparent gaps, avoiding waste of space, and ensuring the display effect of the display panel 100.

The range of the first included angle $\alpha 1$ may satisfy, for example, $82° \leq \alpha 1 \leq 88°$, such as 82°, 83°, 84°, 85°, 86°, 87°, 88°, etc.; in an embodiment, the range of $\alpha 1$ satisfies $83° \leq \alpha 1 \leq 86°$, such as 83°, 86°, etc. The first long side 211 and the second oblique side 214 form the second included angle $\alpha 2$, where the range of the second included angle $\alpha 2$ may satisfy, for example, $82° \leq \alpha 2 \leq 88°$, such as 82°, 83°, 84°, 85°, 86°, 870, 88°, etc.; in an embodiment, the range of $\alpha 2$ satisfies $83° \leq \alpha 2 \leq 86°$, such as 83°, 86°, etc. The second long side 221 and the third oblique side 222 form the third included angle $\beta 1$, where the range of the third included angle $\beta 1$ may satisfy, for example, $82° \leq \beta 1 \leq 88°$, such as 82°, 83°, 84°, 85°, 86°, 87°, 88°, etc.; in an embodiment, the range of $\beta 1$ satisfies $83° \leq \beta 1 \leq 86°$, such as 83°, 86°, etc. The second long side 221 and the fourth oblique side 224 form the fourth included angle $\beta 2$, where the range of the fourth included angle $\beta 2$ may satisfy, for example, $82° \leq \beta 2 \leq 88°$, such as 82°, 83°, 84°, 85°, 86°, 87°, 88°, etc.; in an embodiment, the range of $\beta 2$ satisfies $83° \leq \beta 2 \leq 86°$, such as 83°, 86°, etc. In an embodiment, Table 4 describes the distance between pixel openings corresponding to two adjacent sub-pixels in cases where the size of the display region of the display panel in the first direction/the resolution of the display panel=59.2 μm, the first included angle $\alpha 1$ of the first virtual trapezoid 21, the second included angle $\alpha 2$ of the first virtual trapezoid 21, the third included angle $\beta 1$ of the second virtual trapezoid 22, and the fourth included angle $\beta 2$ of the second virtual trapezoid 22 are the same and equal to 90°, 88°, 86°, 83°, and 80°.

Considering that the luminescent material drifts through the mask opening to other regions except the pixel opening and the misalignment occurs, a certain distance (design value) between adjacent pixel openings needs to be satisfied, to ensure the yield of evaporating the light-emitting layer. In the case where the resolution of the display panel is constant, to design the second virtual trapezoid 22, the third oblique side, the fourth oblique side, and the second short side need to be considered. The third oblique side and the fourth oblique side each are disposed in the first direction, and the second short side is disposed in the second direction. In the description of Table 4 below, the distance between the pixel openings of the first sub-pixel and the second sub-pixel in the first direction specifically refers to the lengths of the third oblique side and the fourth oblique side; the distance between the pixel openings of the first sub-pixel and the second sub-pixel in the second direction specifically refers to the length of the second short side.

Since the angle plates are disposed in the second direction, the angle plates can limit the drift of the scattered luminescent material, and the evaporation shadow is relatively small; if the angle plates are not disposed in the first direction, the evaporation shadow is relatively large so that the distance (design value) that needs to be satisfied between adjacent pixel openings in the first direction is greater than the distance (design value) that needs to be satisfied between adjacent pixel openings in the second direction. Therefore, in the case where the size of the display region of the display panel in the first direction/the resolution of the display panel=59.2 μm, the design value in the first direction needs to be greater than or equal to 26 μm, and the design value in the second direction needs to be greater than or equal to 22 μm.

TABLE 4

| Angle | Design value (μm) | 90° | 88° | 86° | 83° | 80° |
|---|---|---|---|---|---|---|
| First direction (μm) | ≥26 | 24 | 24.93 | 25.69 | 28.46 | 29.33 |
| Second direction (μm) | ≥22 | 24 | 22.94 | 21.61 | 19.83 | 17.03 |

Referring to Table 4, in the case where the first included angle $\alpha 1$, the second included angle $\alpha 2$, the third included angle $\beta 1$, and the fourth included angle $\beta 2$ each are 90°, in the first direction, the distance between the pixel opening corresponding to the first sub-pixel and the pixel opening corresponding to the second sub-pixel is 24 μm, and in the second direction, the distance between the pixel opening corresponding to the first sub-pixel and the pixel opening corresponding to the second sub-pixel is 24 μm. That is, the distance between the pixel opening corresponding to the first sub-pixel and the pixel opening corresponding to the second sub-pixel in the first direction and the distance between the pixel opening corresponding to the first sub-pixel and the pixel opening corresponding to the second sub-pixel in the second direction both deviate relatively far from the design value, resulting in a low evaporation yield.

In the case where the first included angle $\alpha 1$, the second included angle $\alpha 2$, the third included angle $\beta 1$, and the fourth included angle $\beta 2$ each are 88°, since the first sub-pixel 11 and the second sub-pixel 12 form the second virtual trapezoid, the distance between the pixel opening corresponding to the first sub-pixel 11 and the pixel opening corresponding to the second sub-pixel 12 in the first direction is increased, corresponding to two oblique sides of the second virtual trapezoid, for example, 24.3 μm; and the distance between the pixel opening corresponding to the first sub-pixel and the pixel opening corresponding to the second sub-pixel in the second direction is reduced, corresponding to the second short side of the second virtual trapezoid, for example, 22.94 μm. The distances between the pixel opening corresponding to the first sub-pixel and the pixel opening corresponding to the second sub-pixel in the two directions both deviate from the design value, resulting in a low evaporation yield.

In the case where the first included angle $\alpha 1$, the second included angle $\alpha 2$, the third included angle $\beta 1$, and the fourth included angle $\beta 2$ each are 86°, in the first direction, the distance between the pixel opening corresponding to the first sub-pixel and the pixel opening corresponding to the second sub-pixel is increased from what is mentioned above and is, for example, 25.69 μm, and in the second direction, the distance between the pixel opening corresponding to the first sub-pixel and the pixel opening corresponding to the second sub-pixel is reduced from what is mentioned above and is, for example, 21.61 μm. That is, the distance between the pixel opening corresponding to the first sub-pixel and the pixel opening corresponding to the second sub-pixel in the first direction and the distance between the pixel opening corresponding to the first sub-pixel and the pixel opening corresponding to the second sub-pixel in the second direction each are near the design value, thereby significantly improving the evaporation yield. It is to be noted that the process error needs to be considered during the distance measurement. Therefore, being near the design value is the standard for the improvement of the evaporation yield.

In the case where the first included angle α1, the second included angle α2, the third included angle β1, and the fourth included angle β2 each are 83°, since the angles of the second virtual trapezoid are further reduced, in the first direction, the distance between the pixel opening corresponding to the first sub-pixel and the pixel opening corresponding to the second sub-pixel is increased from what is mentioned above and is, for example, 28.46 μm, and in the second direction, the distance between the pixel opening corresponding to the first sub-pixel and the pixel opening corresponding to the second sub-pixel is reduced from what is mentioned above and is, for example, 19.83 μm. Therefore, in the case where the included angles are 83°, the distance between the pixel opening corresponding to the first sub-pixel and the pixel opening corresponding to the second sub-pixel in the first direction is near the design value in the first direction, but the distance between the pixel opening corresponding to the first sub-pixel and the pixel opening corresponding to the second sub-pixel in the second direction is less than the design value in the second direction, and the evaporation yield is reduced.

In the case where the first included angle α1, the second included angle α2, the third included angle β1, and the fourth included angle β2 each are 80°, in the first direction, the distance between the pixel opening corresponding to the first sub-pixel and the pixel opening corresponding to the second sub-pixel is increased from what is mentioned above and is, for example, 29.33 μm, and in the second direction, the distance between the pixel opening corresponding to the first sub-pixel and the pixel opening corresponding to the second sub-pixel is reduced from what is mentioned above and is, for example, 17.03 μm; the distance between the pixel opening corresponding to the first sub-pixel and the pixel opening corresponding to the second sub-pixel in the second direction deviates further from the design value, and the evaporation yield is further reduced.

In the case where the first included angle α1, the second included angle α2, the third included angle β1, and the fourth included angle β2 each are 86°, the evaporation yield is the best.

It is to be noted that in the preceding examples, only the case where the first included angle α1, the second included angle α2, the third included angle β1, and the fourth included angle β2 are equal is used as an example. However, the present application is not limited to this. In other optional embodiments, it is also feasible that the first included angle α1 is equal to the second included angle α2, and the third included angle β1 is equal to the fourth included angle β2, but the first included angle α1 is greater than the third included angle β1.

In an embodiment, the first included angle α1 is equal to the second included angle α2, and the third included angle β1 is equal to the fourth included angle β2. That is, the first virtual trapezoid 21 is an isosceles trapezoid, and the second virtual trapezoid 22 is also an isosceles trapezoid. In this manner, the pixel arrangement is more uniform and compact, and the display effect of the display panel is ensured.

In an embodiment, the first included angle α1 is equal to the third included angle β1, that is, the angles of the first virtual trapezoid 21 and the second virtual trapezoid 22 are the same, which further makes the pixel arrangement more uniform and compact, and ensures the display effect of the display panel. In an embodiment, the first included angle α1 is 86°, the second included angle α2 is 86°, the third included angle β1 is 86°, and the fourth included angle β2 is 86°.

In an embodiment, the first included angle α1 is greater than the third included angle β1. In this manner, it can be ensured that the opening of the third sub-pixel 13 is relatively large and the display effect is better. In an embodiment, the first included angle α1 is 86°, the second included angle α2 is 86°, the third included angle β1 is 83°, and the fourth included angle β2 is 83°; In an embodiment, the first included angle α1 is 88°, the second included angle α2 is 88°, the third included angle β1 is 86°, and the fourth included angle β2 is 86°.

In an embodiment, the display panel further includes a substrate, a light-blocking layer, and a light sensor. The light-blocking layer includes multiple imaging apertures. The light sensor in the vertical direction of the plane where the substrate is located and the imaging aperture in the vertical direction of the plane where the substrate is located overlap; the imaging aperture and at least part of the first long side of the first virtual trapezoid overlap.

For specific explanation, please refer to the preceding embodiments of the imaging aperture, and the same beneficial effects exist. Details are not described herein again.

In an embodiment, the display panel includes a substrate and a support column. The support column is disposed on a side of the substrate, and the support column in the vertical direction of the plane where the substrate is located and at least part of the first long side of the first virtual trapezoid in the vertical direction of the plane where the substrate is located overlap.

For specific explanation, please refer to the preceding embodiments of the support column, and the same beneficial effects exist. Details are not described herein again.

In an embodiment, each first sub-pixel, each second sub-pixel, and each third sub-pixel are a respective one of a red sub-pixel, a blue sub-pixel, or a green sub-pixel and are different from each other. In an embodiment, the first sub-pixel may be the red sub-pixel, the second sub-pixel may be the blue sub-pixel, and the third sub-pixel may be the green sub-pixel.

Based on the same inventive concept, the embodiments of the present application provide a preparation method of a display panel. The preparation method of a display panel is configured to prepare the display panels shown in FIGS. 38, 39, and 41 in the preceding embodiments. The similarities can be understood by referring to the preceding explanation of the display panel, which will not be repeated below.

Figure 42:
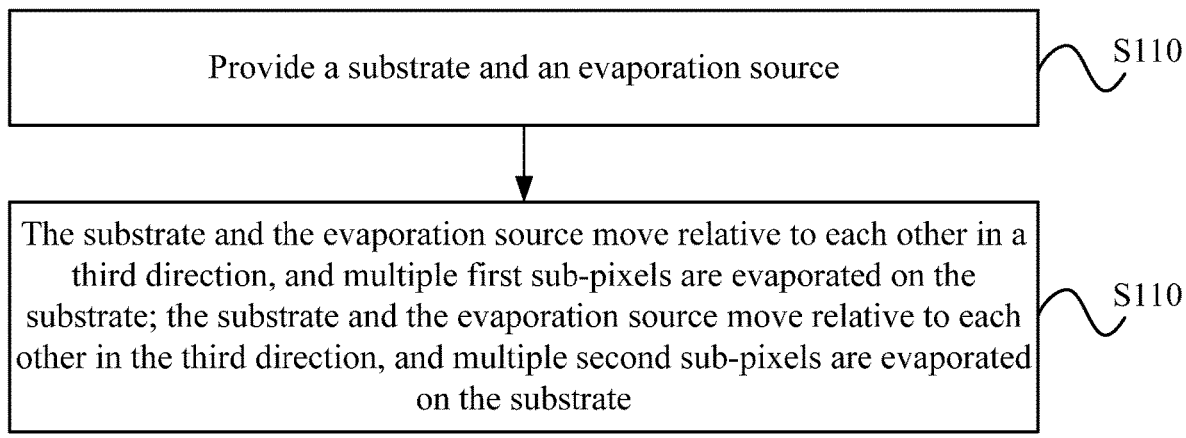
FIG. 42 is a flowchart of a preparation method of a display panel according to an embodiment of the present application.

FIG. 42 is a flowchart of a preparation method of a display panel according to an embodiment of the present application. As shown in FIG. 42, the preparation method of a display panel provided in the embodiments of the present application may include steps described below.

In S110, a substrate and an evaporation source are provided.

In S120, the substrate and the evaporation source move relative to each other in a third direction, and multiple first sub-pixels are evaporated on the substrate; the substrate and the evaporation source move relative to each other in the third direction, and multiple second sub-pixels are evaporated on the substrate.

The multiple first sub-pixels and the multiple second sub-pixels form the second virtual trapezoid, the centers of the multiple second sub-pixels are located at first vertices of the second virtual trapezoid, and the centers of the multiple first sub-pixels are located at second vertices of the second virtual trapezoid, where the first vertices and the second vertices alternate and are spaced apart. The second virtual trapezoid includes the second long side, the third oblique side, the second short side, and the fourth oblique side, the second long side of the second virtual trapezoid extends in the second direction, and the included angle between the third direction and the second direction is within the second preset range. In an embodiment, in the case where the sub-pixels are evaporated on the substrate, for example, first, a mask is disposed below the substrate, and the mask is netted, where the mask includes multiple mask openings, and the mask openings and the sub-pixels are arranged in one-to-one correspondence. The sprayed luminescent material is sprayed onto the substrate from bottom to top through the nozzles of the evaporation source; at the same time, the substrate and the evaporation source move relative to each other in the third direction, and multiple first sub-pixels are evaporated on the substrate; the substrate and the evaporation source move relative to each other in the third direction, and multiple second sub-pixels are evaporated on the substrate. The so-called "relative movement" refers to moving the substrate or moving the evaporation source. In an embodiment, the evaporation source is moved.

The included angle between the third direction and the second direction is within the second preset range. In an embodiment, the absolute value of the second preset range is greater than or equal to 0° and less than or equal to 5°. For example, the third direction and the second direction are the same direction. It indicates that during evaporation, the relative movement direction of the substrate and the evaporation source does not deviate too much from the second direction.

In this embodiment, since the multiple first sub-pixels and the multiple second sub-pixels formed by evaporation form the second virtual trapezoid, the centers of the multiple second sub-pixels are located at the first vertices of the second virtual trapezoid, and the centers of the multiple first sub-pixels are located at the second vertices of the second virtual trapezoid, where the first vertices and the second vertices alternate and are spaced apart. The second virtual trapezoid includes the second long side, the third oblique side, the second short side, and the fourth oblique side, the second long side of the second virtual trapezoid extends in the second direction, and the oblique side of the second virtual trapezoid extends in the first direction so that the distance between the centers of the first sub-pixel 11 and the second sub-pixel 12 adjacent to each other is increased. In this manner, even if the angle plates are not disposed in the first direction, the evaporation accuracy can still be improved. For the specific principle, please refer to the preceding embodiments, which will not be repeated herein.

In an embodiment, the evaporation source moves in the third direction, and multiple first sub-pixels are evaporated on the substrate; the substrate moves in the third direction, and multiple second sub-pixels are evaporated on the substrate.

In an embodiment, the step of evaporating the multiple first sub-pixels on the substrate specifically includes forming a pixel defining layer on the substrate, where the pixel defining layer includes multiple pixel openings, and the multiple pixel openings include multiple first pixel openings; and evaporating light-emitting layers, where light-emitting layers evaporated in the multiple first pixel openings form the multiple first sub-pixels, and light-emitting layers evaporated outside the multiple first pixel openings form first shadows.

For ease of understanding, for example, with continued reference to FIG. 40, the first shadow is a region indicated by arrows 3 and 4 in FIG. 40, that is, a light-emitting layer formed by a region where the luminescent material drifts in a direction from the mask opening to the first pixel opening and a region where the luminescent material drifts in a direction form the first pixel opening to the mask opening.

In an embodiment, the step of evaporating the multiple second sub-pixels on the substrate specifically includes forming the pixel defining layer on the substrate, where the pixel defining layer includes the multiple pixel openings, and the multiple pixel openings further include multiple second pixel openings; and evaporating the light-emitting layers, where light-emitting layers evaporated in the multiple second pixel openings form the multiple second sub-pixels, and light-emitting layers evaporated outside the multiple second pixel openings form second shadows.

For ease of understanding, for example, with continued reference to FIG. 40, the second shadow is a region indicated by arrows 3 and 4 in FIG. 40, that is, a light-emitting layer formed by a region where the luminescent material drifts in a direction from the mask opening to the second pixel opening and a region where the luminescent material drifts in a direction form the second pixel opening to the mask opening.

In an embodiment, the evaporation source includes multiple nozzles arranged in the first direction, and the angle plates are disposed on both sides of each of the nozzles in the second direction.

It is considered that in the case where the sub-pixels are evaporated, the sub-pixels are generally evaporated on a display motherboard. A length of the display motherboard in the first direction is generally less than a length of the display motherboard in the second direction. At the same time, the evaporation source moves in the third direction (the angle between the third direction and the second direction is within the second preset range). Therefore, the drift range of the scattered luminescent material in this direction is relatively large; to limit the drift of the scattered luminescent component, the angle plates need to be disposed in the second direction, to improve the evaporation accuracy.

In an embodiment, the ratio of the length of the light-emitting layer in the first direction to the length of the light-emitting layer in the second direction is greater than the ratio of the length of the pixel opening corresponding to the light-emitting layer in the first direction to the length of the pixel opening corresponding to the light-emitting layer in the second direction. In an embodiment, the length of the pixel opening in the first direction is equal to the length of the pixel opening in the second direction, and the length of the light-emitting layer in the first direction is greater than the length of the light-emitting layer in the second direction.

Since the angle plates are disposed in the second direction and the angle plates are not disposed in the first direction, the evaporation accuracy in the second direction is greater than the evaporation accuracy in the first direction. In this manner, a shadow in the first direction is greater than a shadow in the second direction. Therefore, the length of the light-emitting layer in the first direction is greater than the length of the light-emitting layer in the second direction.

Since in the first direction, the length of the light-emitting layer in the first direction is greater than the length of the light-emitting layer in the second direction, that is, in the first direction, in the case where the light-emitting layers corresponding to adjacent sub-pixels are evaporated, the luminescent material corresponding to one of the light-emitting layers drifts into the pixel opening 43 corresponding to the second sub-pixel 12 adjacent to a pixel opening corresponding to a light-emitting layer adjacent to this light-emitting layer, and/or the luminescent material corresponding to the second light-emitting layer 4122 drifts into the pixel opening 43 corresponding to the adjacent first sub-pixel 11 so that color mixing occurs, resulting in a low yield of evaporating the light-emitting layer. Therefore, in this embodiment, in the first direction, the centers of the first sub-pixel 11 and the second sub-pixel 12 adjacent to each other are located on the oblique side of the second virtual trapezoid 22, thereby increasing the distance between the second sub-pixel 12 and the first sub-pixel 11. In this manner, even if the angle plates are not disposed in the first direction, the evaporation accuracy can still be improved.

In an embodiment, the shape of the light-emitting layer includes a rhombus, the long axis of the rhombus extends in the first direction, and the short axis of the rhombus extends in the second direction.

It is to be understood that the shape of the pixel opening is generally square. From the foregoing, it can be seen that the length of the light-emitting layer in the first direction is greater than the length of the light-emitting layer in the second direction. In addition, in the case where the light-emitting layer is evaporated, the airflow on both sides is uniform. Therefore, the light-emitting layer not only has a long length in the first direction, but also forms a symmetrical structure in the second direction, that is, the shape of the obtained light-emitting layer is a rhombus.

In an embodiment, the substrate and the evaporation source move relative to each other in the third direction, and multiple third sub-pixels are evaporated on the substrate; the multiple third sub-pixels form the second virtual trapezoid, the centers of the multiple third sub-pixels are respectively located at vertices of the second virtual trapezoid, the first sub-pixel is located inside the second virtual trapezoid, and the third sub-pixel is located inside the first virtual trapezoid.

The second virtual trapezoid includes the second long side, the third oblique side, the second short side, and the fourth oblique side that are sequentially connected; the first long side and the first oblique side form the first included angle, and the first long side and the second oblique side form the second included angle; the second long side and the third oblique side form the third included angle, and the second long side and the fourth oblique side form the fourth included angle.

The sum of the first included angle and the second included angle is the first angle, the sum of the third included angle and the fourth included angle is the second angle, and the difference between the first angle and the second angle is within the first preset range.

In an embodiment, the absolute value of the first preset range is greater than or equal to 0° and less than or equal to 10°.

In an embodiment, the first preset range may be greater than or equal to 0° and less than or equal to 4°; in an embodiment, the first preset range may be, for example, greater than or equal to 0° and less than or equal to 5°; in an embodiment, the first preset range may be, for example, greater than or equal to 0° and less than or equal to 6°. In an embodiment, the first preset range may be 0°, 5°, and 10°. In this manner, a better arrangement of the sub-pixels without apparent hollow regions can be ensured, thereby effectively avoiding apparent gaps, avoiding waste of space, and ensuring the display effect of the display panel 100.

In an embodiment, the first included angle is α1, where $82° \leq \alpha1 \leq 88°$; the second included angle is α2, where $82° \leq \alpha2 \leq 88°$; the third included angle is β1, where $82° \leq \beta1 \leq 88°$; the fourth included angle is β2, where $82° \leq \beta2 \leq 88°$.

The range of the first included angle α1 may satisfy, for example, $82° \leq \alpha1 \leq 88°$, such as 82°, 83°, 84°, 85°, 86°, 87°, 88°, etc.; in an embodiment, the range of α1 satisfies $83° \leq \alpha1 \leq 86°$, such as 83°, 86°, etc. The first long side 211 and the second oblique side 214 form the second included angle α2, where the range of the second included angle α2 may satisfy, for example, $82° \leq \alpha2 \leq 88°$, such as 82°, 83°, 84°, 85°, 86°, 87°, 88°, etc.; in an embodiment, the range of α2 satisfies $83° \leq \alpha2 \leq 86°$, such as 83°, 86°, etc. The second long side 221 and the third oblique side 222 form the third included angle β1, where the range of the third included angle β1 may satisfy, for example, $82° \leq \beta1 \leq 88°$, such as 82°, 83°, 84°, 85°, 86°, 87°, 88°, etc.; in an embodiment, the range of β1 satisfies $83° \leq \beta1 \leq 86°$, such as 83°, 86°, etc. The second long side 221 and the fourth oblique side 224 form the fourth included angle β2, where the range of the fourth included angle β2 may satisfy, for example, $82° \leq \beta2 \leq 88°$, such as 82°, 83°, 84°, 85°, 86°, 87°, 88°, etc.; in an embodiment, the range of β2 satisfies $83° \leq \beta2 \leq 86°$, such as 83°, 86°, etc.

In an embodiment, the first included angle is equal to the second included angle, and the third included angle is equal to the fourth included angle. That is, the first virtual trapezoid is an isosceles trapezoid, and the second virtual trapezoid is also an isosceles trapezoid. In this manner, the pixel arrangement is more uniform and compact, and the display effect of the display panel is ensured.

In an embodiment, the first included angle is equal to the third included angle. That is, the included angles of the first virtual trapezoid and the second virtual trapezoid are the same, which further makes the pixel arrangement more uniform and compact, and ensures the display effect of the display panel. In an embodiment, the first included angle α1 is 86°, the second included angle α2 is 86°, the third included angle β1 is 86°, and the fourth included angle β2 is 86°.

In an embodiment, the first included angle is greater than the third included angle. In this manner, it can be ensured that the opening of the third sub-pixel 13 is relatively large and the display effect is better. In an embodiment, the first included angle α1 is 86°, the second included angle α2 is 86°, the third included angle β1 is 83°, and the fourth included angle β2 is 83°; exemplarily, the first included angle α1 is 88°, the second included angle α2 is 88°, the third included angle β1 is 86°, and the fourth included angle β2 is 86°.

In an embodiment, the embodiments of the present application further provide a preparation method of a display panel. The preparation method of a display panel is configured to prepare the display panels shown in FIGS. 19 and 20 and FIGS. 22 to 25 in the preceding embodiments, the beneficial effects of the display panel in the preceding embodiments exist, and the similarities can be understood be referring to the preceding explanation of the display panel, which will not be repeated herein. Specifically, in addition to the preparation method of a display panel in the preceding embodiment, the preparation method of a display panel provided in the embodiments of the present application further includes steps described below.

A light sensor is provided.

A light-blocking layer is formed, and etching is performed on the light-blocking layer so that multiple imaging apertures are formed.

The light sensor in the vertical direction of the plane where the substrate is located and each of the multiple imaging apertures in the vertical direction of the plane where the substrate is located overlap.

Each of the multiple imaging apertures and at least part of the second long side of the second virtual trapezoid overlap.

In the embodiments of the present application, the imaging aperture and the second long side of the second virtual trapezoid overlap so that more space in which the imaging aperture is arranged exists, thereby increasing the aperture of the imaging aperture in the extension direction of the first long side. In this manner, a light-transmitting area of the imaging aperture can be increased, the amount of fingerprint identification signal can be increased, the time for fingerprint identification can be shortened, and the adverse effects caused by the diffraction of the imaging aperture can be reduced.

In an embodiment, the embodiments of the present application further provide a preparation method of a display panel. The preparation method of a display panel is configured to prepare the display panels shown in FIGS. 26 and 27 and FIGS. 28 to 31 in the preceding embodiments, the beneficial effects of the display panel in the preceding embodiments exist, and the similarities can be understood be referring to the preceding explanation of the display panel, which will not be repeated herein. Specifically, in addition to the preparation method of a display panel in the preceding embodiment, the preparation method of a display panel provided in the embodiments of the present application further includes steps described below.

A support column disposed on a side of the substrate is formed, where the support column in the vertical direction of the plane where the substrate is located and at least part of the second long side of the second virtual trapezoid in the vertical direction of the plane where the substrate is located overlap.

In the embodiments of the present application, the vertical projection of the support column on the plane where the substrate is located and the vertical projection of at least part of the second long side on the plane where the substrate is located overlap, that is, the support column is disposed above the pixel defining layer between the pixel opening corresponding to the first sub-pixel and the pixel opening corresponding to the second sub-pixel, where the distance between the pixel opening corresponding to the first sub-pixel and the pixel opening corresponding to the second sub-pixel is relatively large so that the space in which the support column is disposed can be increased and the preparation yield can be improved. In addition, for the support column of the same size, in this embodiment, the distances from the support column to the pixel opening corresponding to the first sub-pixel and the pixel opening corresponding to the second sub-pixel can be increased so that the support column can be prevented from blocking the light emitted by the light-emitting element and thus the color shift can be reduced.

In an embodiment, each first sub-pixel, each second sub-pixel, and each third sub-pixel are a respective one of a red sub-pixel, a blue sub-pixel, or a green sub-pixel and are different from each other. In an embodiment, the first sub-pixels are red sub-pixels, the second sub-pixels are blue sub-pixels, and the third sub-pixels are green sub-pixels.

Figure 43:
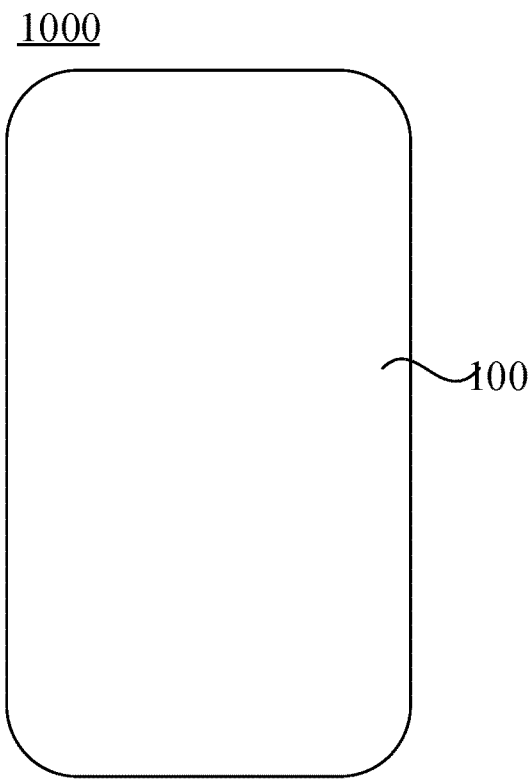
FIG. 43 is a structure diagram of a display device according to an embodiment of the present application.

Based on the same inventive concept, the embodiments of the present application further provide a display device. The display device includes any display panel provided in the preceding embodiments. In an embodiment, as shown in FIG. 43, a display device 1000 includes the display panel 100. Therefore, the display device also has the beneficial effects of the display panel described in the preceding embodiments, and for the same details, reference may be made to the description of the preceding display panel, and repetition will not made herein.

The display device 1000 provided in the embodiments of the present application may be the phone shown in FIG. 43 or may be any electronic product with a display function, including and not limited to: televisions, laptops, desktop displays, tablet computers, digital cameras, smart bracelets, smart glasses, in-vehicle displays, industry-controlling equipment, medical displays, touch interactive terminals, etc., which will not be specifically limited in embodiments of the present application.

It is to be noted that the above are only preferred embodiments of the present application and the principles used therein. It will be understood by those skilled in the art that the present application is not limited to the specific embodiments described herein. Those skilled in the art can make various apparent variations, adaptions, and substitutions without departing from the scope of the present application. Therefore, while the present application has been described in detail via the preceding embodiments, the present application is not limited to the preceding embodiments and may include more other equivalent embodiments without departing from the concept of the present application. The scope of the present application is determined by the scope of the appended claims.

What is claimed is:

1. A display panel, comprising:
   a plurality of first sub-pixels, a plurality of second sub-pixels, and a plurality of third sub-pixels,
   wherein the plurality of third sub-pixels form a first virtual trapezoid, centers of the plurality of third sub-pixels are respectively located at vertices of the first virtual trapezoid, and a first sub-pixel of the plurality of first sub-pixels is located inside the first virtual trapezoid;
   the plurality of first sub-pixels and the plurality of second sub-pixels form a second virtual trapezoid, centers of the plurality of second sub-pixels are located at first vertices of the second virtual trapezoid, centers of the plurality of first sub-pixels are located at second vertices of the second virtual trapezoid, the first vertices and the second vertices alternate and are spaced apart, and a third sub-pixel of the plurality of third sub-pixels is located inside the second virtual trapezoid;
   the first virtual trapezoid comprises a first long side, a first oblique side, a first short side, and a second oblique side, wherein the first long side, the first oblique side, the first short side and the second oblique side are sequentially connected; and the second virtual trapezoid comprises a second long side, a third oblique side, a second short side, and a fourth oblique side, wherein the second long side, the third oblique side, the second short side and the fourth oblique side are sequentially connected; and
   the first long side and the first oblique side form a first included angle, and the first long side and the second oblique side form a second included angle; the second long side and the third oblique side form a third included angle, and the second long side and the fourth oblique side form a fourth included angle,
   wherein a sum of the first included angle and the second included angle is a first angle, a sum of the third included angle and the fourth included angle is a second angle, a difference between the first angle and the second angle is within a first preset range, and an absolute value of the first preset range is greater than or equal to 0° and less than or equal to 10°.

2. The display panel of claim 1, wherein the first included angle is α1, wherein 82°≤α1≤88°; the second included angle is a 2, wherein 82°≤α2≤88°; the third included angle is β1, wherein 82°≤β1≤88°; and the fourth included angle is β2, wherein 82°≤β2≤88°.

3. The display panel of claim 2, wherein 83°≤α1≤86°, 83°≤α2≤86°, 83°≤β1≤86°, and 83°≤β2≤86°.

4. The display panel of claim 3, wherein α1 is 86°, α2 is 86°, β1 is 86°, and β2 is 86°.

5. The display panel of claim 3, wherein α1 is 86°, α2 is 86°, β1 is 83°, and β2 is 83°.

6. The display panel of claim 1, wherein the first included angle is equal to the second included angle, and the third included angle is equal to the fourth included angle.

7. The display panel of claim 6, wherein the first included angle is equal to the third included angle.

8. The display panel of claim 6, wherein the first included angle is greater than the third included angle.

9. The display panel of claim 1, further comprising a display region, wherein the display region comprises at least one edge,
wherein the centers of the plurality of first sub-pixels and the centers of the plurality of second sub-pixels are located on a first virtual line, a center of a third sub-pixel closest to the at least one edge is located on a second virtual line, and a centers of a third sub-pixel second closest to the at least one edge is located on a third virtual line, wherein an extension direction of the first virtual line, an extension direction of the second virtual line, and an extension direction of the third virtual line are the same, and a spatial position of the first virtual line, a spatial position of the second virtual line, and a spatial position of the third virtual line are different.

10. The display panel of claim 9, wherein the display region comprises a first edge and the third virtual line is disposed on a side of the second virtual line farther from the first virtual line.

11. The display panel of claim 9, wherein the display region comprises a second edge, the third virtual line is disposed on a side of the second virtual line closer to the first virtual line, and the third virtual line is disposed between the first virtual line and the second virtual line.

12. The display panel of claim 1, further comprising a display region, wherein the display region comprises at least one edge,
wherein a center of a first sub-pixel second closest to the at least one edge is located on a fourth virtual line, a center of a second sub-pixel closest to the at least one edge is located on a fifth virtual line, and the centers of the plurality of third sub-pixels are located on a sixth virtual line, wherein an extension direction of the fourth virtual line, an extension direction of the fifth virtual line, and an extension direction of the sixth virtual line are the same, and a spatial position of the fourth virtual line, a spatial position of the fifth virtual line, and a spatial position of the sixth virtual line are different.

13. The display panel of claim 12, wherein the display region comprises a third edge and the sixth virtual line is disposed on a side of the fourth virtual line farther from the fifth virtual line.

14. The display panel of claim 12, wherein the display region comprises a fourth edge, the sixth virtual line is disposed on a side of the fourth virtual line facing away from the fifth virtual line, and the fourth virtual line is disposed between the fifth virtual line and the sixth virtual line.

15. The display panel of claim 1, wherein a center of the third sub-pixel and an intersection point of two diagonals of the second virtual trapezoid do not overlap.

16. The display panel of claim 15, wherein a distance between the center of the third sub-pixel and the intersection point of the two diagonals of the second virtual trapezoid are greater than or equal to 1 μm and less than or equal to 5 μm.

17. The display panel of claim 1, wherein among four third sub-pixels of the plurality of third sub-pixels surrounding a first sub-pixel of the plurality of first sub-pixels, light-emitting areas of third sub-pixels arranged in a first direction are equal, and light-emitting areas of third sub-pixels arranged in a second direction are different,
wherein the first direction is a row direction, and the second direction is a column direction; or the first direction is a column direction, and the second direction is a row direction.

18. The display panel of claim 17, wherein light-emitting areas of two of the plurality of third sub-pixels corresponding to the first long side are greater than light-emitting areas of two of the plurality of third sub-pixels corresponding to the first short side.

19. The display panel of claim 1, wherein the second short side comprises a first end point and a second end point; and the second long side comprises a third end point and a fourth end point;
the third oblique side connects the first end point and the third end point, and the fourth oblique line connects the second end point and the fourth end point; and
a foot of the first end point on the second long side is a first foot, and a distance from the first foot to the third end point is a ninth distance; and a foot of the second end point on the second long side is a second foot, and a distance from the second foot to the fourth end point is a tenth distance, wherein the tenth distance is less than or equal to the ninth distance,
wherein a length value of the ninth distance is x, and a length value of a distance between the first foot and the second foot is y, wherein 0<x≤3/16 (x+y).

20. The display panel of claim 19, wherein 0<x≤3.8 μm.

21. The display panel of claim 1, wherein at least one of each first sub-pixel of the plurality of first sub-pixels, each second sub-pixel of the plurality of second sub-pixels, or each third sub-pixel of the plurality of third sub-pixels has a cut corner.

22. The display panel of claim 21, wherein at least one of the each first sub-pixel or the each second sub-pixel has a cut corner, and shapes of the each first sub-pixel and the each second sub-pixel comprise a pentagon, wherein the pentagon comprises a right-like angle and an obtuse-like angle.

23. The display panel of claim 22, wherein the pentagon comprises at least a right-angled side and an obtuse-angled side, and two right-angled sides adjacent to the obtuse-angled side have a same side length.

24. The display panel of claim 23, wherein the third sub-pixel has a cut corner, and shapes of the third sub-pixel comprise a pentagon, wherein the pentagon comprises a right-like angle and an obtuse-like angle.

25. The display panel of claim 24, wherein a center of one of the plurality of first sub-pixels and a center of one of the plurality of second sub-pixels respectively coincide with end points of the second short side, and an obtuse-angled side of the one of the plurality of first sub-pixels is opposite to an obtuse-angled side of the one of the plurality of second sub-pixels;
a center of another first sub-pixel of the plurality of first sub-pixels and a center of another second sub-pixel of the plurality of second sub-pixels respectively coincide with end points of the second long side, and an obtuse-angled side of the another first sub-pixel and an obtuse-angled side of the another second sub-pixel face away from each other; and an obtuse-angled side of the third sub-pixel faces towards the second long side.

26. The display panel of claim 1, wherein the second long side and the second short side each are parallel to a second direction, wherein the second direction is a column direction.

27. The display panel of claim 26, wherein the first long side and the first short side each are parallel to a first direction, wherein the first direction is a row direction.

28. The display panel of claim 1, wherein each of the plurality of first sub-pixels, each of the plurality of second sub-pixels, and each of the plurality of third sub-pixels each are one of a red sub-pixel, a blue sub-pixel, or a green sub-pixel and are different from each other.

29. The display panel of claim 1, further comprising:
a substrate;
a pixel circuit layer disposed on a side of the substrate and comprising a plurality of pixel circuits; and
a display layer disposed on a side of the pixel circuit layer facing away from the substrate, wherein and the display layer comprises a plurality of light-emitting elements, each of the plurality of pixel circuits is electrically connected to a respective one of the plurality of light-emitting elements; and each sub-pixel comprises a light-emitting element and a pixel circuit, wherein the pixel circuit is electrically connected to a connection portion through a first via hole, and the connection portion is electrically connected to an anode of the light-emitting element through a second via hole, wherein first via holes and second via holes of at least part of sub-pixels are arranged along a second direction, wherein the second direction comprises a row direction, or the second direction comprises a column direction.

30. The display panel of claim 29, further comprising a light emission control signal line, wherein a distance between the light emission control signal line and an anode corresponding to a third sub-pixel is a first preset distance.

31. The display panel of claim 30, wherein first via holes and second via holes of all sub-pixels are arranged in the second direction.

32. The display panel of claim 30, wherein a vertical projection of a second via hole of the third sub-pixel on a plane where the substrate is located is located between the light emission control signal line and a vertical projection of an anode of a light-emitting element of the third sub-pixel on the plane where the substrate is located.

33. The display panel of claim 1, further comprising:
a substrate;
a pixel circuit layer disposed on a side of the substrate, wherein pixel circuit layer comprises a plurality of pixel circuits; and
a display layer disposed on a side of the pixel circuit layer facing away from the substrate, wherein the display layer comprises a plurality of light-emitting elements, each of the plurality of pixel circuits is electrically connected to a respective one of the plurality of light-emitting elements; and each sub-pixel comprises a light-emitting element and a pixel circuit, wherein the each of the plurality of pixel circuits is electrically connected to a connection portion through a first via hole, and the connection portion is electrically connected to an anode of the respective one of the plurality of light-emitting elements through a second via hole, wherein a first via hole of a first sub-pixel corresponding to the third oblique side and a first via hole of a second sub-pixel corresponding to the third oblique side are located on an eleventh virtual line, and the eleventh virtual line extends in a first direction;

a second via hole of the first sub-pixel corresponding to the third oblique side and a second via hole of the second sub-pixel corresponding to the third oblique side are located on a twelfth virtual line, and the twelfth virtual line extends in the first direction;

a first via hole of a first sub-pixel corresponding to the fourth oblique side and a first via hole of a second sub-pixel corresponding to the fourth oblique side are located on a thirteenth virtual line, and the thirteenth virtual line extends in the first direction; and a second via hole of the first sub-pixel corresponding to the fourth oblique side and a second via hole of the second sub-pixel corresponding to the fourth oblique side are located on a fourteenth virtual line, and the fourteenth virtual line extends in the first direction, wherein the first direction comprises a row direction, or the first direction comprises a column direction.

34. The display panel of claim 1, comprising a reset signal line and a light emission control signal line, and a distance between the reset signal line and the light emission control signal line is a second preset distance;

wherein the display panel, further comprising:
a substrate;
a pixel circuit layer disposed on a side of the substrate and comprising a plurality of pixel circuits; and
a display layer disposed on a side of the pixel circuit layer facing away from the substrate, wherein the display layer comprises a plurality of light-emitting elements, wherein each of the plurality of pixel circuits is electrically connected to a respective one of the plurality of light-emitting elements; and each sub-pixel comprises one of the plurality of light-emitting elements and one of the plurality of pixel circuits, wherein the each of the plurality of pixel circuits is electrically connected to a connection portion through a first via hole, and the connection portion is electrically connected to an anode of the respective one of the plurality of light-emitting elements through a second via hole, wherein a first via hole and a second via hole of a first sub-pixel and a first via hole and a second via hole of a second sub-pixel are disposed between the reset signal line and the light emission control signal line.

35. The display panel of claim 34, wherein among the plurality of first sub-pixels and the plurality of second sub-pixels, each second via hole is located on a side of a first via hole closer to the reset signal line.

36. A display panel, comprising:
a substrate; and
a display layer disposed on a side of the substrate, wherein the display layer comprises a pixel defining layer and a plurality of light-emitting elements, wherein the pixel defining layer comprises a plurality of pixel openings, and each of the plurality of light-emitting elements comprises a light-emitting layer; and wherein a ratio of a length of the light-emitting layer in a first direction to a length of the light-emitting layer in a second direction is greater than a ratio of a length of a pixel opening corresponding to the light-emitting layer in the first direction to a length of the pixel opening corresponding to the light-emitting layer in the second direction;

wherein the display panel further comprises a plurality of first sub-pixels and a plurality of second sub-pixels, wherein the plurality of first sub-pixels and the plurality of second sub-pixels form a second virtual trapezoid, centers of the plurality of second sub-pixels are located at first vertices of the second virtual trapezoid, and centers of the plurality of first sub-pixels are located at second vertices of the second virtual trapezoid, wherein the first vertices and the second vertices alternate and are spaced apart; and the second virtual trapezoid comprises a second long side, a third oblique side, a second short side, and a fourth oblique side, and the second long side of the second virtual trapezoid extends in a second direction.

37. The display panel of claim 36, wherein the length of the pixel opening in the first direction is equal to the length of the pixel opening in the second direction, and the length of the light-emitting layer in the first direction is greater than the length of the light-emitting layer in the second direction.

38. The display panel of claim 37, wherein a shape of the light-emitting layer comprises a rhombus, wherein a long axis of the rhombus extends in the first direction, and a short axis of the rhombus extends in the second direction.

39. The display panel of claim 36, further comprising a plurality of third sub-pixels, wherein the plurality of third sub-pixels forms a first virtual trapezoid, centers of the plurality of third sub-pixels are respectively located at vertices of the first virtual trapezoid, one of the plurality of first sub-pixels is located inside the first virtual trapezoid, and one of the plurality of third sub-pixels is located inside the second virtual trapezoid; and the first virtual trapezoid comprises a first long side, a first oblique side, a first short side, and a second oblique side that are sequentially connected; the first long side and the first oblique side form a first included angle, and the first long side and the second oblique side form a second included angle; the second long side and the third oblique side form a third included angle, and the second long side and the fourth oblique side form a fourth included angle, wherein a sum of the first included angle and the second included angle is a first angle, a sum of the third included angle and the fourth included angle is a second angle, and a difference between the first angle and the second angle is within a first preset range.

40. The display panel of claim 39, wherein an absolute value of the first preset range is greater than or equal to 0° and less than or equal to 10°.

41. The display panel of claim 36, wherein a first included angle is $\alpha1$, wherein $82° \leq \alpha1 \leq 88°$; a second included angle is $\alpha2$, wherein $82° \leq \alpha2 \leq 88°$; a third included angle is $\beta1$, wherein $82° \leq \beta1 \leq 88°$; and a fourth included angle is $\beta2$, wherein $82° \leq \beta2 \leq 88°$.

42. The display panel of claim 41, wherein $83° \leq \alpha1 \leq 86°$, $83° \leq \alpha2 \leq 86°$, $83° \leq \beta1 \leq 86°$, and $83° \leq \beta2 \leq 86°$.

43. The display panel of claim 42, wherein $\alpha1$ is 86°, $\alpha2$ is 86°, $\beta1$ is 86°, and $\beta2$ is 86°.

44. The display panel of claim 42, wherein $\alpha1$ is 86°, $\alpha2$ is 86°, $\beta1$ is 83°, and $\beta2$ is 83°.

45. The display panel of claim 39, wherein the first included angle is equal to the second included angle, and the third included angle is equal to the fourth included angle.

46. The display panel of claim 45, wherein the first included angle is equal to the third included angle.

47. The display panel of claim 45, wherein the first included angle is greater than the third included angle.

48. The display panel of claim 39, wherein each of the plurality of first sub-pixels, each of the plurality of second sub-pixels, and the plurality of third sub-pixels each are one of a red sub-pixel, a blue sub-pixel, or a green sub-pixel and are different from each other.

49. A display device, comprising the display panel, wherein the display panel comprises:

a plurality of first sub-pixels, a plurality of second sub-pixels, and a plurality of third sub-pixels, wherein the plurality of third sub-pixels forms a first virtual trapezoid, centers of the plurality of third sub-pixels are respectively located at vertices of the first virtual trapezoid, and a first sub-pixel of the plurality of first sub-pixels is located inside the first virtual trapezoid;

the plurality of first sub-pixels and the plurality of second sub-pixels form a second virtual trapezoid, centers of the plurality of second sub-pixels are located at first vertices of the second virtual trapezoid, centers of the plurality of first sub-pixels are located at second vertices of the second virtual trapezoid, the first vertices and the second vertices alternate and are spaced apart, and a third sub-pixel of the plurality of third sub-pixels is located inside the second virtual trapezoid;

the first virtual trapezoid comprises a first long side, a first oblique side, a first short side, and a second oblique side, wherein the first long side, the first oblique side, the first short side and the second oblique side are sequentially connected; and the second virtual trapezoid comprises a second long side, a third oblique side, a second short side, and a fourth oblique side, wherein the second long side, the third oblique side, the second short side and the fourth oblique side are sequentially connected; and the first long side and the first oblique side form a first included angle, and the first long side and the second oblique side form a second included angle; the second long side and the third oblique side form a third included angle, and the second long side and the fourth oblique side form a fourth included angle, wherein a sum of the first included angle and the second included angle is a first angle, a sum of the third included angle and the fourth included angle is a second angle, a difference between the first angle and the second angle is within a first preset range, and an absolute value of the first preset range is greater than or equal to 0° and less than or equal to 10°.

* * * * *